(12) United States Patent
Sun et al.

(10) Patent No.: US 12,058,860 B2
(45) Date of Patent: Aug. 6, 2024

(54) MEMORY DEVICE

(71) Applicant: Taiwan Semiconductor Manufacturing Company, Ltd., Hsinchu (TW)

(72) Inventors: Hung-Chang Sun, Kaohsiung (TW); Yu-Wei Jiang, Hsinchu (TW); TsuChing Yang, Taipei (TW); Kuo-Chang Chiang, Hsinchu (TW); Sheng-Chih Lai, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 437 days.

(21) Appl. No.: 17/180,703

(22) Filed: Feb. 19, 2021

(65) Prior Publication Data
US 2021/0391354 A1 Dec. 16, 2021

Related U.S. Application Data

(60) Provisional application No. 63/040,535, filed on Jun. 18, 2020, provisional application No. 63/038,923, filed on Jun. 15, 2020.

(51) Int. Cl.
| | | |
|---|---|---|
| *H01L 23/52* | (2006.01) | |
| *H01L 23/528* | (2006.01) | |
| *H10B 41/10* | (2023.01) | |
| *H10B 41/27* | (2023.01) | |
| *H10B 43/10* | (2023.01) | |
| *H10B 43/27* | (2023.01) | |

(52) U.S. Cl.
CPC ......... *H10B 43/27* (2023.02); *H01L 23/5283* (2013.01); *H10B 41/10* (2023.02); *H10B 41/27* (2023.02); *H10B 43/10* (2023.02)

(58) Field of Classification Search
CPC ..... H01L 23/5283; H10B 41/27; H10B 43/10; H10B 41/10; H10B 43/27
See application file for complete search history.

(56) References Cited

U.S. PATENT DOCUMENTS

| | | | | |
|---|---|---|---|---|
| 11,094,711 | B2 * | 8/2021 | Jiang ...................... | H10B 43/10 |
| 11,581,324 | B2 * | 2/2023 | Tang ....................... | H10B 43/20 |
| 2009/0230454 | A1 * | 9/2009 | Pekny .................... | H10B 43/27 |
| | | | | 438/257 |
| 2017/0162594 | A1 * | 6/2017 | Ahn ........................ | H10B 41/27 |

(Continued)

*Primary Examiner* — Ali Naraghi
*Assistant Examiner* — Siangluai Mang
(74) *Attorney, Agent, or Firm* — JCIPRNET

(57) ABSTRACT

A memory device includes a first multi-layer stack, a channel layer, a charge storage layer, a first conductive pillar, and a second conductive pillar. The first multi-layer stack is disposed on a substrate and includes first conductive layers and first dielectric layers stacked alternately. The channel layer penetrates through the first conductive layers and the first dielectric layers, wherein the channel layer includes a first channel portion and a second channel portion separated from each other. The charge storage layer is disposed between the first conductive layers and the channel layer. The first conductive pillar is disposed between one end of the first channel portion and one end of the second channel portion. The second conductive pillar is disposed between the other end of the first channel portion and the other end of the second channel portion.

20 Claims, 53 Drawing Sheets

(56) References Cited

U.S. PATENT DOCUMENTS

| | | | |
|---|---|---|---|
| 2018/0019257 A1* | 1/2018 | Son | H10B 41/27 |
| 2020/0020702 A1* | 1/2020 | Baek | H10B 41/10 |
| 2020/0227437 A1* | 7/2020 | Choi | H10B 43/35 |
| 2021/0020203 A1* | 1/2021 | Choi | H10B 41/10 |
| 2021/0143170 A1* | 5/2021 | Jiang | H10B 43/10 |
| 2022/0068957 A1* | 3/2022 | Yeh | H10B 43/27 |

* cited by examiner

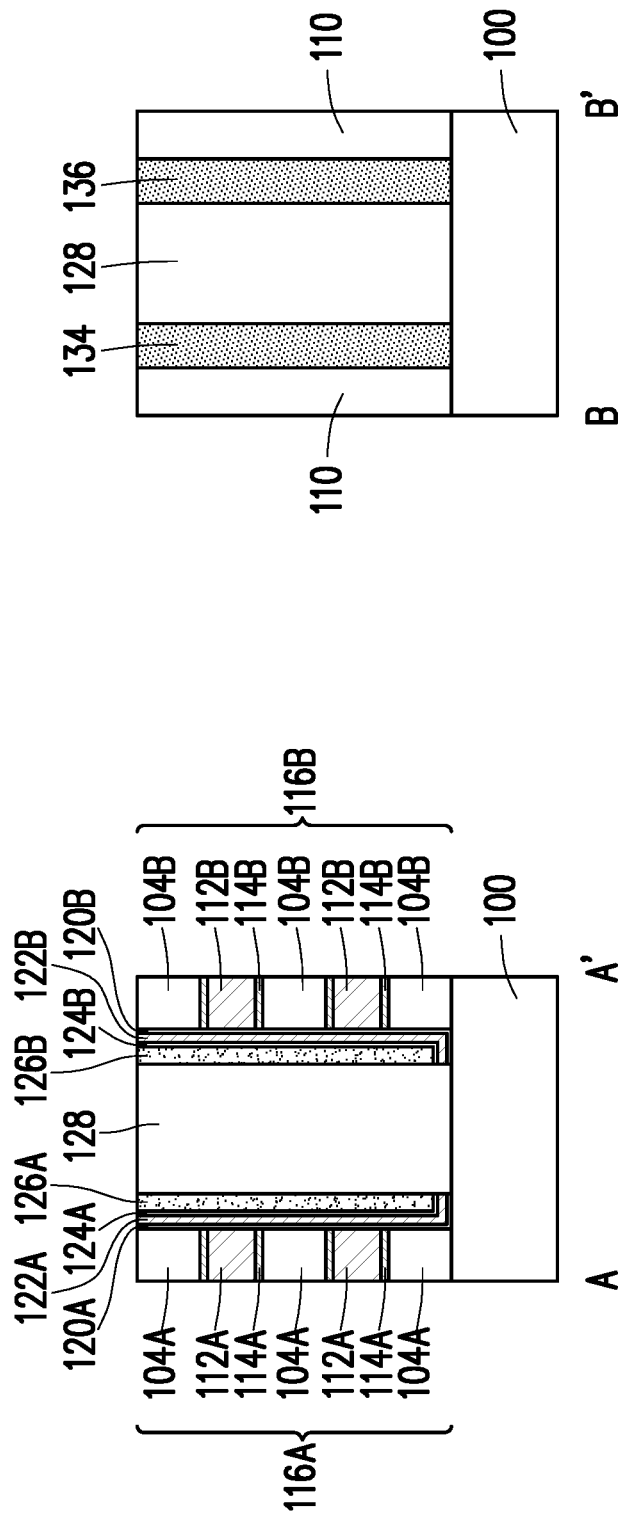

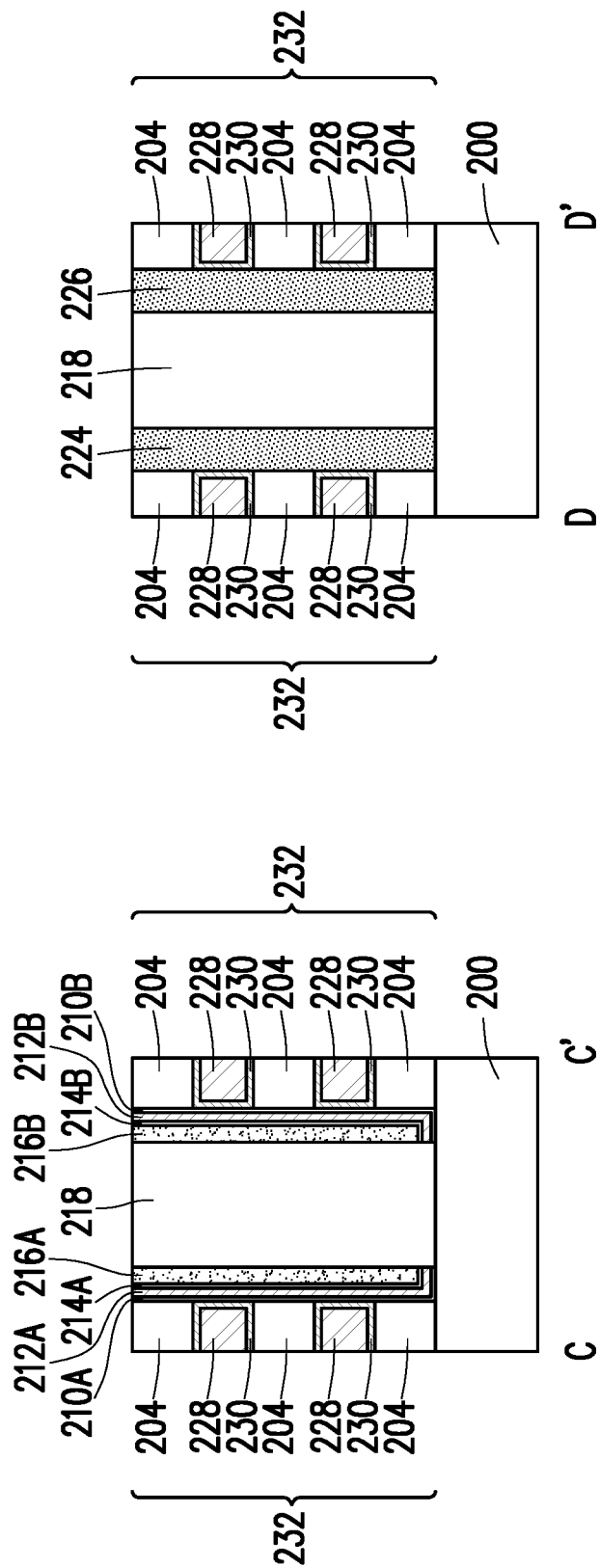

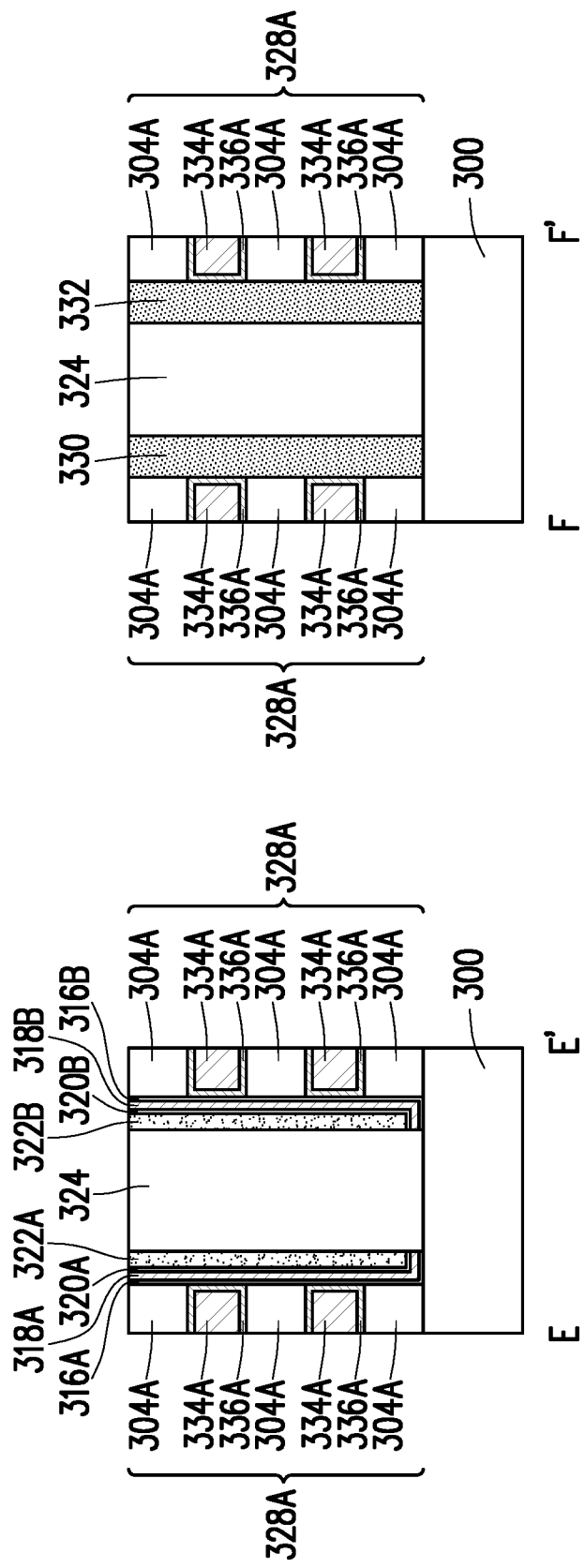

MEMORY DEVICE

CROSS-REFERENCE TO RELATED APPLICATION

This application claims the priority benefit of U.S. provisional application Ser. No. 63/038,923, filed on Jun. 15, 2020, and U.S. provisional application Ser. No. 63/040,535, filed on Jun. 18, 2020. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography and etching techniques to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a cross-sectional view illustrating the memory device taken along section line A-A' in FIG. 1H.

FIG. 2B is a cross-sectional view illustrating the memory device taken along section line B-B' in FIG. 1H.

FIG. 4D is a cross-sectional view illustrating the memory device taken along section line C-C' in FIG. 3F.

FIG. 4E is a cross-sectional view illustrating the memory device taken along section line D-D' in FIG. 3F.

FIG. 6D is a cross-sectional view illustrating the memory device taken along section line E-E' in FIG. 5H.

FIG. 6E is a cross-sectional view illustrating the memory device taken along section line F-F' in FIG. 5H.

DETAILED DESCRIPTION

Figure 1A:
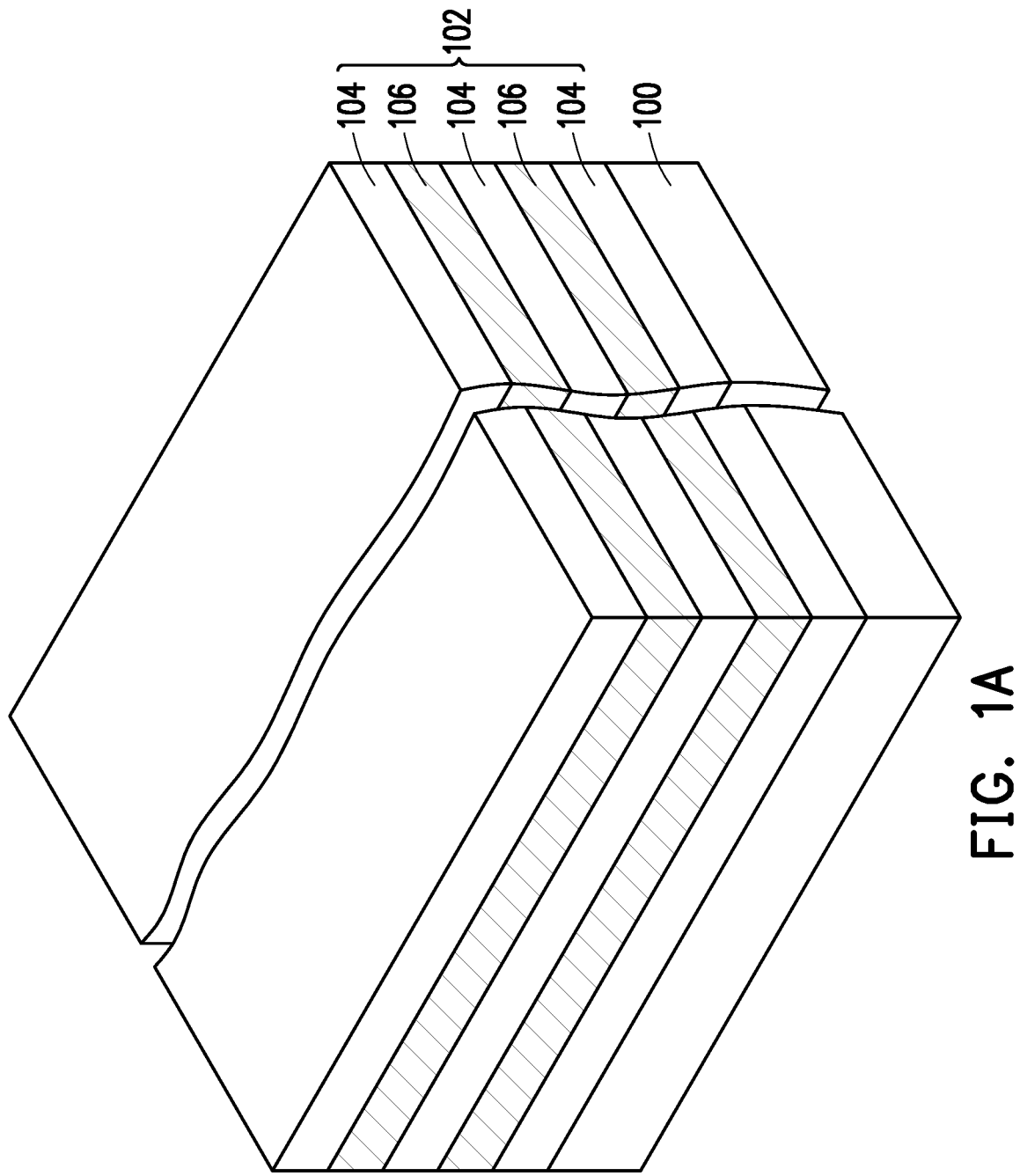
FIG. 1A to FIG. 1H are perspective views illustrating various stages of a method of manufacturing a memory device in accordance with some embodiments of the disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide a memory device such as a 3D memory array. In some embodiments, the 3D memory array is a field effect transistor (FET) memory circuit including a plurality of vertically stacked memory cells. In some embodiments, each memory cell is regarded as a FET that includes a word line region acting as a gate electrode, a bit line region acting as a first source/drain electrode, and a source line region acting as a second source/drain electrode. In some embodiments, each memory cell is regarded as a thin film transistor (TFT).

FIG. 1A is a perspective view illustrating one stage of a method of manufacturing a memory device 10 in accordance with some embodiments of the disclosure. Referring to FIG. 1A, a substrate 100 is provided. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be an integrated circuit die, such as a logic die, a memory die, an ASIC die, or the like. The substrate 100 may be a complementary metal oxide semiconductor (CMOS) die and may be referred to as a CMOS under array (CUA). The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In some embodiments, circuits (not shown) may be formed over the substrate 100. The circuits include transistors and interconnect structure. The transistors may be located at a top surface of the substrate 100. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes. The interconnect structure includes one or more stacked dielectric layers and conductive features formed in the one or more dielectric layers, for example. The interconnect structure may be electrically connected to the transistors to form functional circuits. In some embodiments, the functional circuits formed by the interconnect structure may include logic circuits, memory circuits, sense amplifiers, controllers, input/output circuits, image sensor circuits, the like, or combinations thereof. Although the transistors formed over the substrate are discussed, other active devices (e.g., diodes or the like) and/or passive devices (e.g., capacitors, resistors, or the like) may also be formed as part of the functional circuits.

A multi-layer stack 102 is formed over the substrate 100. Although the multi-layer stack 102 is illustrated as contacting the substrate 100, any number of intermediate layers may be disposed between the substrate 100 and the multi-layer stack 102. For example, one or more interconnect layers including conductive features in insulting layers (e.g., low-k dielectric layers) may be disposed between the substrate 100 and the multi-layer stack 102. In some embodiments, the conductive features may be patterned to provide power, ground, and/or signal lines for the active devices on the substrate 100 and/or the memory device 10 (see FIG. 1H).

The multi-layer stack 102 includes alternating layers of dielectric layers 104 and sacrificial layers 106. The sacrificial layers 106 may be patterned and replaced in subsequent steps to define conductive layers 112A and conductive layers 112B (e.g., the word lines). The dielectric layers 104 may include insulating materials, such as silicon oxide, silicon nitride, silicon oxynitride, combinations thereof, or the like. The sacrificial layers 106 may include dielectric materials, such as silicon oxide, silicon nitride, silicon oxynitride, combinations thereof, or the like. The dielectric layers 104 and the sacrificial layers 106 include different materials with different etching selectivities. In some embodiments, the dielectric layers 104 include silicon oxide, and the sacrificial layers 106 include silicon nitride. Each of the dielectric layers 104 and the sacrificial layers 106 may be formed using, for example, chemical vapor deposition (CVD), atomic layer deposition (ALD), physical vapor deposition (PVD), plasma enhanced CVD (PECVD), or the like.

Although FIG. 1A illustrates a particular number of the dielectric layers 104 and the sacrificial layers 106, other embodiments may include different numbers of the dielectric layers 104 and the sacrificial layers 106. Besides, although the multi-layer stack 102 is illustrated as having dielectric layers as topmost and bottommost layers, the disclosure is not limited thereto. In some embodiments, at least one of the topmost and bottommost layers of the multi-layer stack 102 is a sacrificial layer.

Figure 1B:
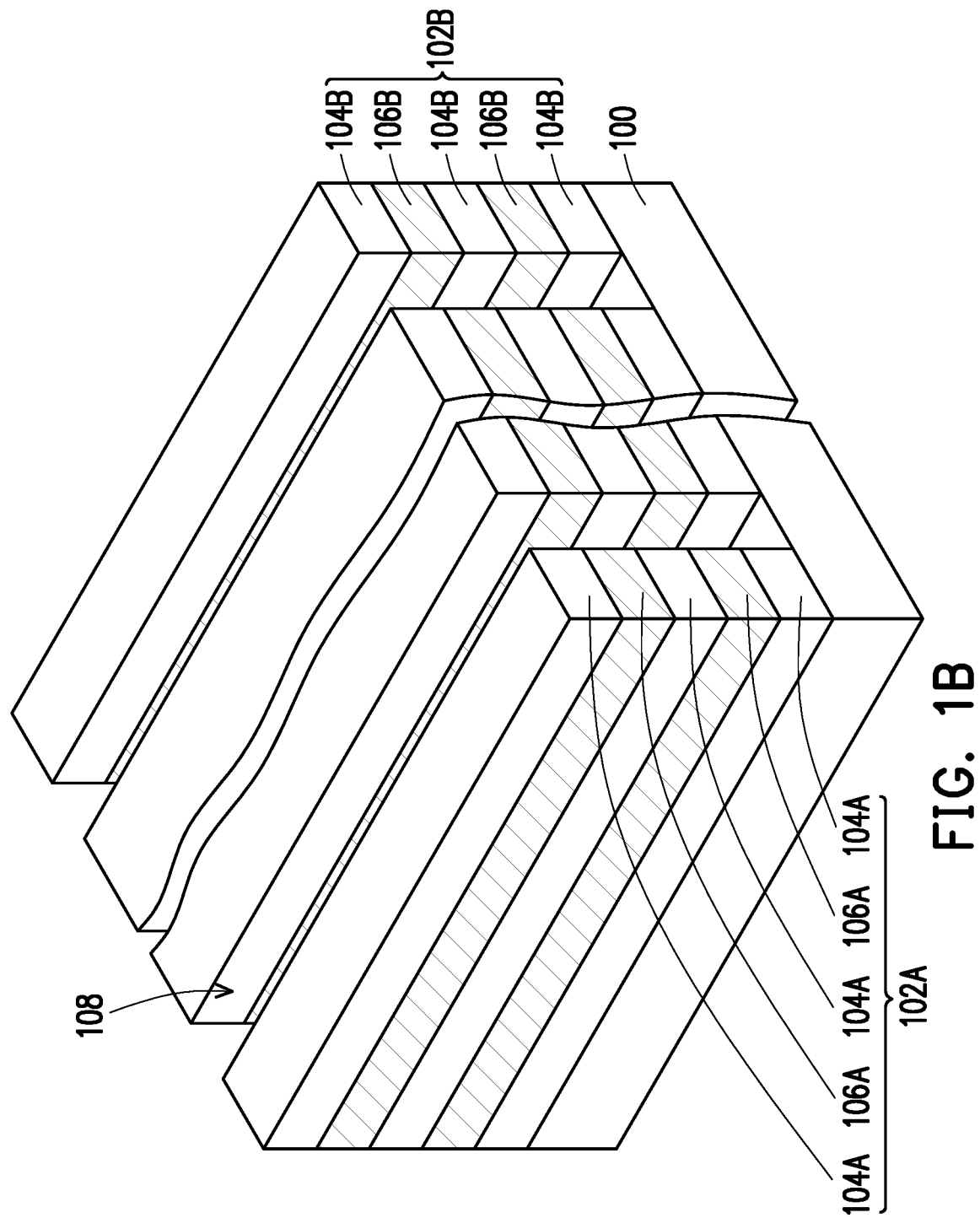

FIG. 1B is a perspective view illustrating one stage of the method of manufacturing the memory device 10 in accordance with some embodiments of the disclosure. Referring to FIG. 1B, the multi-layer stack 102 is patterned to form a multi-layer stack 102A, a multi-layer stack 102B, and a trench 108 between the multi-layer stack 102A and the multi-layer stack 102B. The multi-layer stack 102A may include alternating layers of dielectric layers 104A and sacrificial layers 106A. The multi-layer stack 102B may include alternating layers of dielectric layers 104B and sacrificial layers 106B. The trench 108 extends between the multi-layer stack 102A and the multi-layer stack 102B, and the strip-shaped dielectric layers 104A, the strip-shaped sacrificial layers 106A, the strip-shaped dielectric layers 104B, and the strip-shaped sacrificial layers 106B are accordingly defined. The multi-layer stack 102 may be patterned by performing lithography and etching processes. The etching process may be a dry etch (e.g., a reactive ion etch (RIE), a neutral beam etch (NBE), the like).

Figure 1C:
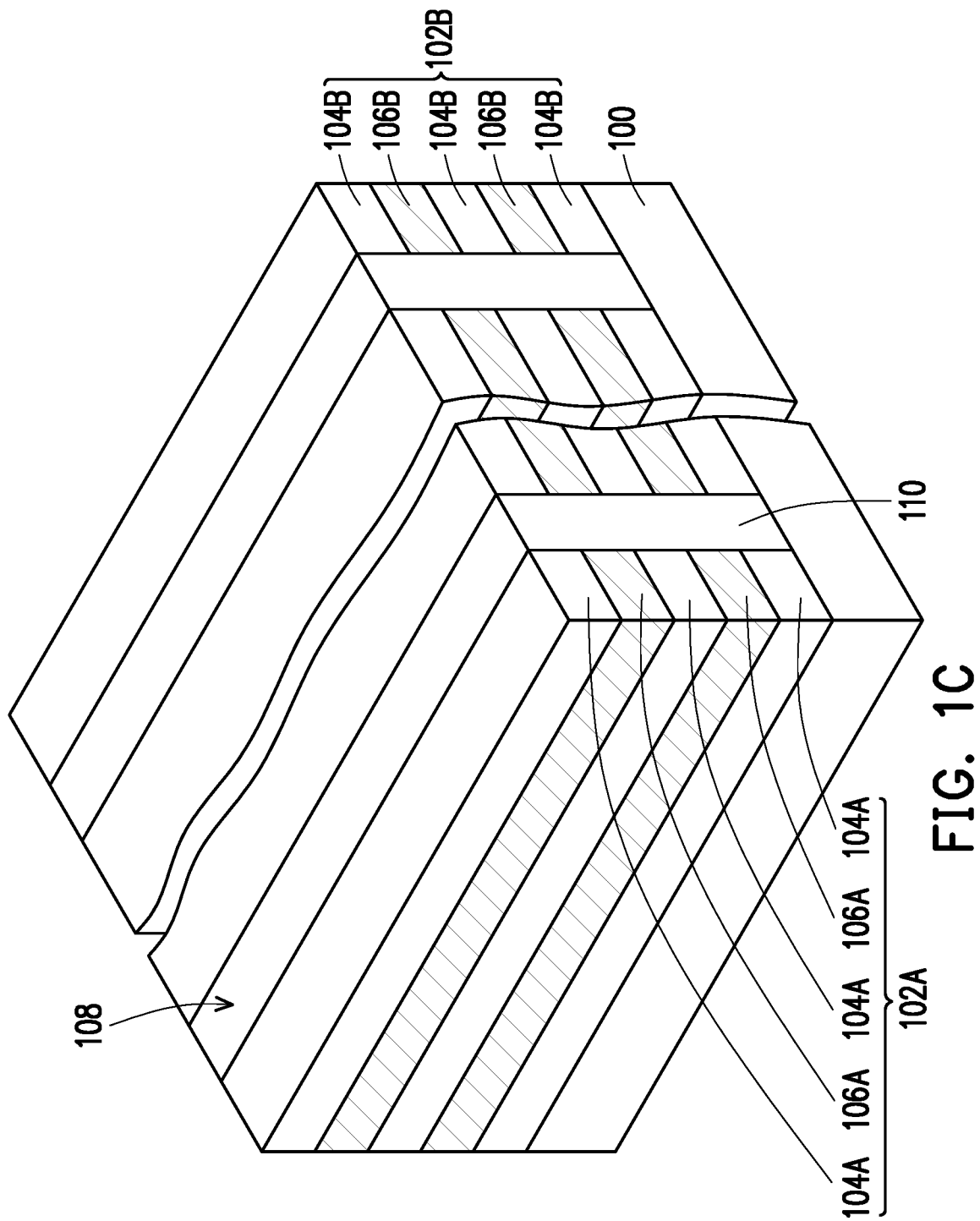

FIG. 1C is a perspective view illustrating one stage of the method of manufacturing the memory device 10 in accordance with some embodiments of the disclosure. Referring to FIG. 1C, the trench 108 is filled with a dielectric material to form a dielectric layer 110. The dielectric material may include insulating materials, such as silicon oxide, silicon nitride, silicon oxynitride, combinations thereof, or the like. In some embodiments, the dielectric material includes silicon oxide. The dielectric material may be formed using, for example, CVD, ALD, PVD, PECVD, or the like. After the dielectric material is deposited, a planarization (e.g., a CMP, etch back, or the like) is performed to remove excess portions of the dielectric material, thereby forming the dielectric layer 110. The dielectric layer 110 may be disposed between the multi-layer stack 102A and the multi-layer stack 102B. The planarization process exposes the multi-layer stack 102A and the multi-layer stack 102B such that top surfaces of the multi-layer stack 102A and the multi-layer stack 102B and the dielectric layer 110 may be substantially level (e.g., within process variations) after the planarization process is completed.

Figure 1D:
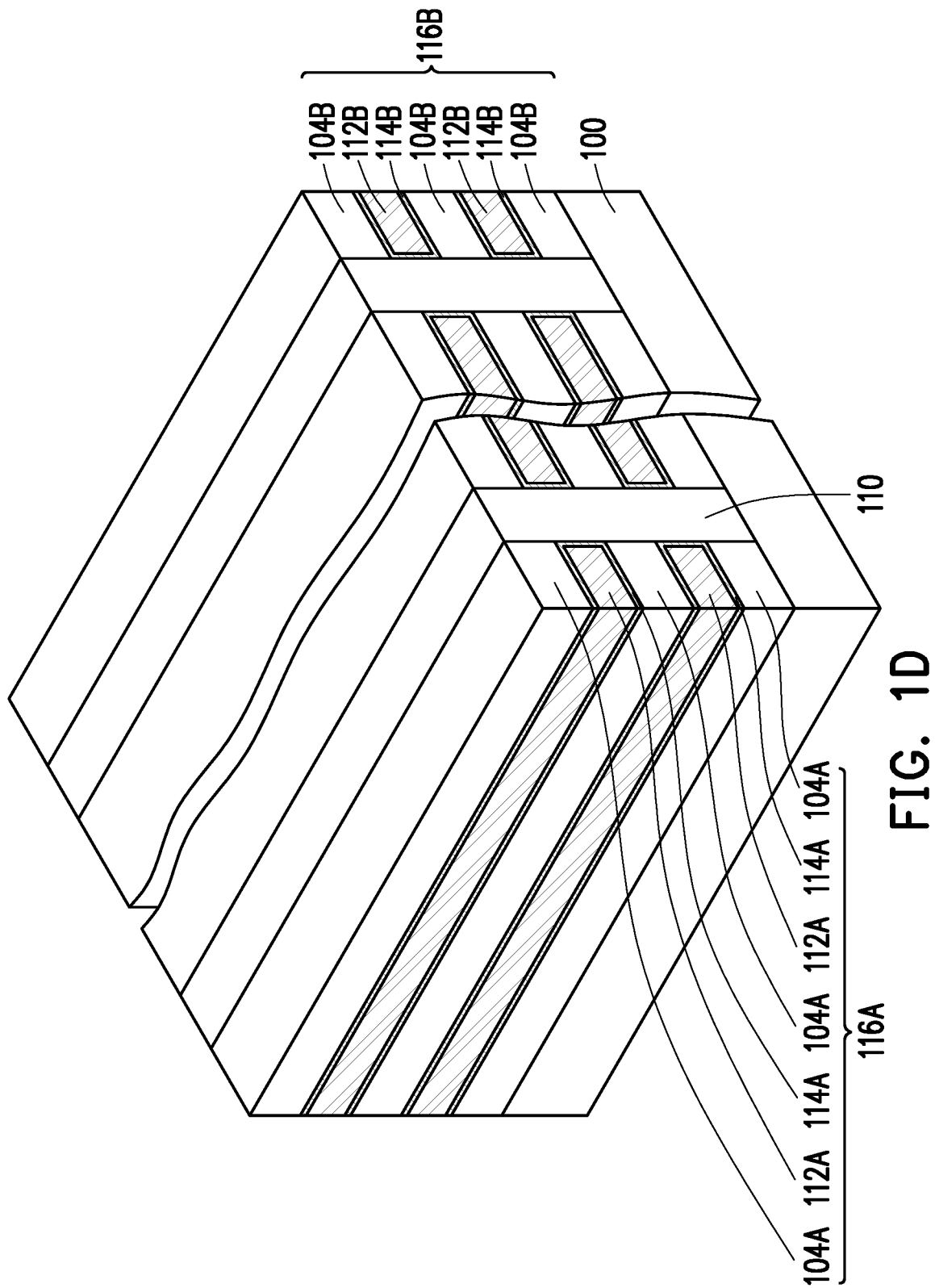

FIG. 1D is a perspective view illustrating one stage of the method of manufacturing the memory device 10 in accordance with some embodiments of the disclosure. Referring to FIG. 1D, the sacrificial layers 106A and the sacrificial layers 106B are respectively replaced with conductive layers 112A and conductive layers 112B. Therefore, the memory device 10 (see FIG. 1H) can have split gates (e.g., the conductive layers 112A and the conductive layers 112B). In some embodiments, each sacrificial layers 106A may be replaced with the conductive layers 112A and the insulating layers 114A, and each sacrificial layers 106B may be replaced with the conductive layers 112B and the insulating layers 114B. For example, the sacrificial layers 106A and the sacrificial layers 106B are removed by an acceptable process, such as a wet etching process, a dry etching process or both. In some embodiments, the multi-layer stack 102A and the multi-layer stack 102B may be further patterned before or after removing the sacrificial layers 106A and the sacrificial layers 106B. Thereafter, an insulating material and a conductive material are sequentially formed in the spaces between the adjacent dielectric layers 104A and in the spaces between the adjacent dielectric layers 104B to form the insulating layers 114A, the insulating layers 114B, the conductive layers 112A, and the conductive layers 112B. The insulating material may include a high-k material such as hafnium oxide (HfO), aluminum oxide (AlO), zirconium oxide (ZrO), a combination thereof, or the like. The conductive material may include metal (e.g., tungsten, ruthenium, molybdenum, cobalt, aluminum, nickel, copper, silver, gold, alloys thereof, or the like) or doped polysilicon. The insulating material and the conductive material may each be formed by an acceptable deposition process such as CVD, PVD, ALD, PECVD, or the like. Thereafter, an acceptable etch-back process is performed to remove the excess insulating material and the excess conductive material outside the spaces between the adjacent dielectric layers 104A and outside the spaces between the adjacent dielectric layers 104B, thereby forming the insulating layers 114A, the insulating layers 114B, the conductive layers 112A and the conductive layers 112B. The acceptable etch-back process includes a dry etch (e.g., RIE, NBE, the like), a wet etch, the like, or a combination thereof. In some embodiments, the etch-back process may be an anisotropic etch process.

Thereby, a multi-layer stack 116A and a multi-layer stack 116B may be formed on the substrate 100. In some embodiments, the multi-layer stack 116A is disposed on the substrate 100 and includes the conductive layers 112A and the dielectric layers 104A stacked alternately. In some embodiments, the multi-layer stack 116A may further include insulating layers 114A disposed between the conductive layers 112A and the dielectric layer 110 and between the conductive layers 112A and the dielectric layers 104A. In some embodiments, the multi-layer stack 116B is disposed on the substrate and includes the conductive layers 112B and the dielectric layers 104B stacked alternately. In some embodiments, the multi-layer stack 116B may further include insulating layers 114B disposed between the conductive layers 112B and the dielectric layer 110 and between the conductive layers 112B and the dielectric layers 104B. In some embodiments, the dielectric layer 110 is disposed between the multi-layer stack 116A and the multi-layer stack 116B.

Figure 1E:
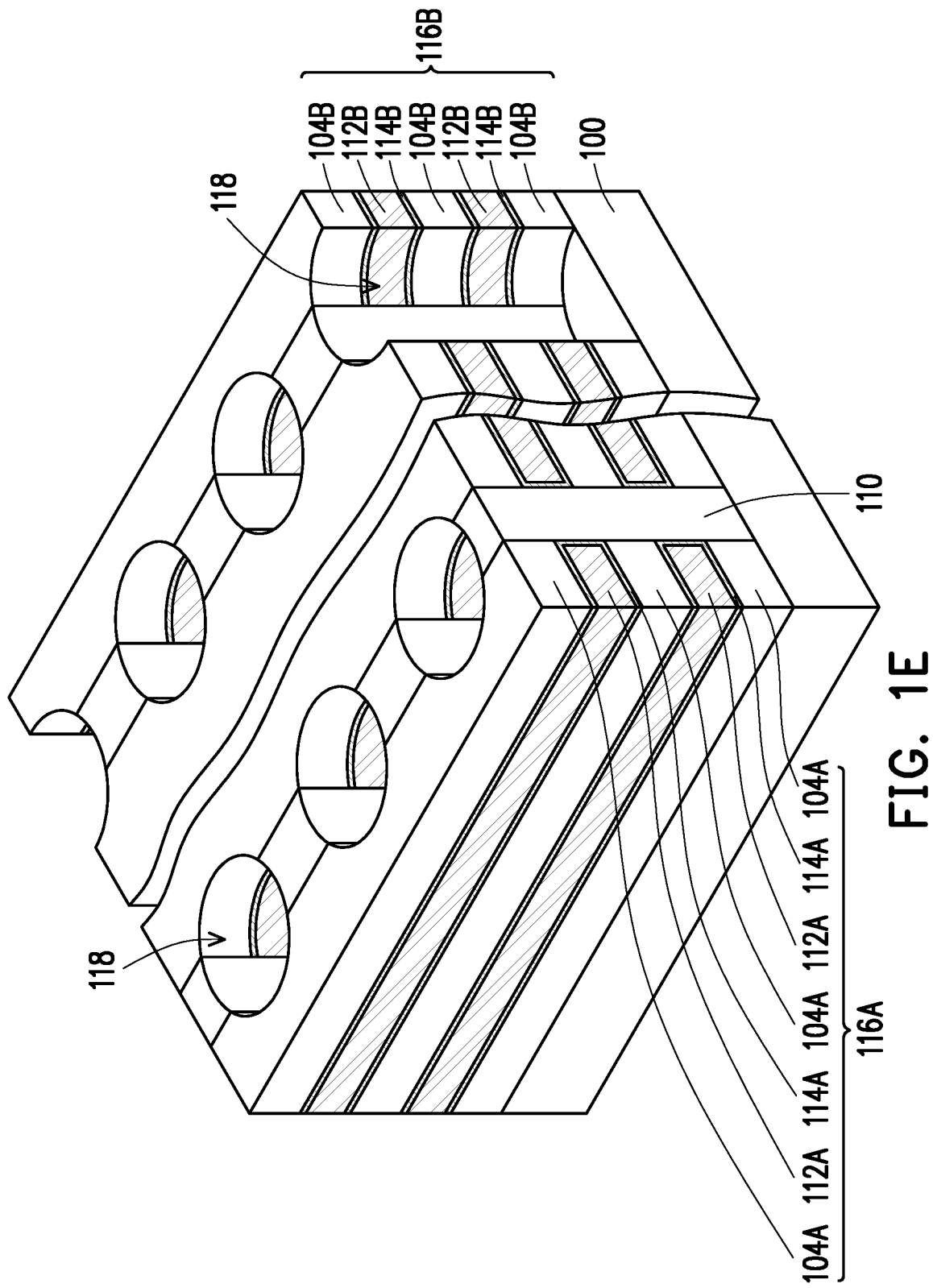

FIG. 1E is a perspective view illustrating one stage of the method of manufacturing the memory device 10 in accordance with some embodiments of the disclosure. Referring to FIG. 1E, a patterning process is performed on the multi-layer stack 116A, the multi-layer stack 116B, and the dielectric layer 110 to formed an opening 118. In some embodiments, the opening 118 may penetrate through the multi-layer stack 116A, the multi-layer stack 116B, and the dielectric layer 110 to expose a portion of the substrate 100. The patterning process may remove a portion of the multi-layer stack 116A, a portion of the multi-layer stack 116B, and a portion of the dielectric layer 110 to form the opening 118. The patterning process may be performed through a combination of lithography and etching processes. The etching process may be a dry etch (e.g., RIE, NBE, the like).

Figure 1F:
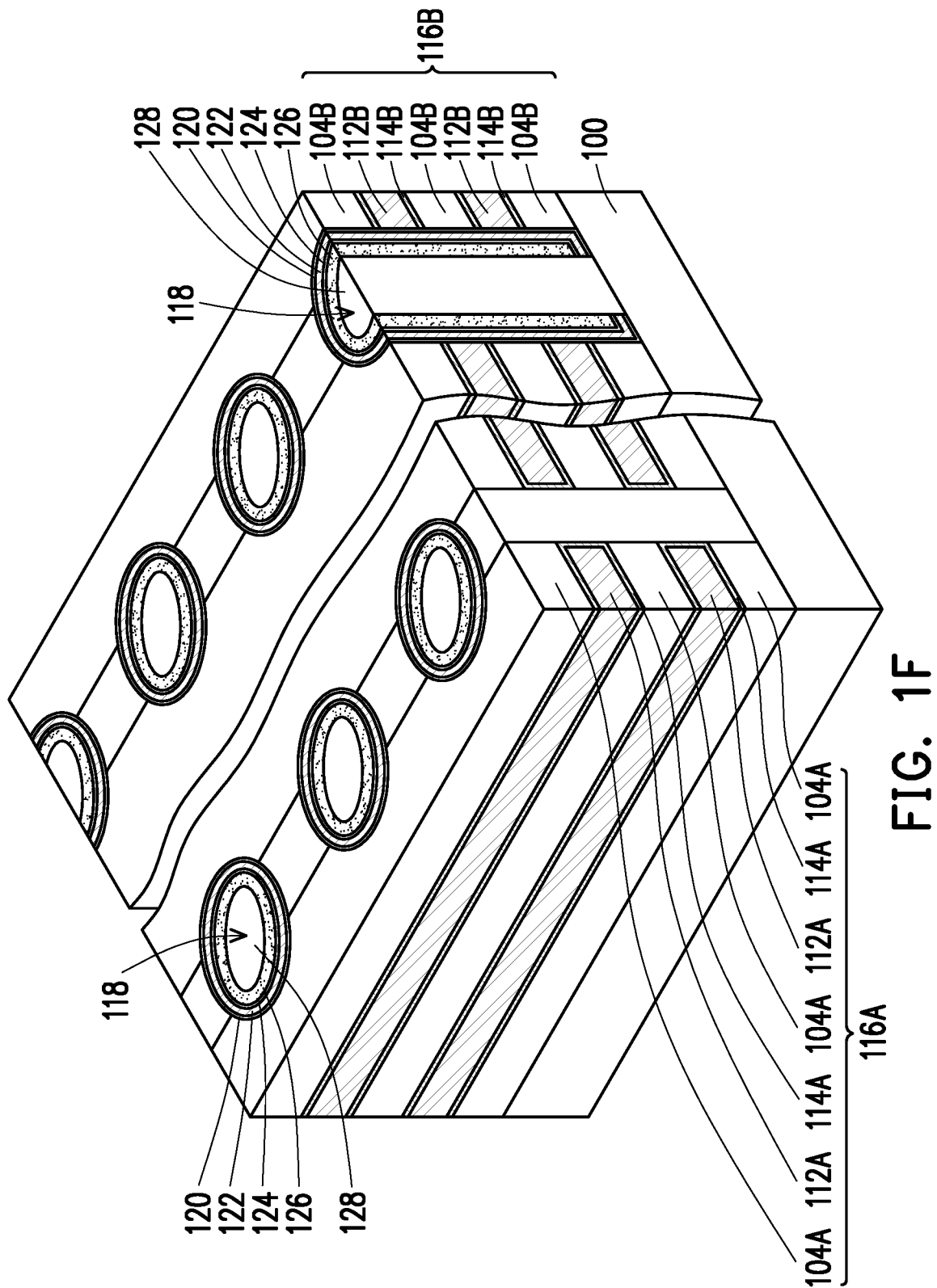

FIG. 1F is a perspective view illustrating one stage of the method of manufacturing the memory device 10 in accordance with some embodiments of the disclosure. Referring to FIG. 1F, a material of a dielectric layer 120, a material of a charge storage layer 122, a material of a dielectric layer 124, and a material of a channel layer 126 are sequentially formed in the opening 118. The material of the dielectric layer 120 may include high temperature oxide (HTO), silicon oxide (SiO), aluminum oxide (AlO), a combination thereof, or the like. The material of the charge storage layer 122 may include a charge trapping material, such as silicon nitride (SiN), silicon oxynitride (SiON), aluminum nitride (AlN), hafnium oxide (HfO), zinc oxide (ZnO), or a combination thereof. The material of the dielectric layer 124 may include AlO, SiO, a combination thereof, or the like. The material of the channel layer 126 may include a semiconductor material, such as polysilicon, germanium (Ge), metal oxide (e.g., zinc oxide (ZnO), indium gallium zinc oxide (IGZO), etc.). The material of the dielectric layer 120, the material of the charge storage layer 122, the material of the dielectric layer 124, and the material of the channel layer 126 may each be formed by an acceptable deposition process such as CVD, PVD, ALD, PECVD, or the like. The material of the channel layer 126 may be a doped semiconductor material or an undoped semiconductor material.

Thereafter, an acceptable etch-back process is performed on the material of the channel layer 126, the material of the dielectric layer 124, the material of the charge storage layer 122, and the material of the dielectric layer 120, thereby forming the channel layer 126, the dielectric layer 124, the charge storage layer 122, and the dielectric layer 120 and exposing a portion of the substrate 100. The dielectric layer 120, the charge storage layer 122, the dielectric layer 124, and the channel layer 126 may penetrate through the conductive layers 112A, the dielectric layers 104A, the conductive layers 112B, the dielectric layers 104B, and the dielectric layer 110. In some embodiments, the charge storage layer 122 is disposed between the conductive layers 112A and the channel layer 126 and between the conductive layers 112B and the channel layer 126. The dielectric layer 120 is disposed between the multi-layer stack 116A and the charge storage layer 122 and between the multi-layer stack 116B and the charge storage layer 122. The dielectric layer 120 may be used as a blocking layer. The dielectric layer 124 is disposed between the charge storage layer 122 and the channel layer 126. The dielectric layer 124 may be used as a tunneling layer. In some embodiments, the dielectric layer 120, the charge storage layer 122, the dielectric layer 124, and the channel layer 126 may each have an annular pillar structure.

After forming the dielectric layer 120, the charge storage layer 122, the dielectric layer 124, and the channel layer 126, a material of the dielectric pillar 128 is formed in the opening 118. The material of the dielectric pillar 128 may include a dielectric material such as oxide (e.g. silicon oxide). The material of the dielectric pillar 128 may be formed by an acceptable deposition process such as CVD, PVD, ALD, PECVD, or the like. Thereafter, a removal process is performed to remove the material of the dielectric pillar 128 outside the opening 118, thereby forming the dielectric pillar 128. The dielectric pillar 128 may be enclosed by the channel layer 126. The dielectric pillar 128 may penetrate through the conductive layers 112A, the dielectric layers 104A, the conductive layers 112B, the dielectric layers 104B, and the dielectric layer 110. In some embodiments, the removal process may be a planarization process, such as a chemical mechanical polish (CMP), an etch-back process, a combination thereof, or the like. In the resulting structure, top surfaces of the multi-layer stack 116A, the multi-layer stack 116B, the dielectric layer 110, the dielectric layer 120, the charge storage layer 122, the dielectric layer 124, the channel layer 126, and the dielectric pillar 128 may be substantially level (e.g., within process variations).

Figure 1G:
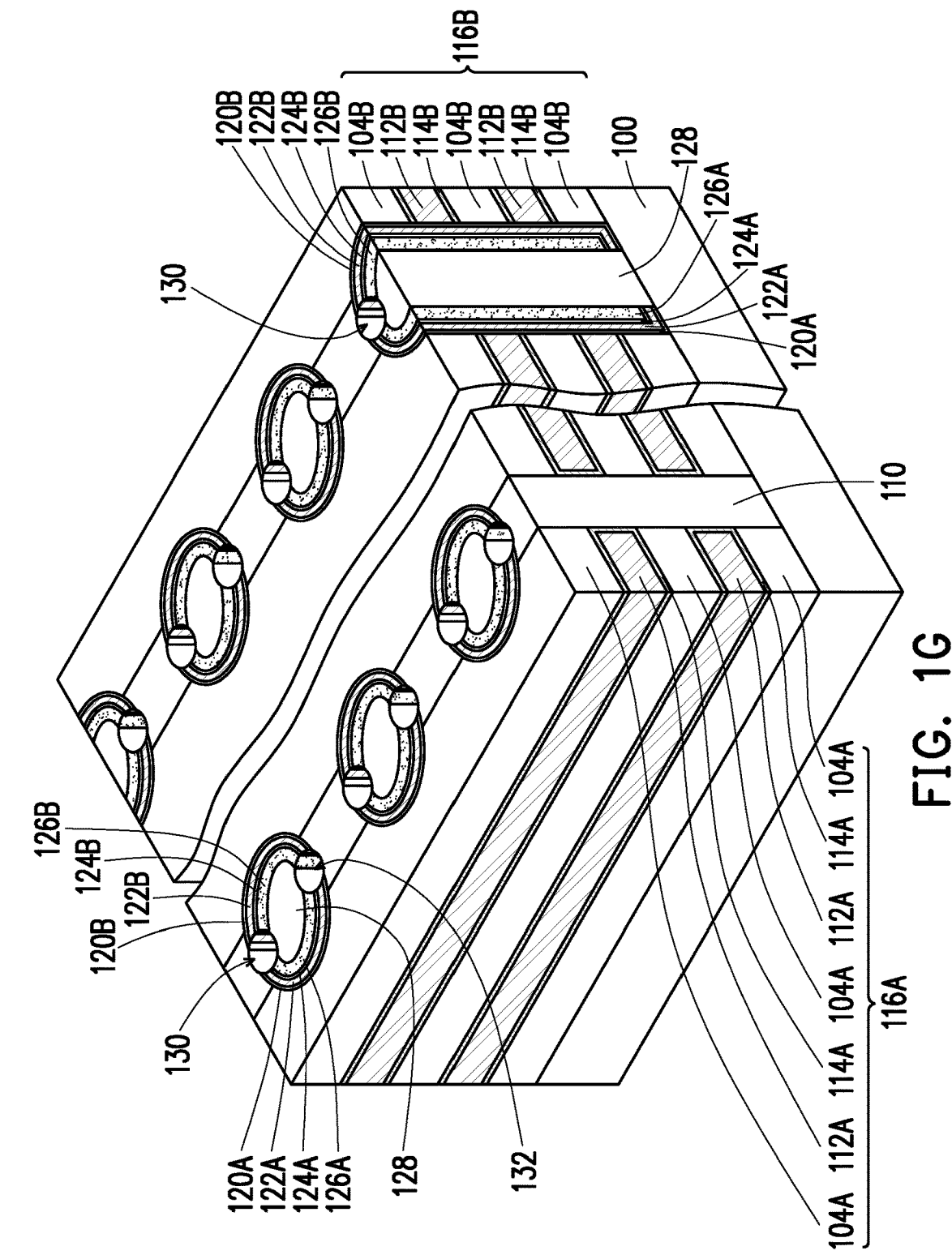

FIG. 1G is a perspective view illustrating one stage of the method of manufacturing the memory device 10 in accordance with some embodiments of the disclosure. Referring to FIG. 1G, a patterning process is performed on the channel layer 126 to form an opening 130 and an opening 132. The patterning process may remove a portion of the channel layer 126. The patterning process may be performed through a combination of lithography and etching processes. The etching process may be a dry etch (e.g., RIE, NBE, the like). In some embodiments, the opening 130 and the opening 132 may penetrate through the channel layer 126 to expose a portion of the substrate 100. In some embodiments, the patterning process may further remove a portion of the dielectric pillar 128 to expose a portion of the substrate 100.

In some embodiments, the opening 130 and the opening 132 divide the channel layer 126 into a channel portion 126A and a channel portion 126B that are separated from each other. That is, the channel layer 126 includes the channel portion 126A and the channel portion 126B separated from each other. Thereby, 2 bits per cell (bits/cell) storage and higher cell density can be achieved. In some embodiments, the conductive layers 112A may be located aside the channel portion 126A, and the conductive layers 112B may be located aside the channel portion 126B. In some embodiments, the insulating layers 114A may be located aside the channel portion 126A, and the insulating layers 114B may be located aside the channel portion 126B.

In some embodiments, the patterning process may be further performed on the dielectric layer 124, and the opening 130 and the opening 132 may further divide the dielectric layer 124 into a dielectric portion 124A and a dielectric portion 124B. In some embodiments, the opening 130 and the opening 132 may penetrate through the dielectric layer 124 to expose a portion of the substrate 100. The dielectric layer 124 may include the dielectric portion 124A and the dielectric portion 124B separated from each other. In alternative embodiments, the patterning process may not be performed on the dielectric layer 124, and the opening 130 and the opening 132 may not divide the dielectric layer 124 into two portions.

In some embodiments, the patterning process may be further performed on the charge storage layer 122, and the opening 130 and the opening 132 may further divide the charge storage layer 122 into a charge storage portion 122A and a charge storage portion 122B. In some embodiments, the opening 130 and the opening 132 may penetrate through the charge storage layer 122 to expose a portion of the substrate 100. The charge storage layer 122 may include the charge storage portion 122A and the charge storage 122B separated from each other. In alternative embodiments, the patterning process may not be performed on the charge storage layer 122, and the opening 130 and the opening 132 may not divide the charge storage layer 122 into two portions.

In some embodiments, the patterning process may be further performed on the dielectric layer 120, and the opening 130 and the opening 132 may further divide the dielectric layer 120 into a dielectric portion 120A and a dielectric portion 120B. In some embodiments, the opening 130 and the opening 132 may penetrate through the dielectric layer 120 to expose a portion of the substrate 100. The dielectric layer 120 may include the dielectric portion 120A and the dielectric portion 120B separated from each other. In alternative embodiments, the patterning process may not be performed on the dielectric layer 120, and the opening 130 and the opening 132 may not divide the dielectric layer 120 into two portions. In some embodiments, the patterning process may further remove a portion of the dielectric layer 110 to expose a portion of the substrate 100.

Figure 1H:
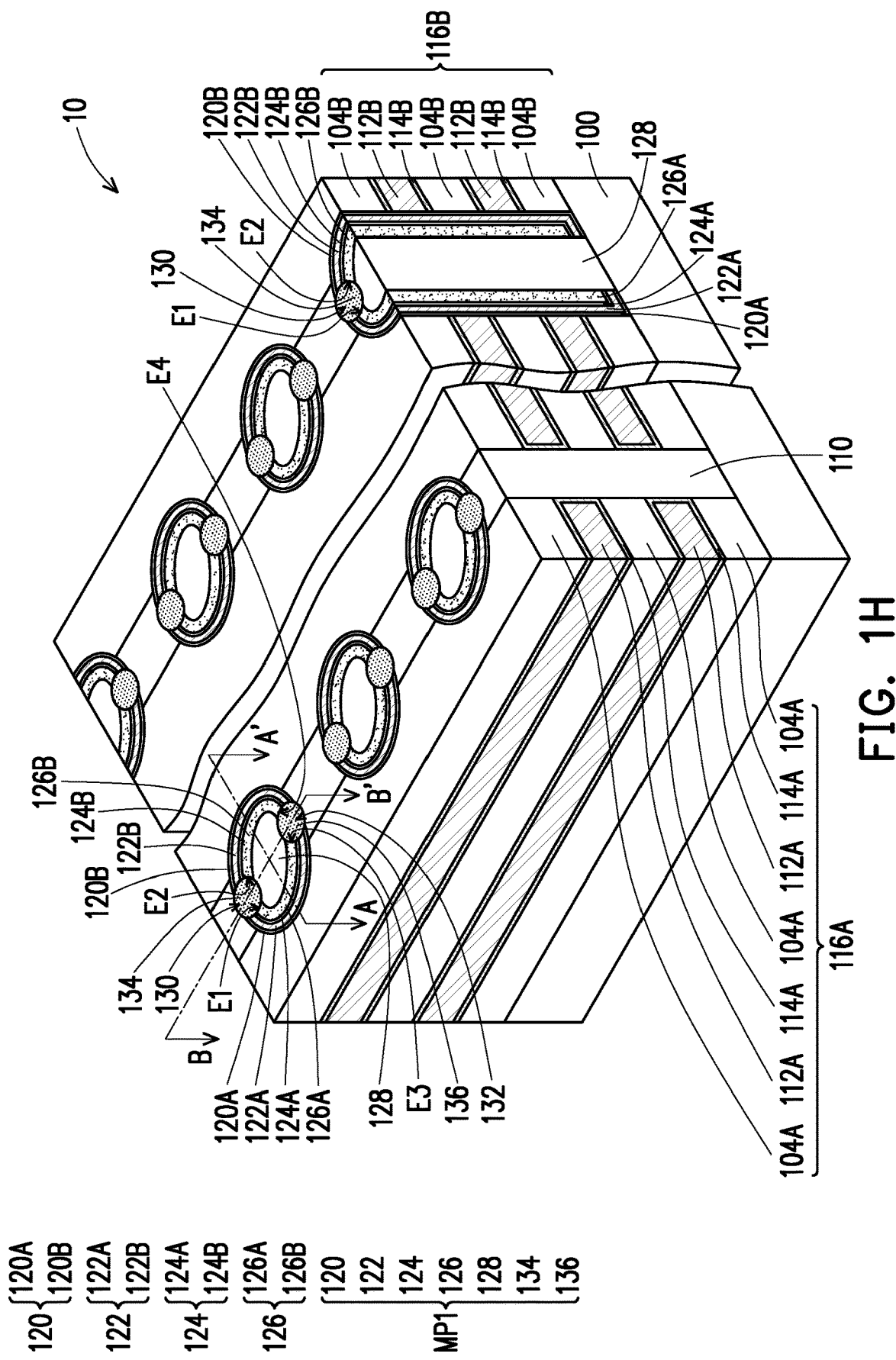
Figure 2C:
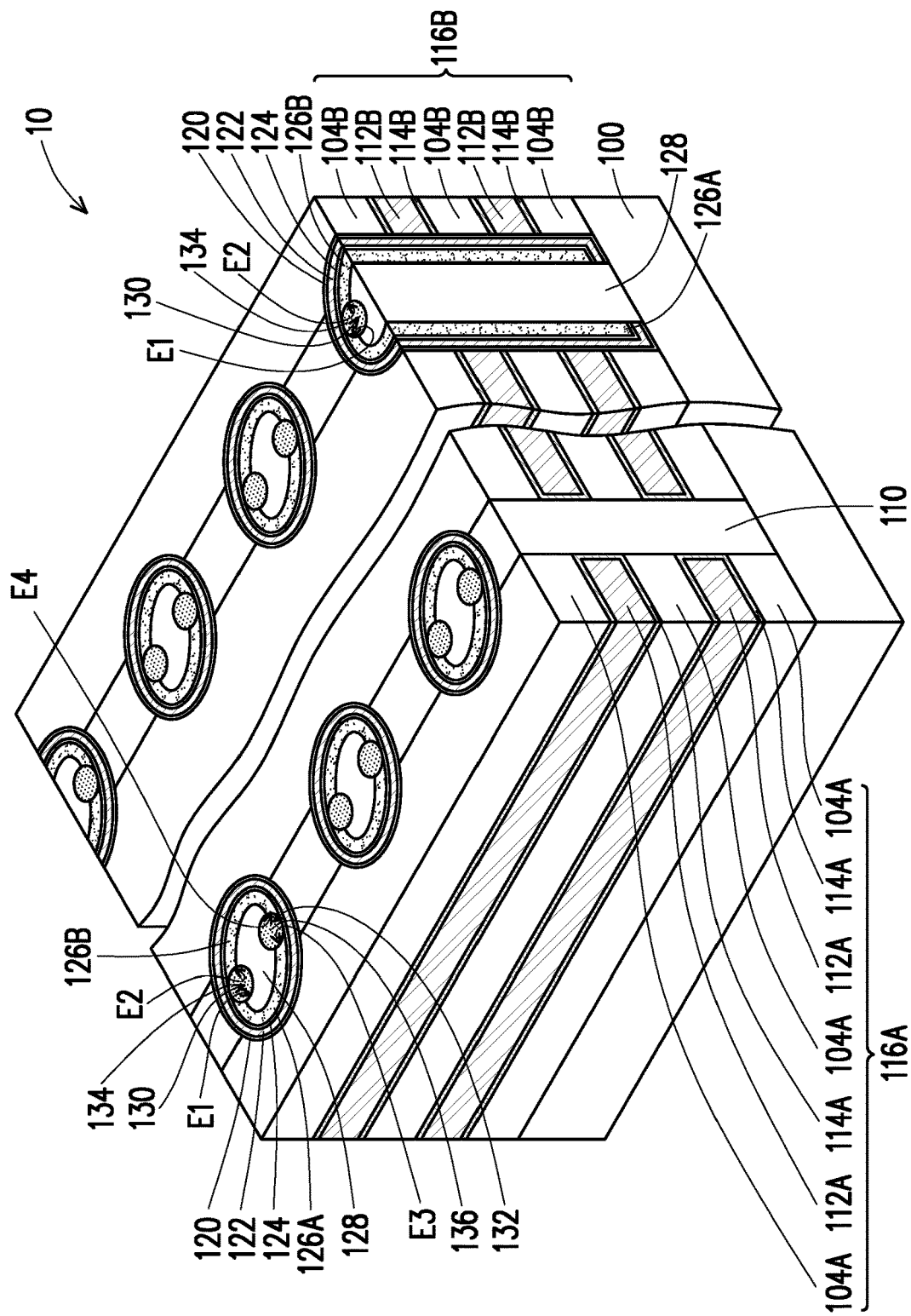
FIG. 2C to FIG. 2E are perspective views illustrating one stage of the method of manufacturing the memory device in accordance with yet alternative embodiments of the disclosure.
Figure 2D:
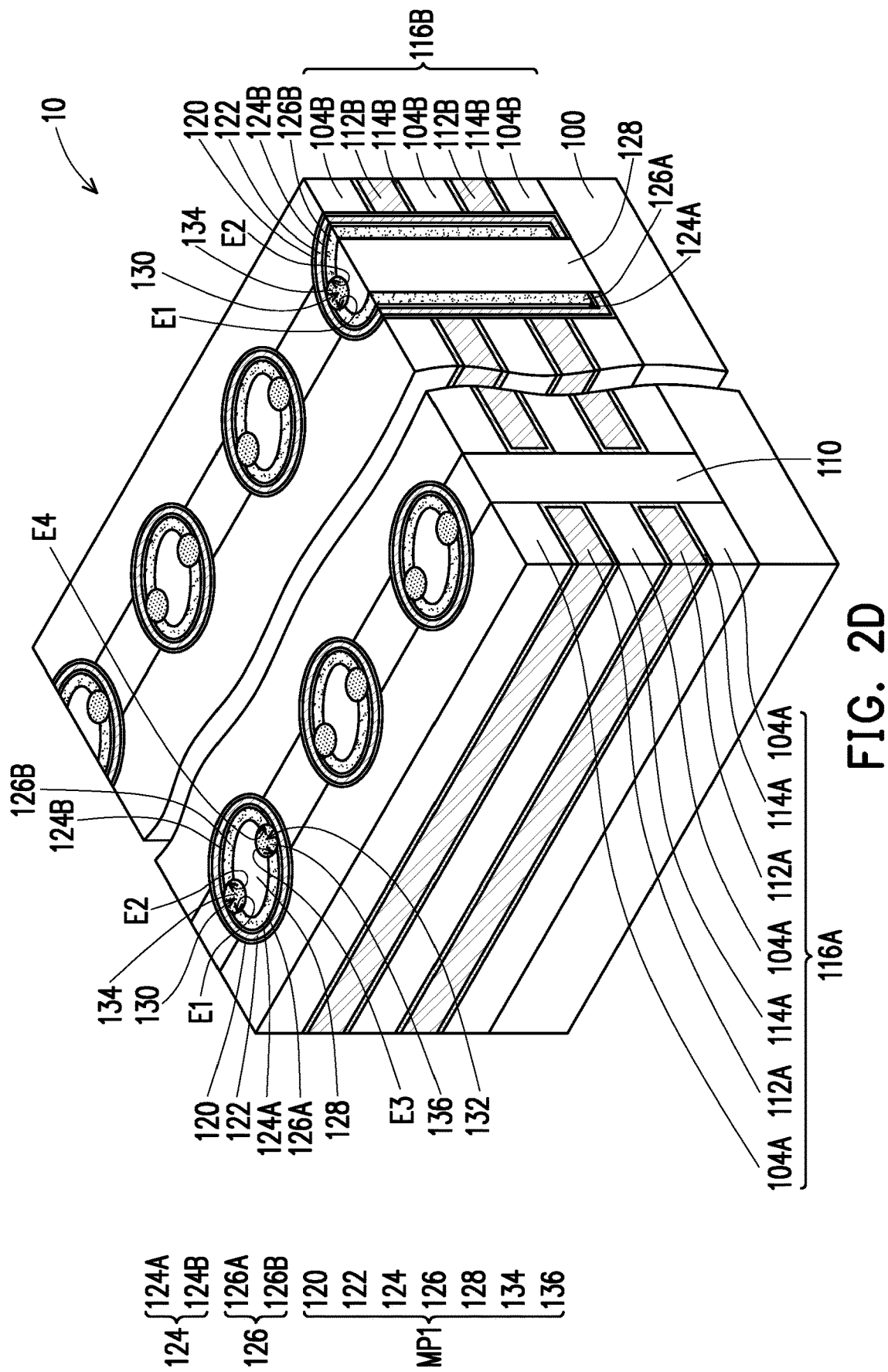
Figure 2E:
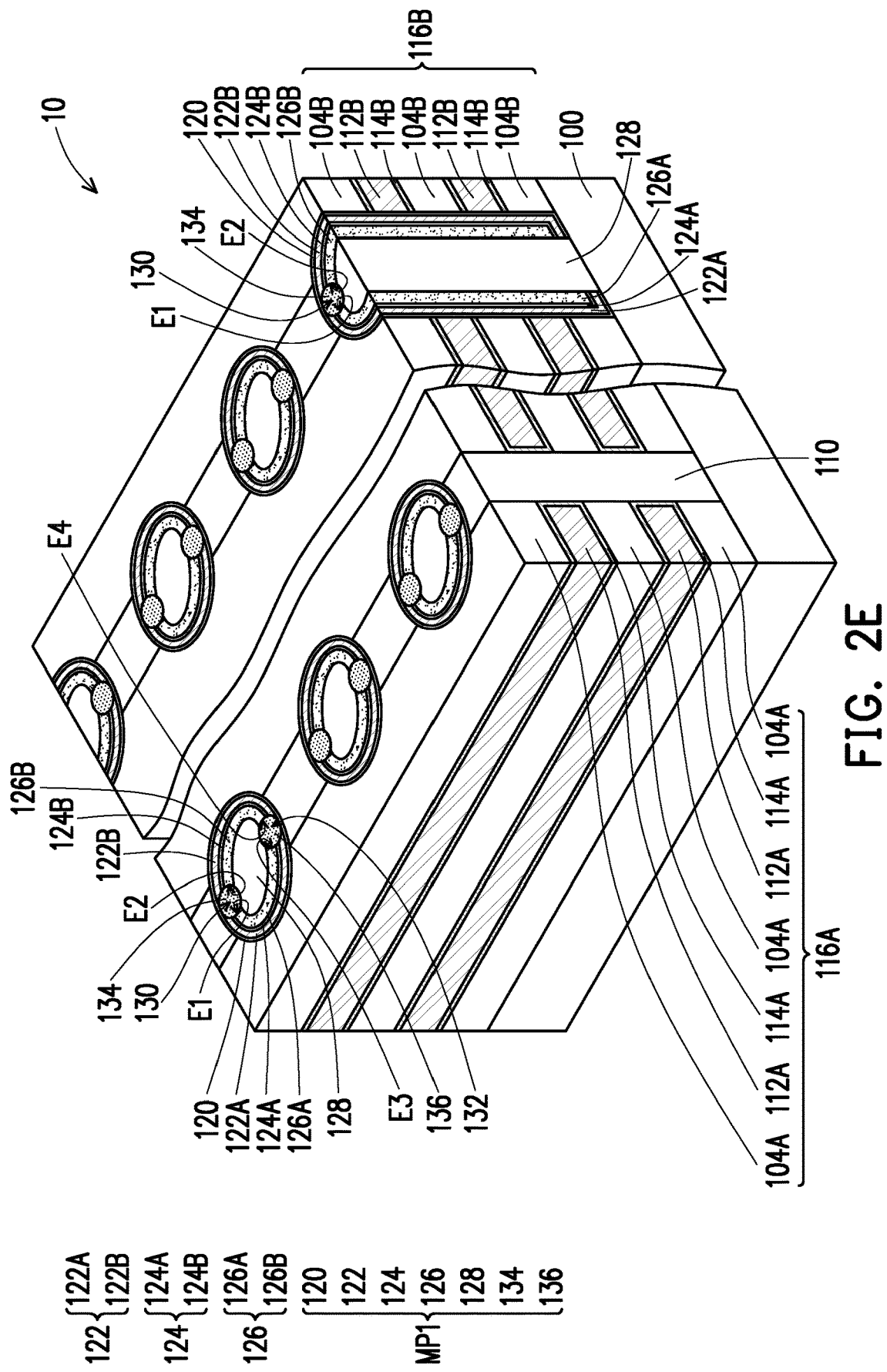

FIG. 1H is a perspective view illustrating one stage of the method of manufacturing the memory device 10 in accordance with some embodiments of the disclosure. FIG. 2A is a cross-sectional view illustrating the memory device 10 taken along section line A-A' in FIG. 1H. FIG. 2B is a cross-sectional view illustrating the memory device 10 taken along section line B-B' in FIG. 1H. FIG. 2C to FIG. 2E are perspective views illustrating one stage of the method of manufacturing the memory device 10 in accordance with yet alternative embodiments of the disclosure. Referring to FIG. 1H, FIG. 2A and FIG. 2B, the opening 130 and the opening 132 are filled with a conductive material to form a conductive pillar 134 and a conductive pillar 136 (e.g., source/drain pillars). The conductive material may include metal (e.g., tungsten, ruthenium, molybdenum, cobalt, aluminum, nickel, copper, silver, gold, alloys thereof, or the like) or doped polysilicon, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillar 134 and the conductive pillar 136 in the opening 130 and the opening 132, respectively. In the resulting structure, top surfaces of the multi-layer stack 116A, the multi-layer stack 116B, the dielectric layer 110, the dielectric layer 120, the charge storage layer 122, the dielectric layer 124, the channel layer 126, the dielectric pillar 128, the conductive pillar 134, and the conductive pillar 136 may be substantially level (e.g., within process variations).

In some embodiments, the conductive pillar 134 and the conductive pillar 136 are adjacent to the channel layer 126. The conductive pillar 134 is disposed between one end E1 of the channel portion 126A and one end E2 of the channel portion 126B, and the conductive pillar 136 is disposed between the other end E3 of the channel portion 126A and the other end E4 of the channel portion 126B. Thereby, the channel layer 126 can be divided into two portions (e.g., the channel portion 126A and the channel portion 126B) by the conductive pillar 134 and the conductive pillar 136.

In some embodiments, as shown in FIG. 1H, FIG. 2D, and FIG. 2E, the dielectric layer 124 may be divided into two portions (e.g., the dielectric portion 124A and the dielectric portion 124B) by the conductive pillar 134 and the conductive pillar 136. In alternative embodiments, as shown in FIG. 2C, the dielectric layer 124 may not be divided into two portions by the conductive pillar 134 and the conductive pillar 136. In some embodiments, as shown in FIG. 1H, and FIG. 2E, the charge storage layer 122 may be divided into two portions (e.g., the charge storage portion 122A and the charge storage portion 122B) by the conductive pillar 134 and the conductive pillar 136. In alternative embodiments, as shown in FIG. 2C and FIG. 2D, the charge storage layer 122 may not be divided into two portions by the conductive pillar 134 and the conductive pillar 136. In some embodiments, as shown in FIG. 1H, the dielectric layer 120 may be divided into two portions (e.g., the dielectric portion 120A and the dielectric portion 120B) by the conductive pillar 134 and the conductive pillar 136. In alternative embodiments, as shown in FIG. 2C to FIG. 2E, the dielectric layer 120 may not be divided into two portions by the conductive pillar 134 and the conductive pillar 136.

In some embodiments, the conductive pillar 134 and the conductive pillar 136 are electrically isolated from the conductive layers 112A and the conductive layers 112B. For example, the dielectric layer 120, the charge storage layer 122, and the dielectric layer 124 are disposed between the conductive pillar 134 and the conductive layers 112A, between the conductive pillar 134 and the conductive layers 112B, between the conductive pillar 136 and the conductive layers 112A, and between the conductive pillar 136 and the conductive layers 112B, thereby electrically isolating the conductive pillar 134 and the conductive pillar 136 from the conductive layers 112A and the conductive layers 112B. In some embodiments, the conductive pillar 134 is electrically isolated from the conductive pillar 136 by the dielectric pillar 128.

In some embodiments, the memory device 10 may include memory pillars MP1. Each memory pillar MP1 may include the dielectric layer 120, the charge storage layer 122, the dielectric layer 124, the channel layer 126, the dielectric pillar 128, the conductive pillar 134, and the conductive pillar 136. The top view shape of the memory pillar MP1 may be a circle, a circle with protrusions (FIG. 1H), an ellipse, an ellipse with protrusions, a polygon (a square or a rectangle, etc.), a polygon with protrusions, combinations thereof, or the like.

In the memory device 10, the conductive pillar 134 is disposed between one end E1 of the channel portion 126A and one end E2 of the channel portion 126B, and the conductive pillar 136 is disposed between the other end E3 of the channel portion 126A and the other end E4 of the channel portion 126B, so that the channel layer 126 includes the channel portion 126A and the channel portion 126B separated from each other. Therefore, the memory device 10 can achieved 2 bits/cell storage and higher cell density.

Figure 3A:
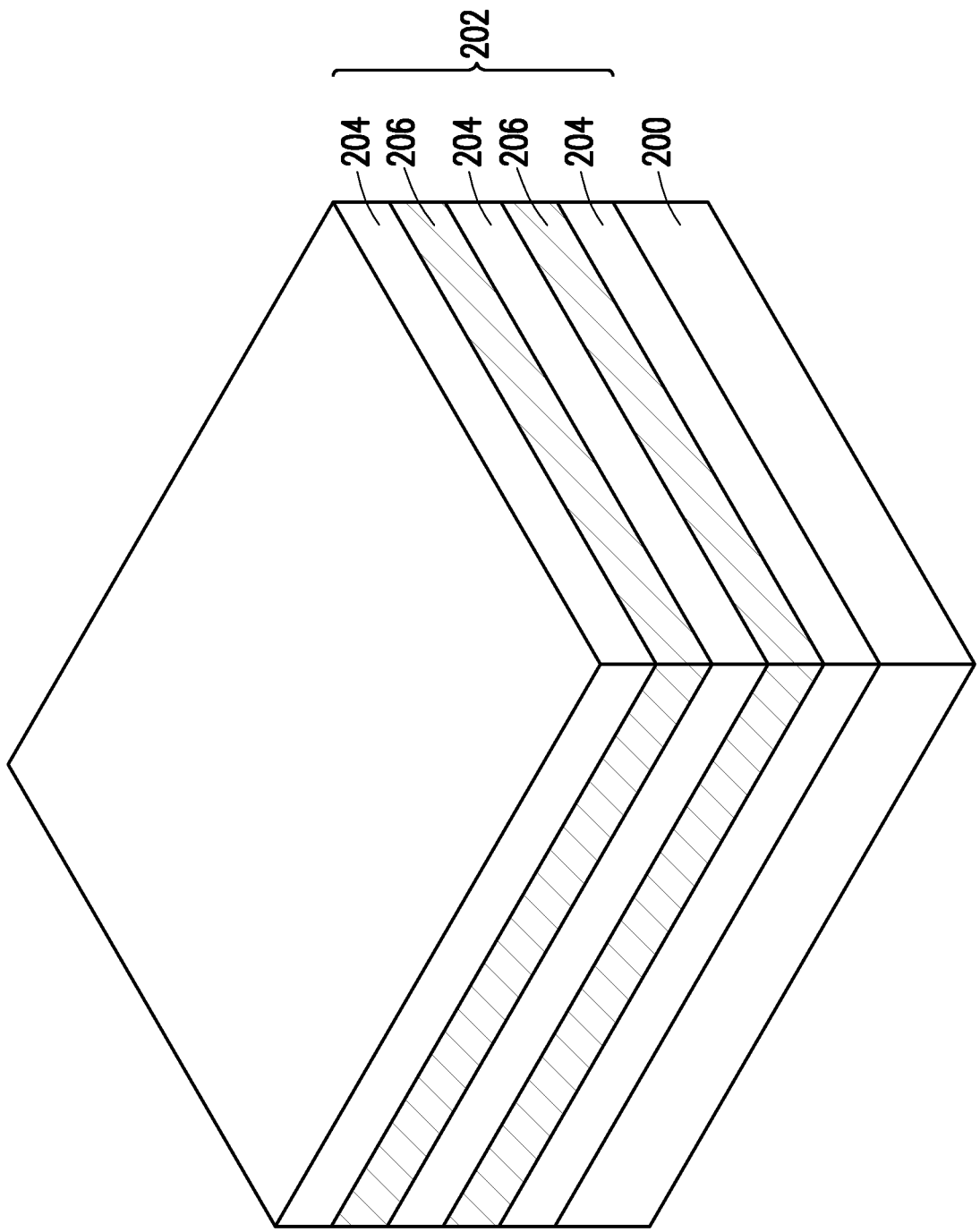
FIG. 3A to FIG. 3F are perspective views illustrating various stages of a method of manufacturing a memory device in accordance with alternative embodiments of the disclosure.

FIG. 3A is a perspective view illustrating one stage of a method of manufacturing the memory device 20 in accordance with alternative embodiments of the disclosure. Referring to FIG. 3A, a substrate 200 is provided. The detailed description of the substrate 200 may refer to the description of the substrate 100 of FIG. 1A, and the description thereof is omitted herein.

A multi-layer stack 202 is formed over the substrate 200. Although the multi-layer stack 202 is illustrated as contacting the substrate 200, any number of intermediate layers may be disposed between the substrate 200 and the multi-layer stack 202. For example, one or more interconnect layers including conductive features in insulting layers (e.g., low-k dielectric layers) may be disposed between the substrate 200 and the multi-layer stack 202. In some embodiments, the conductive features may be patterned to provide power, ground, and/or signal lines for the active devices on the substrate 200 and/or the memory device 20 (see FIG. 3F).

The multi-layer stack 202 includes alternating layers of dielectric layers 204 and sacrificial layers 206. The sacrificial layers 206 may be patterned and replaced in subsequent steps to define conductive layers 228 (e.g., the word lines). The dielectric layers 204 may include insulating materials, such as silicon oxide, silicon nitride, silicon oxynitride, combinations thereof, or the like. The sacrificial layers 206 may include dielectric materials, such as silicon oxide, silicon nitride, silicon oxynitride, combinations thereof, or the like. The dielectric layers 204 and the sacrificial layers 206 include different materials with different etching selectivities. In some embodiments, the dielectric layers 204 include silicon oxide, and the sacrificial layers 206 include silicon nitride. Each of the dielectric layers 204 and the sacrificial layers 206 may be formed using, for example, CVD, ALD, PVD, PECVD, or the like.

Although FIG. 3A illustrates a particular number of the dielectric layers 204 and the sacrificial layers 206, other embodiments may include different numbers of the dielectric layers 204 and the sacrificial layers 206. Besides, although the multi-layer stack 202 is illustrated as having dielectric layers as topmost and bottommost layers, the disclosure is not limited thereto. In some embodiments, at least one of the topmost and bottommost layers of the multi-layer stack 202 is a sacrificial layer.

Figure 3B:
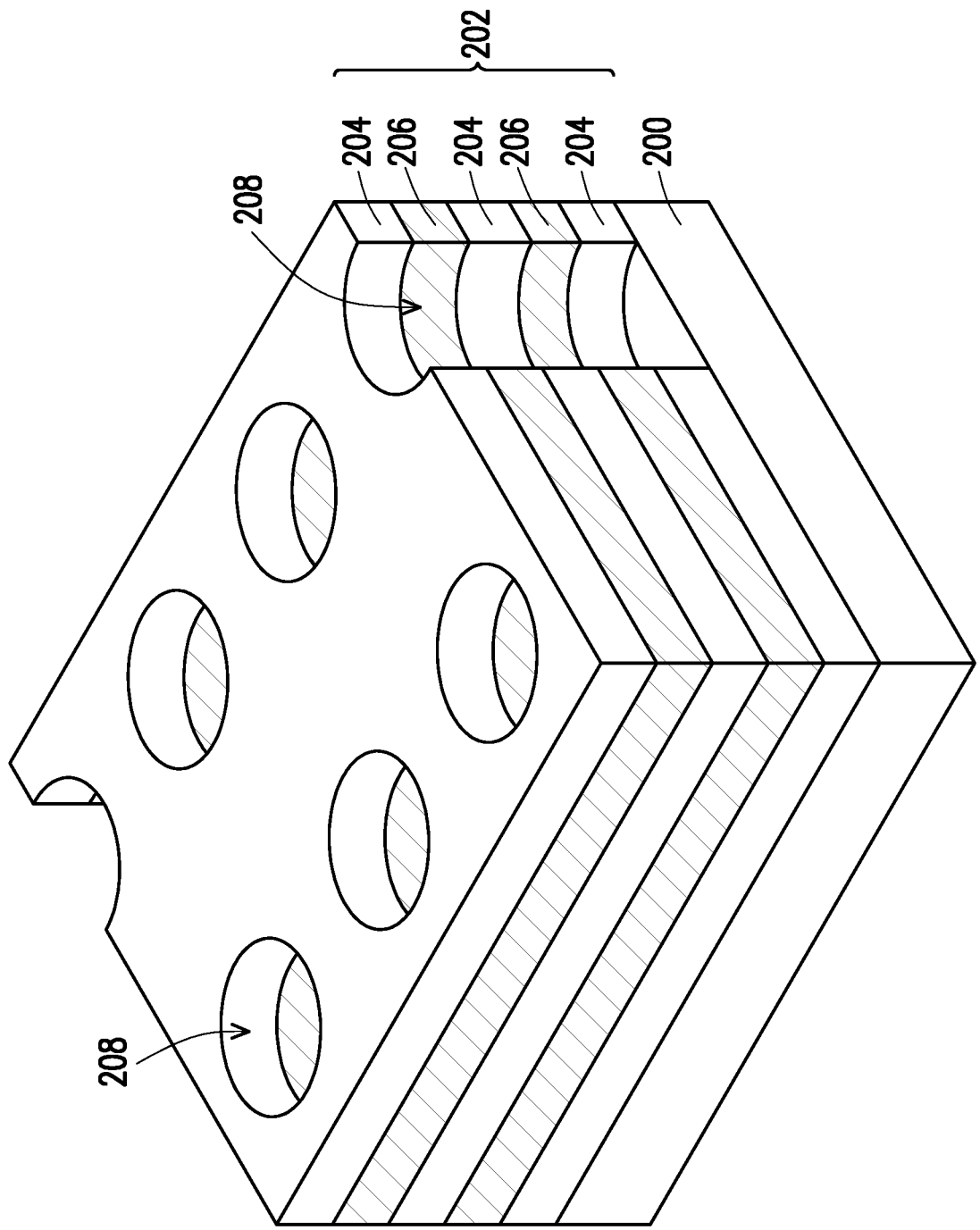

FIG. 3B is a perspective view illustrating one stage of the method of manufacturing the memory device 20 in accordance with alternative embodiments of the disclosure. Referring to FIG. 3B, a patterning process may be performed on the multi-layer stack 202 to formed an opening 208. The patterning process may remove a portion of the multi-layer stack 202. The patterning process may be performed through a combination of lithography and etching processes. The etching process may be a dry etch (e.g., RIE, NBE, the like). In some embodiments, the opening 208 may penetrate through the multi-layer stack 202 to expose a portion of the substrate 200.

Figure 3C:
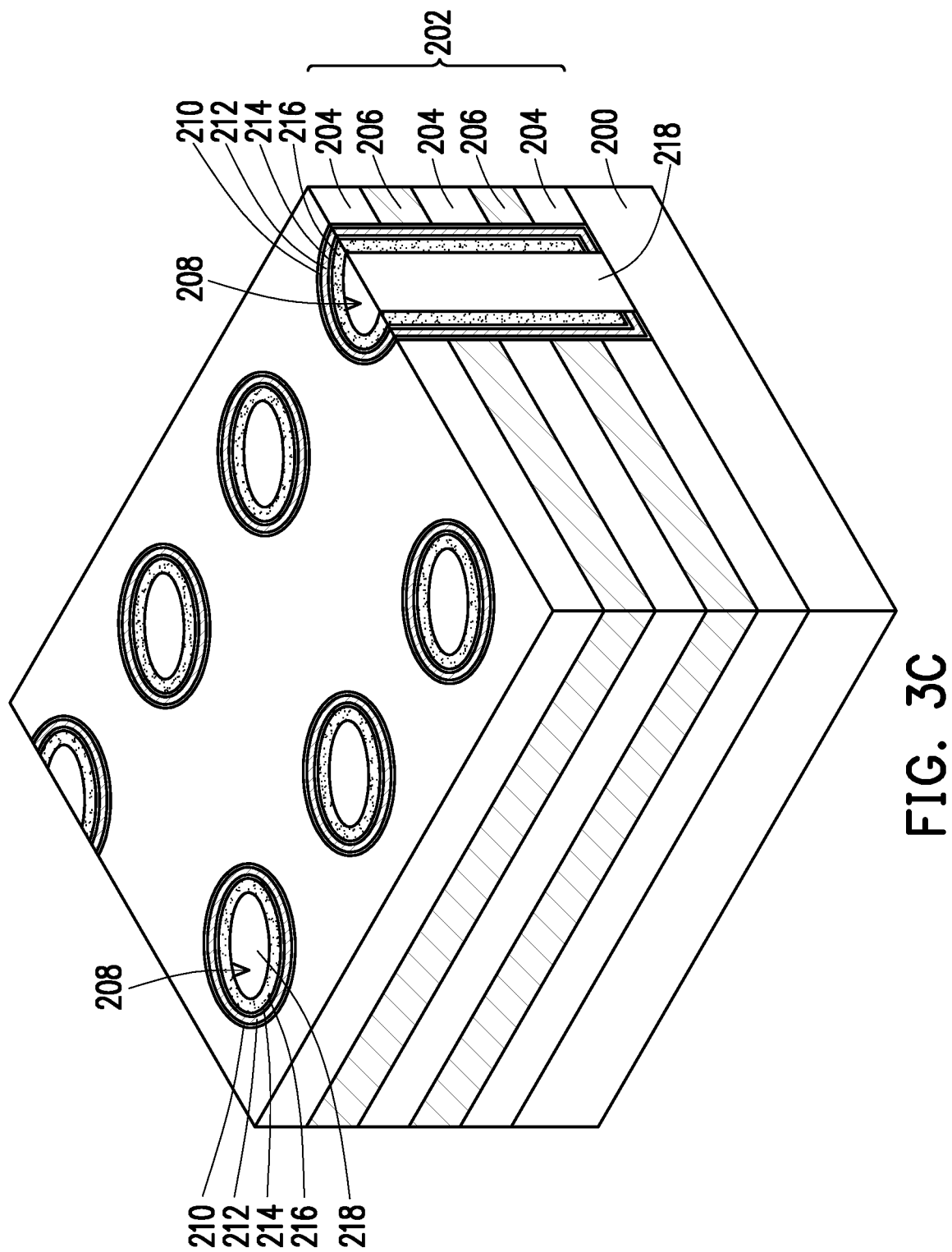

FIG. 3C is a perspective view illustrating one stage of the method of manufacturing the memory device 20 in accordance with alternative embodiments of the disclosure. Referring to FIG. 3C, a material of a dielectric layer 210, a material of a charge storage layer 212, a material of a dielectric layer 214, and a material of a channel layer 216 may be sequentially formed in the opening 208. The material of the dielectric layer 210 may include HTO, SiO, AlO, a combination thereof, or the like. The material of the charge storage layer 212 may include a charge trapping material, such as SiN, SiON, AlN, HfO, ZnO, or a combination thereof. The material of the dielectric layer 214 may include AlO, SiO, a combination thereof, or the like. The material of the channel layer 216 may include a semiconductor material, such as polysilicon, germanium (Ge), metal oxide (e.g., zinc oxide (ZnO), indium gallium zinc oxide (IGZO), etc.). The material of the dielectric layer 210, the material of the charge storage layer 212, the material of the dielectric layer 214, and the material of the channel layer 216 may each be formed by an acceptable deposition process such as CVD, PVD, ALD, PECVD, or the like. The material of the channel layer 216 may be a doped semiconductor material or an undoped semiconductor material.

Thereafter, an acceptable etch-back process may be performed on the material of the channel layer 216, the material of the dielectric layer 214, the material of the charge storage layer 212, and the material of the dielectric layer 210, thereby forming the channel layer 216, the dielectric layer 214, the charge storage layer 212, and the dielectric layer 210 and exposing a portion of the substrate 100. The dielectric layer 210, the charge storage layer 212, the dielectric layer 214, the channel layer 216, and the dielectric pillar 218 may penetrate through the dielectric layers 204 and the sacrificial layers 206. The charge storage layer 212 is disposed between the multi-layer stack 202 and the channel layer 216. The dielectric layer 210 is disposed between the multi-layer stack 202 and the charge storage layer 212. The dielectric layer 210 may be used as a blocking layer. The dielectric layer 214 is disposed between the charge storage layer 212 and the channel layer 216. The dielectric layer 214 may be used as a tunneling layer. In some embodiments, the dielectric layer 210, the charge storage layer 212, the dielectric layer 214, and the channel layer 216 may each have an annular pillar structure.

After forming the dielectric layer 210, the charge storage layer 212, the dielectric layer 214, and the channel layer 216, a material of a dielectric pillar 218 is formed in the opening 208. The material of a dielectric pillar 218 may include a dielectric material such as oxide (e.g. silicon oxide). The material of the dielectric pillar 218 may be formed by an acceptable deposition process such as CVD, PVD, ALD, PECVD, or the like. Thereafter, a removal process is performed to remove the material of the dielectric pillar 218 outside the opening 208, thereby forming the dielectric pillar 218. The dielectric pillar 218 may be enclosed by the channel layer 216. In some embodiments, the removal process may be a planarization process, such as a chemical mechanical polish (CMP), an etch-back process, a combination thereof, or the like. In the resulting structure, top surfaces of the multi-layer stack 202, the dielectric layer 210, the charge storage layer 212, the dielectric layer 214, the channel layer 216, and the dielectric pillar 218 may be substantially level (e.g., within process variations).

Figure 3D:
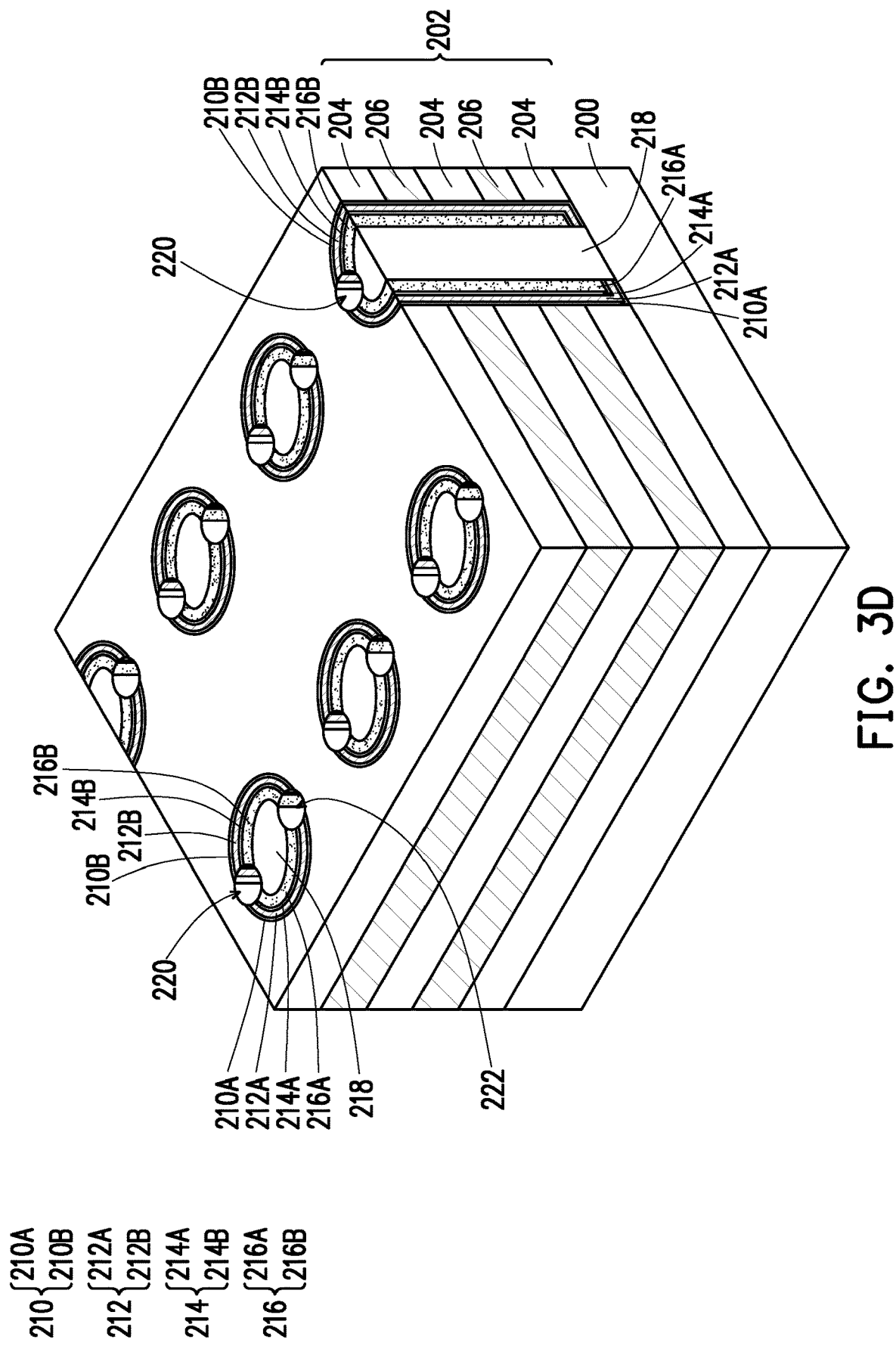

FIG. 3D is a perspective view illustrating one stage of the method of manufacturing the memory device 20 in accordance with alternative embodiments of the disclosure. Referring to FIG. 3D, a patterning process is performed on the channel layer 216 to form an opening 220 and an opening 222. In some embodiments, the opening 220 and the opening 222 may penetrate through the channel layer 216 to expose a portion of the substrate 200. The patterning process may remove a portion of the channel layer 216. The patterning process may be performed through a combination of lithography and etching processes. The etching process may be a dry etch (e.g., RIE, NBE, the like). In some embodiments, the patterning process may further remove a portion of the dielectric pillar 218 to expose a portion of the substrate 200.

In some embodiments, the opening 220 and the opening 222 divide the channel layer 216 into a channel portion 216A and a channel portion 216B that are separated from each other. That is, the channel layer 216 includes the channel portion 216A and the channel portion 216B separated from each other. Thereby, 2 bits/cell storage and higher cell density can be achieved.

In some embodiments, the patterning process may be further performed on the dielectric layer 214, and the opening 220 and the opening 222 may further divide the dielectric layer 214 into a dielectric portion 214A and a dielectric portion 214B. In some embodiments, the opening 220 and the opening 222 may penetrate through the dielectric layer 214 to expose a portion of the substrate 200. The dielectric layer 214 may include the dielectric portion 214A and the dielectric portion 214B separated from each other. In alternative embodiments, the patterning process may not be performed on the dielectric layer 214, and the opening 220 and the opening 222 may not divide the dielectric layer 214 into two portions.

In some embodiments, the patterning process may be further performed on the charge storage layer 212, and the opening 220 and the opening 222 may further divide the charge storage layer 212 into a charge storage portion 212A and a charge storage portion 212B. In some embodiments, the opening 220 and the opening 222 may penetrate through the charge storage layer 212 to expose a portion of the substrate 200. The charge storage layer 212 may include the charge storage portion 212A and the charge storage 212B separated from each other. In alternative embodiments, the patterning process may not be performed on the charge storage layer 212, and the opening 220 and the opening 222 may not divide the charge storage layer 212 into two portions.

In some embodiments, the patterning process may be further performed on the dielectric layer 210, and the opening 220 and the opening 222 may further divide the dielectric layer 210 into a dielectric portion 210A and a dielectric portion 210B. In some embodiments, the opening 220 and the opening 222 may penetrate through the dielectric layer 210 to expose a portion of the substrate 200. The dielectric layer 210 may include the dielectric portion 210A and the dielectric portion 210B separated from each other. In alternative embodiments, the patterning process may not be performed on the dielectric layer 210, and the opening 220 and the opening 222 may not divide the dielectric layer 210 into two portions. In some embodiments, the patterning process may further remove a portion of the multi-layer stack 202 to expose a portion of the substrate 200.

Figure 3E:
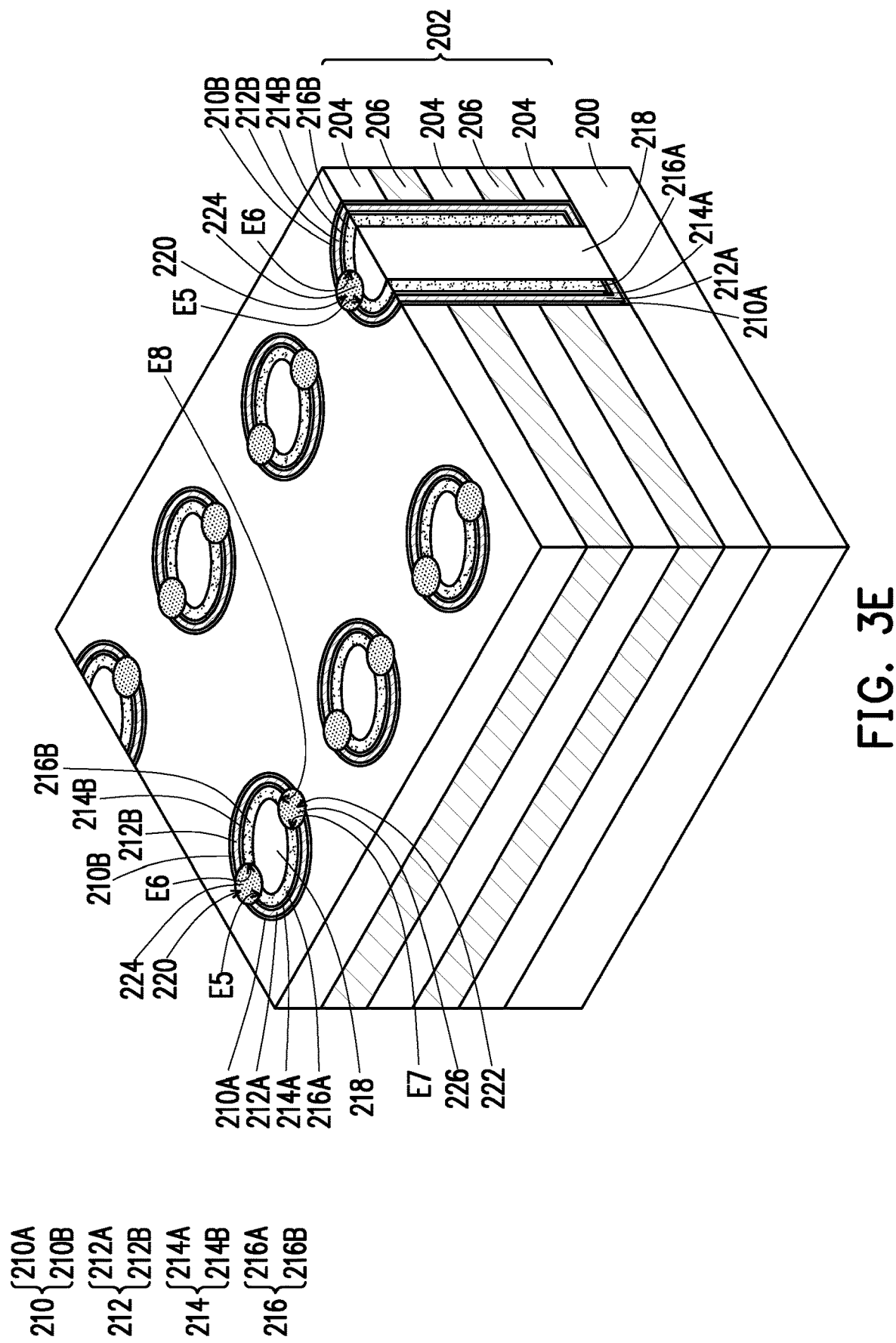
Figure 4A:
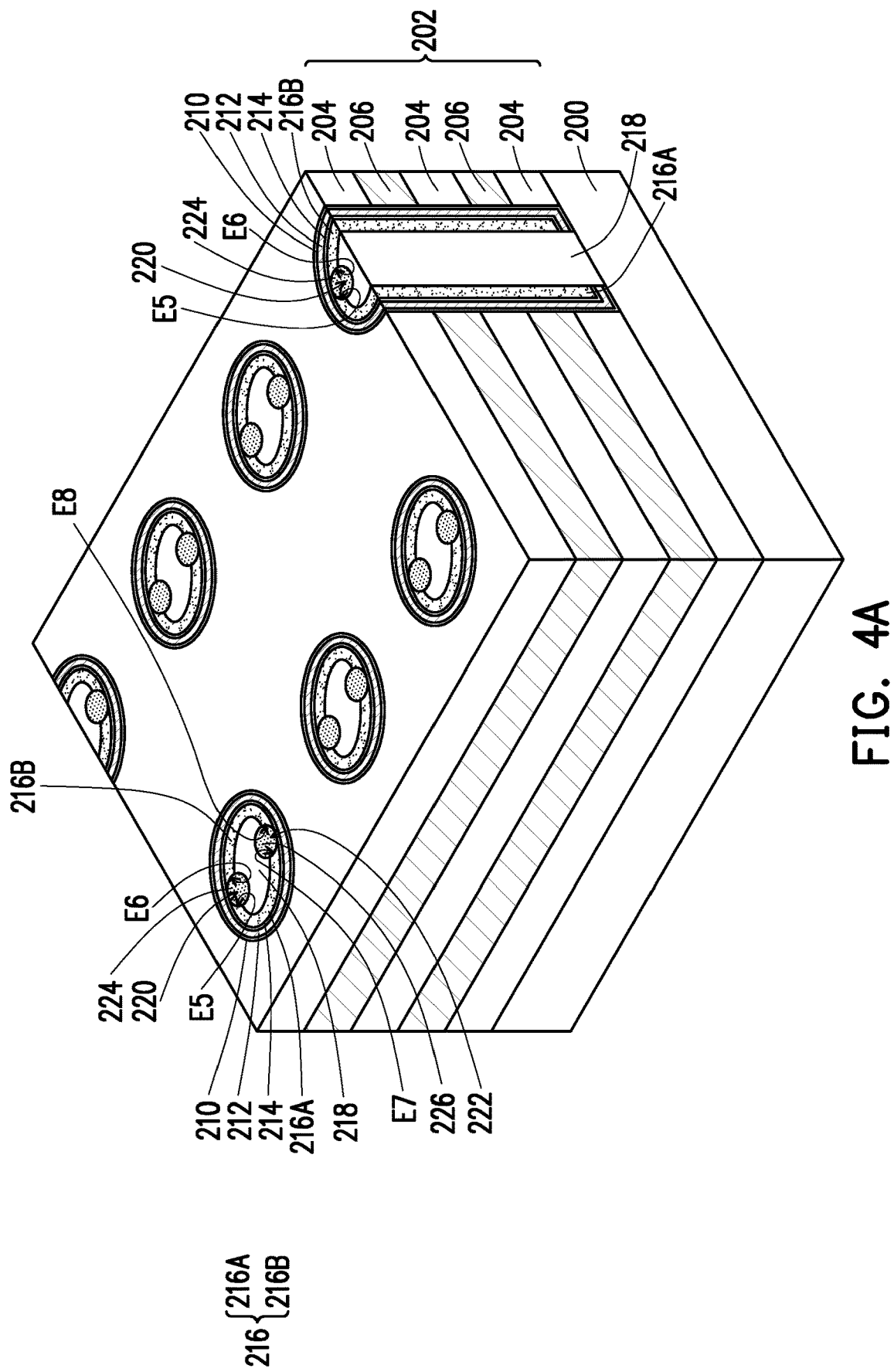
FIG. 4A to FIG. 4C are perspective views illustrating one stage of the method of manufacturing the memory device in accordance with yet alternative embodiments of the disclosure.
Figure 4B:
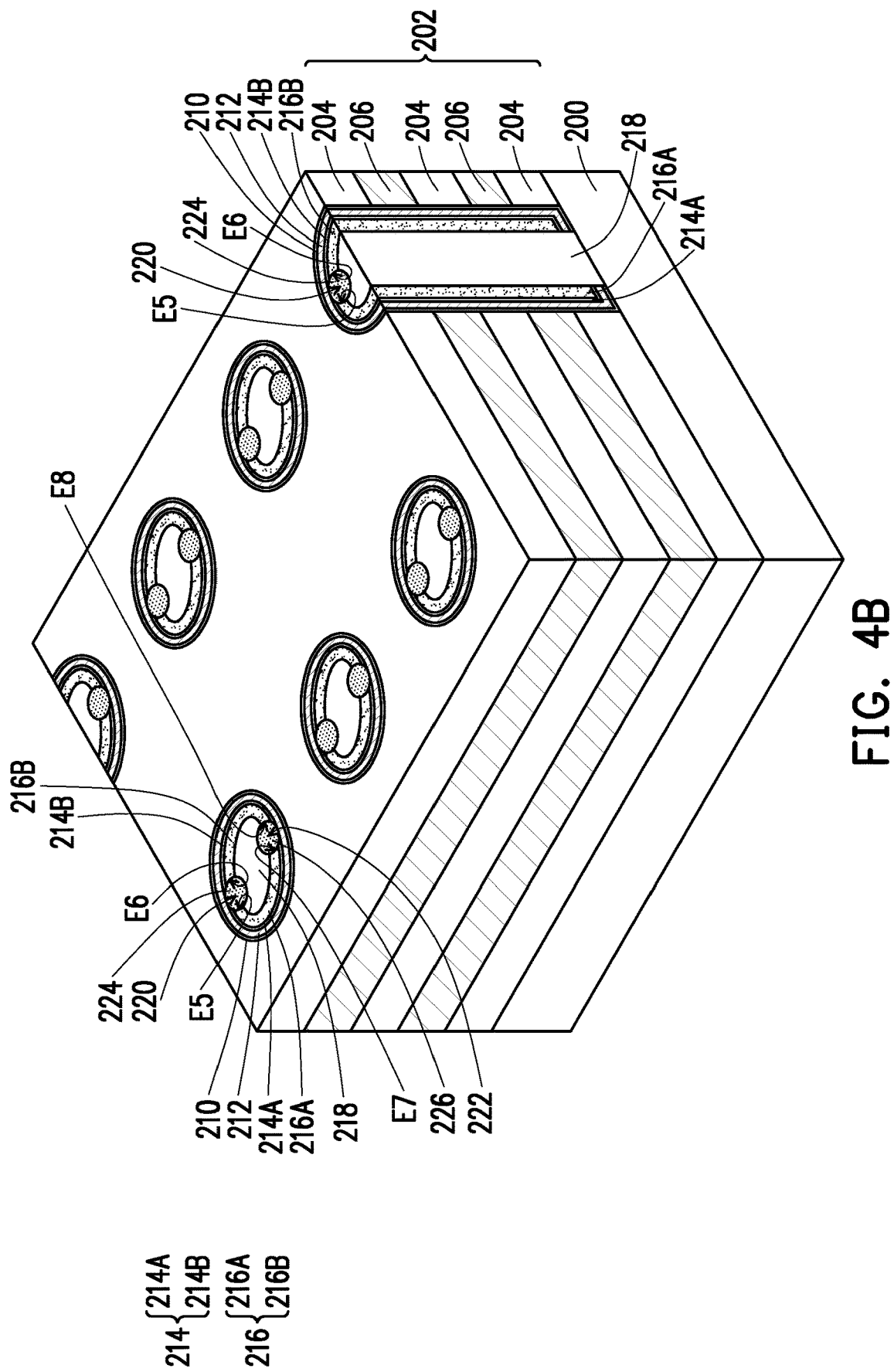
Figure 4C:
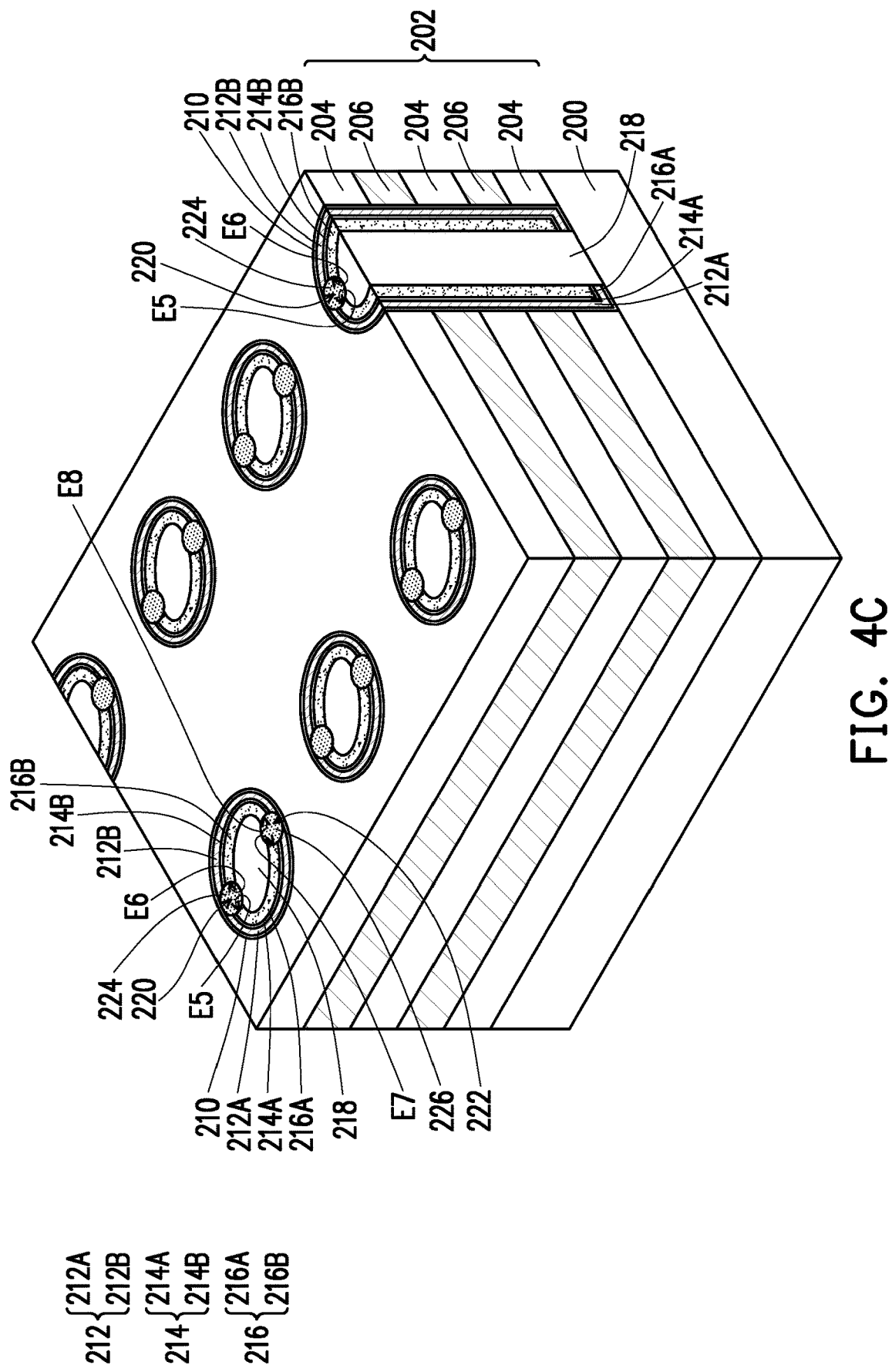

FIG. 3E is a perspective view illustrating one stage of the method of manufacturing the memory device 20 in accordance with alternative embodiments of the disclosure. FIG. 4A to FIG. 4C are perspective views illustrating one stage of the method of manufacturing the memory device 20 in accordance with yet alternative embodiments of the disclosure. Referring to FIG. 3E, the opening 220 and the opening 222 are filled with a conductive material to form a conductive pillar 224 and a conductive pillar 226 (e.g., source/drain pillars). The conductive material may include metal (e.g., tungsten, ruthenium, molybdenum, cobalt, aluminum, nickel, copper, silver, gold, alloys thereof, or the like) or doped polysilicon, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillar 224 and the conductive pillar 226 in the opening 220 and the opening 222, respectively. In the resulting structure, top surfaces of the multi-layer stack 202, the dielectric layer 210, the charge storage layer 212, the dielectric layer 214, the channel layer 216, the dielectric pillar 218, the conductive pillar 224, and the conductive pillar 226 may be substantially level (e.g., within process variations).

In some embodiments, the conductive pillar 224 and the conductive pillar 226 are adjacent to the channel layer 216. The conductive pillar 224 is disposed between one end E5 of the channel portion 216A and one end E6 of the channel portion 216B, and the conductive pillar 226 is disposed between the other end E7 of the channel portion 216A and the other end E8 of the channel portion 216B. Thereby, the channel layer 216 can be divided into two portions (e.g., the channel portion 216A and the channel portion 216B) by the conductive pillar 224 and the conductive pillar 226.

In some embodiments, as shown in FIG. 3E, FIG. 4B, and FIG. 4C, the dielectric layer 214 may be divided into two portions (e.g., the dielectric portion 214A and the dielectric portion 214B) by the conductive pillar 224 and the conductive pillar 226. In alternative embodiments, as shown in FIG. 4A, the dielectric layer 214 may not be divided into two portions by the conductive pillar 224 and the conductive pillar 226. In some embodiments, as shown in FIG. 3E and FIG. 4C, the charge storage layer 212 may be divided into two portions (e.g., the charge storage portion 212A and the charge storage portion 212B) by the conductive pillar 224 and the conductive pillar 226. In alternative embodiments, as shown in FIG. 4A and FIG. 4B, the charge storage layer 212 may not be divided into two portions by the conductive pillar 224 and the conductive pillar 226. In some embodiments, as shown in FIG. 3E, the dielectric layer 210 may be divided into two portions (e.g., the dielectric portion 210A and the dielectric portion 210B) by the conductive pillar 224 and the conductive pillar 226. In alternative embodiments, as shown in FIG. 4A to FIG. 4C, the dielectric layer 210 may not be divided into two portions by the conductive pillar 224 and the conductive pillar 226.

Figure 3F:
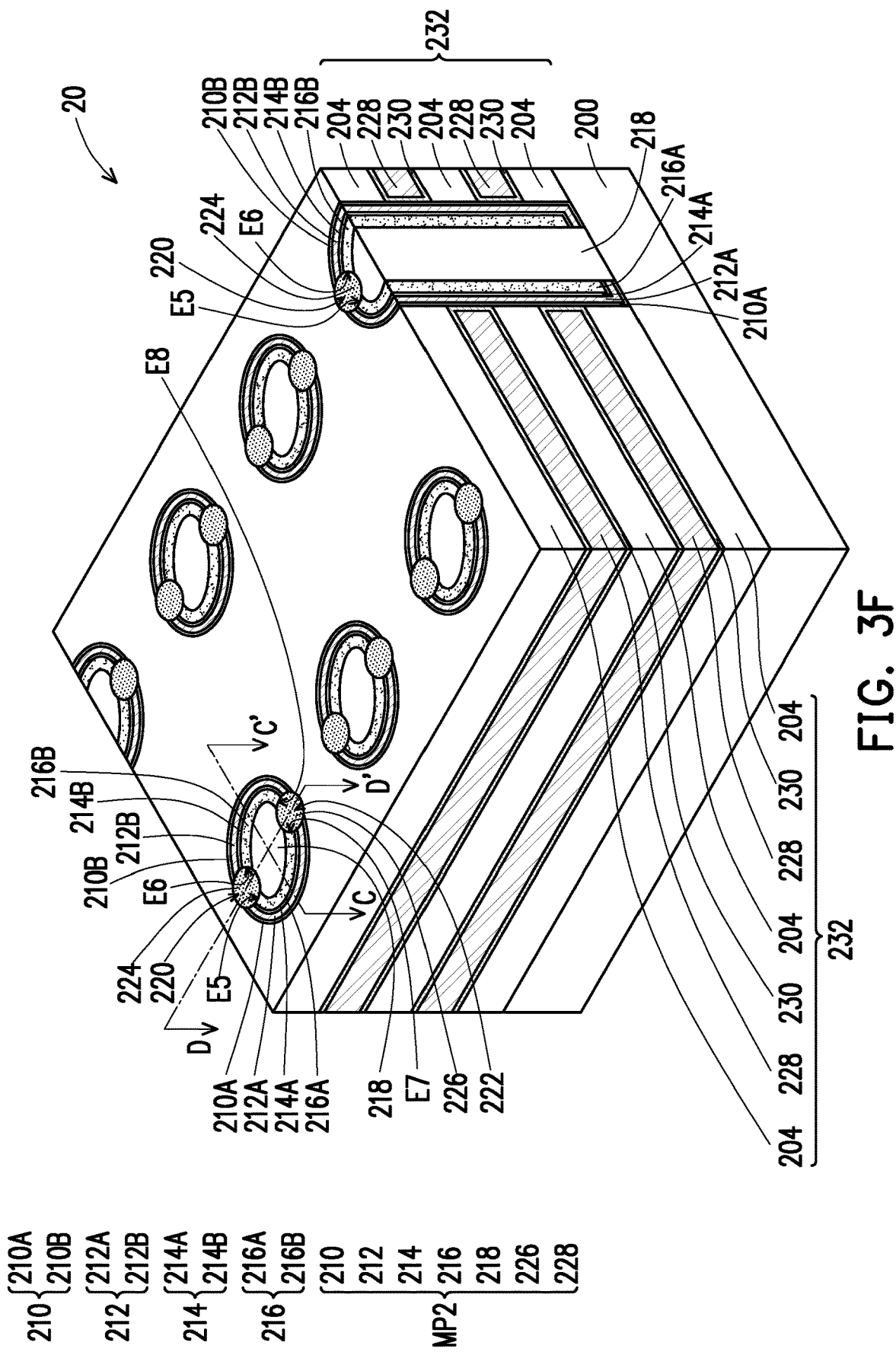

FIG. 3F is a perspective view illustrating one stage of the method of manufacturing the memory device 20 in accordance with alternative embodiments of the disclosure. FIG. 4D is a cross-sectional view illustrating the memory device 20 taken along section line C-C' in FIG. 3F. FIG. 4E is a cross-sectional view illustrating the memory device 20 taken along section line D-D' in FIG. 3F. Referring to FIG. 3F, FIG. 4D, and FIG. 4E, the sacrificial layers 206 are replaced with conductive layers 228. In some embodiments, each sacrificial layer 206 may be replaced with the conductive layer 228 and the insulating layer 230. For example, the sacrificial layers 206 are removed by an acceptable process, such as a wet etching process, a dry etching process or both. In some embodiments, the multi-layer stack 202 may be further patterned before or after removing the sacrificial layers 206. Thereafter, an insulating material and a conductive material are sequentially formed in the spaces between the adjacent dielectric layers 204 to form the insulating layers 230 and the conductive layers 228. The insulating material may include a high-k material such as hafnium oxide (HfO), aluminum oxide (AlO), zirconium oxide (ZrO), a combination thereof, or the like. The conductive material may include metal (e.g., tungsten, ruthenium, molybdenum, cobalt, aluminum, nickel, copper, silver, gold, alloys thereof, or the like) or doped polysilicon. The insulating material and the conductive material may each be formed by an acceptable deposition process such as CVD, PVD, ALD, PECVD, or the like. Thereafter, an acceptable etch-back process may be performed to remove the excess insulating material and the excess conductive material outside the spaces between the adjacent dielectric layers 204, thereby forming the insulating layer 230 and the conductive layer 228. The acceptable etch-back process includes a dry etch (e.g., RIE, NBE, the like), a wet etch, the like, or a combination thereof. In some embodiments, the etch-back process may be an anisotropic etch process.

Thereby, a multi-layer stack 232 may be formed on the substrate 200. In some embodiments, the multi-layer stack 232 is disposed on the substrate 200 and includes the conductive layers 228 and the dielectric layers 204 stacked alternately. The conductive layers 228 may be located aside the channel portion 216A and the channel portion 216B. In some embodiments, the multi-layer stack 232 may further include the insulating layers 230 disposed between the conductive layers 228 and the dielectric layer 210 and between the conductive layers 228 and the dielectric layers 204. The insulating layers 230 may be located aside the channel portion 216A and the channel portion 216B. In some embodiments, the dielectric layer 210, the charge storage layer 212, the dielectric layer 214, the channel layer 216, and the dielectric pillar 218 may penetrate through the conductive layers 228 and the dielectric layers 204. In some embodiments, the charge storage layer 212 is disposed between the conductive layers 228 and the channel layer 216.

In some embodiments, the conductive pillar 224 and the conductive pillar 226 are electrically isolated from the conductive layers 228. For example, the insulating layers 230 are disposed between the conductive pillar 224 and the conductive layers 228 and between the conductive pillar 226 and the conductive layers 228, thereby electrically isolating the conductive pillar 224 and the conductive pillar 226 from the conductive layers 228. In some embodiments, the conductive pillar 224 is electrically isolated from the conductive pillar 226 by the dielectric pillar 218.

In some embodiments, the memory device 20 may include memory pillars MP2. Each memory pillar MP2 may include the dielectric layer 210, the charge storage layer 212, the dielectric layer 214, the channel layer 216, the dielectric pillar 218, the conductive pillar 226, and the conductive pillar 228. The top view shape of the memory pillar MP2 may be a circle, a circle with protrusions (FIG. 3F), an ellipse, an ellipse with protrusions, a polygon (a square or a rectangle, etc.), a polygon with protrusions, combinations thereof, or the like.

In the memory device 20, the conductive pillar 224 is disposed between one end E5 of the channel portion 216A and one end E6 of the channel portion 216B, and the conductive pillar 226 is disposed between the other end E7 of the channel portion 216A and the other end E8 of the channel portion 216B, so that the channel layer 216 includes the channel portion 216A and the channel portion 216B separated from each other. Therefore, the memory device 20 can achieved 2 bits/cell storage and higher cell density.

Figure 5A:
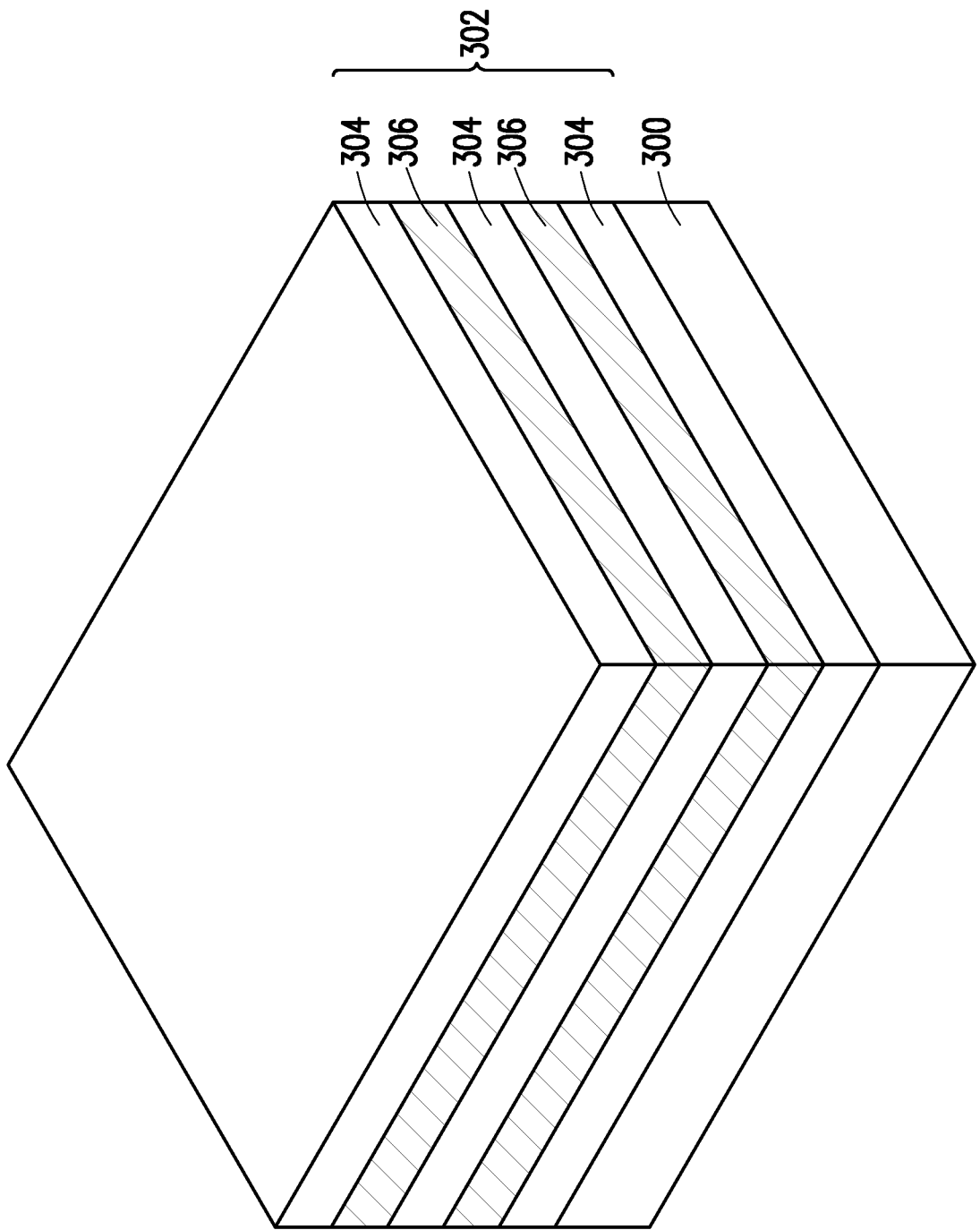
FIG. 5A to FIG. 5H are perspective views illustrating various stages of a method of manufacturing a memory device in accordance with alternative embodiments of the disclosure.

FIG. 5A is a perspective view illustrating one stage of a method of manufacturing a memory device 30 in accordance with alternative embodiments of the disclosure. Referring to FIG. 5A, a substrate 300 is provided. The detailed description of the substrate 300 may refer to the description of the substrate 100 of FIG. 1A, and the description thereof is omitted herein.

A multi-layer stack 302 is formed over the substrate 300. Although the multi-layer stack 302 is illustrated as contacting the substrate 300, any number of intermediate layers may be disposed between the substrate 300 and the multi-layer stack 302. For example, one or more interconnect layers including conductive features in insulting layers (e.g., low-k dielectric layers) may be disposed between the substrate 300 and the multi-layer stack 302. In some embodiments, the conductive features may be patterned to provide power, ground, and/or signal lines for the active devices on the substrate 300 and/or the memory device 30 (see FIG. 5H).

The multi-layer stack 302 includes alternating layers of dielectric layers 304 and sacrificial layers 306. The sacrificial layers 306 may be patterned and replaced in subsequent steps to define conductive layers 334A and conductive layers 334B (e.g., the word lines). The dielectric layers 304 may include insulating materials, such as silicon oxide, silicon nitride, silicon oxynitride, combinations thereof, or the like. The sacrificial layers 306 may include dielectric materials, such as silicon oxide, silicon nitride, silicon oxynitride, combinations thereof, or the like. The dielectric layers 304 and the sacrificial layers 306 include different materials with different etching selectivities. In some embodiments, the dielectric layers 304 include silicon oxide, and the sacrificial layers 306 include silicon nitride. Each of the dielectric layers 304 and the sacrificial layers 306 may be formed using, for example, chemical vapor deposition (CVD), atomic layer deposition (ALD), physical vapor deposition (PVD), plasma enhanced CVD (PECVD), or the like.

Although FIG. 5A illustrates a particular number of the dielectric layers 304 and the sacrificial layers 306, other embodiments may include different numbers of the dielectric layers 304 and the sacrificial layers 306. Besides, although the multi-layer stack 302 is illustrated as having dielectric layers as topmost and bottommost layers, the disclosure is not limited thereto. In some embodiments, at least one of the topmost and bottommost layers of the multi-layer stack 302 is a sacrificial layer.

Figure 5B:
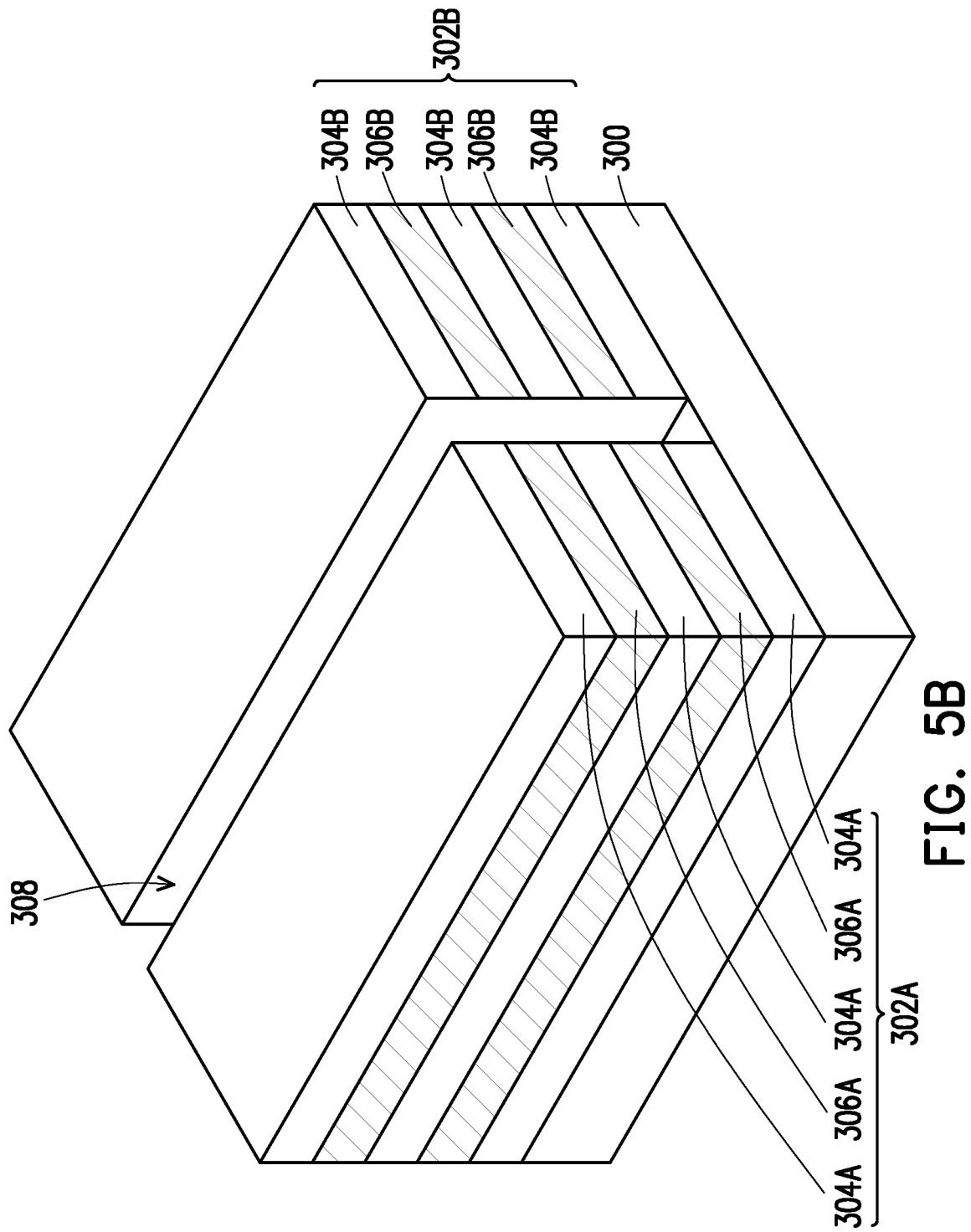

FIG. 5B is a perspective view illustrating one stage of the method of manufacturing the memory device 30 in accordance with alternative embodiments of the disclosure. Referring to FIG. 5B, the multi-layer stack 302 may be patterned to form a multi-layer stack 302A, a multi-layer stack 302B, and a trench 308 between the multi-layer stack 302A and the multi-layer stack 302B. The multi-layer stack 302A may include alternating layers of dielectric layers 304A and sacrificial layers 306A. The multi-layer stack 302B may include alternating layers of dielectric layers 304B and sacrificial layers 306B. The trench 308 extends between the multi-layer stack 302A and the multi-layer stack 302B, and the strip-shaped dielectric layers 304A, the strip-shaped sacrificial layers 306A, the strip-shaped dielectric layers 304B, and the strip-shaped sacrificial layers 306B are accordingly defined. The multi-layer stack 302 may be patterned by performing lithography and etching processes. The etching process may be a dry etch (e.g., a reactive ion etch (RIE), a neutral beam etch (NBE), the like).

Figure 5C:
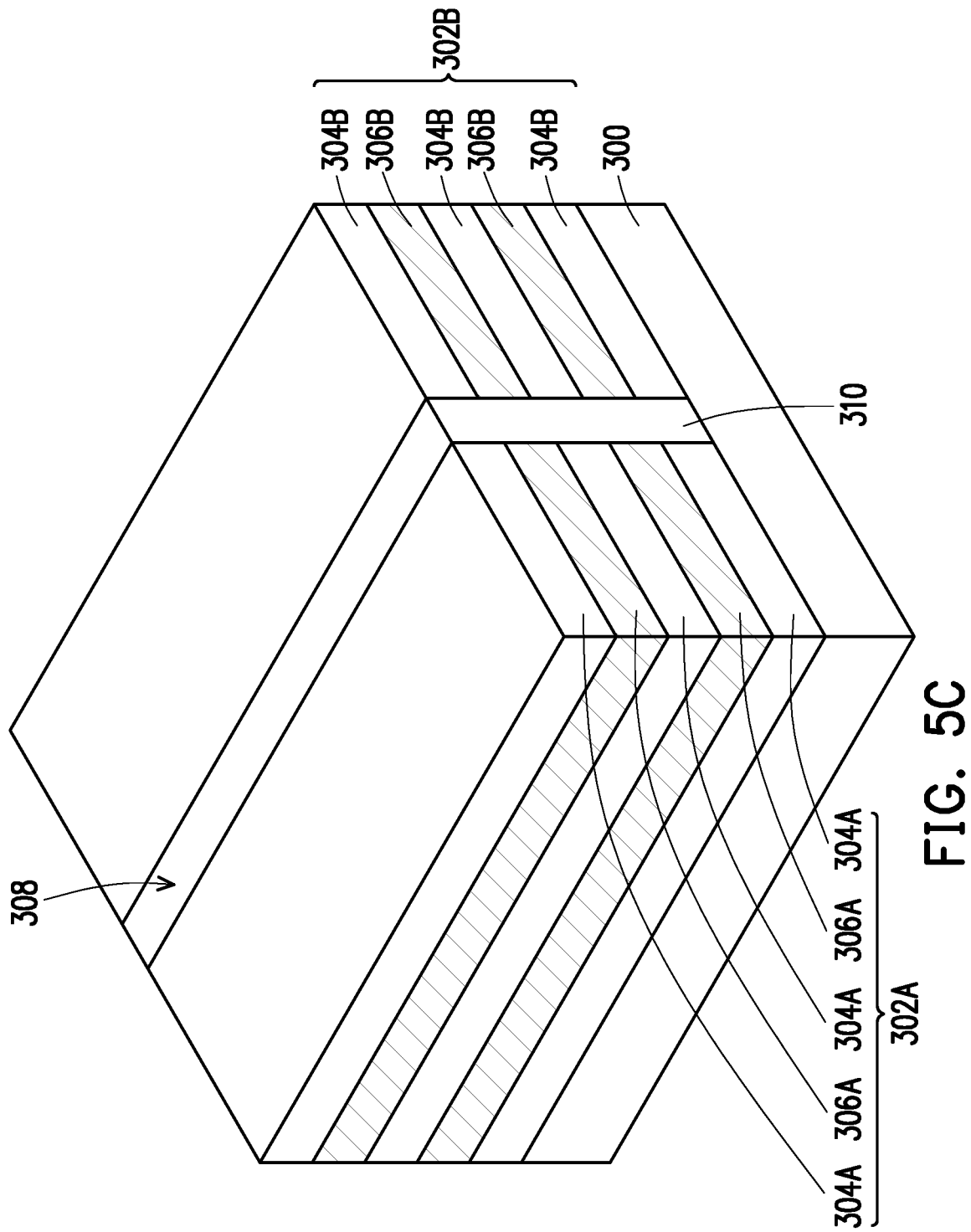

FIG. 5C is a perspective view illustrating one stage of the method of manufacturing the memory device 30 in accordance with alternative embodiments of the disclosure. Referring to FIG. 5C, the trench 308 is filled with a dielectric material to form a dielectric layer 310. The dielectric material may include insulating materials, such as silicon oxide, silicon nitride, silicon oxynitride, combinations thereof, or the like. In some embodiments, the dielectric material includes silicon oxide. The dielectric material may be formed using, for example, CVD, ALD, PVD, PECVD, or the like. After the dielectric material is deposited, a planarization (e.g., a CMP, etch back, or the like) may be performed to remove excess portions of the dielectric material, thereby forming the dielectric layer 310. The dielectric layer 310 may be disposed between the multi-layer stack 302A and the multi-layer stack 302B. The planarization process exposes the multi-layer stack 302A and the multi-layer stack 302B such that top surfaces of the multi-layer stack 302A and the multi-layer stack 302B and the dielectric layer 310 may be substantially level (e.g., within process variations) after the planarization process is completed.

Figure 5D:
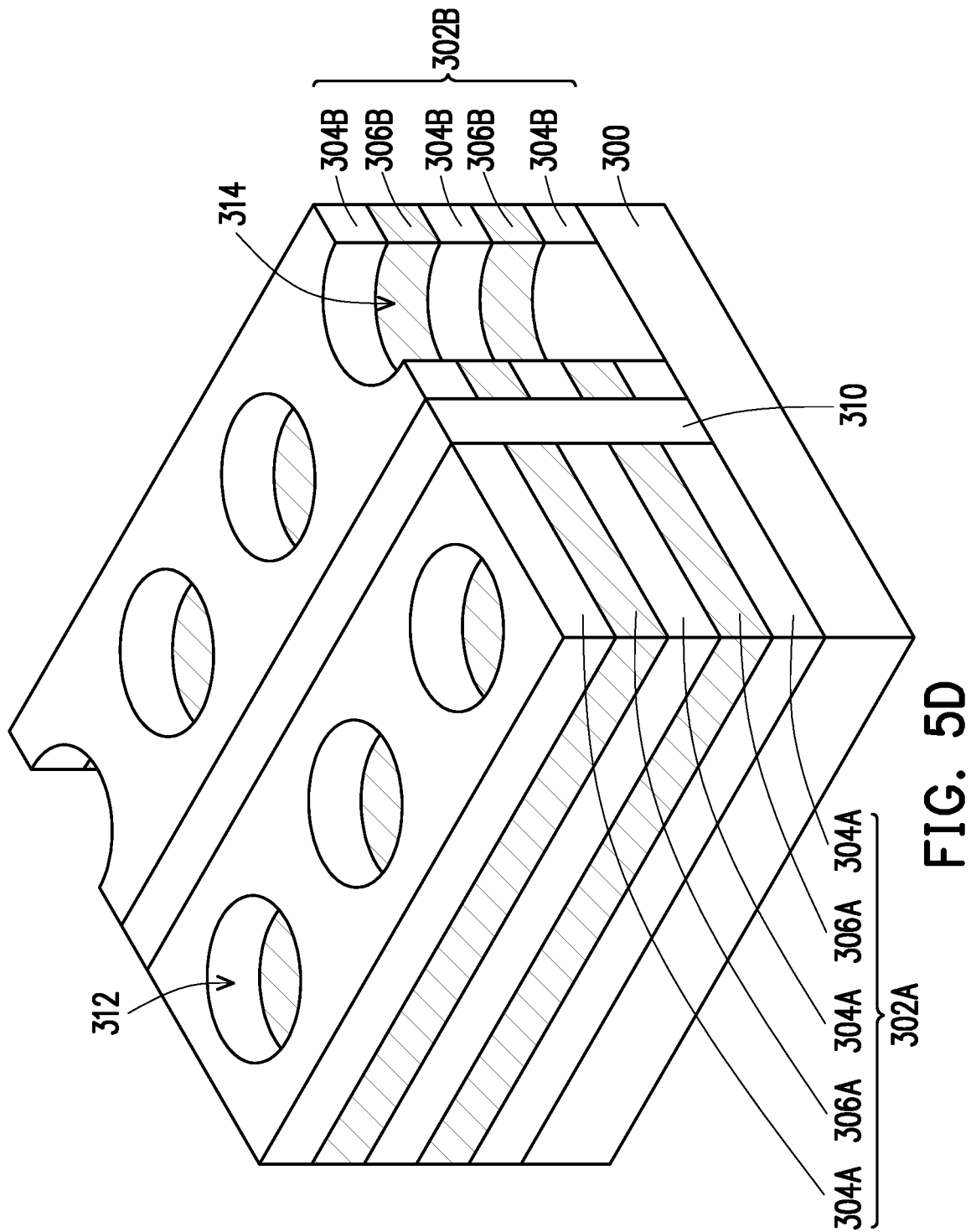

FIG. 5D is a perspective view illustrating one stage of the method of manufacturing the memory device 30 in accordance with alternative embodiments of the disclosure. Referring to FIG. 5D, a patterning process may be performed on the multi-layer stack 302A and the multi-layer stack 302B to formed an opening 312 and an opening 314. In some embodiments, the opening 312 may penetrate through the multi-layer stack 302A to expose a portion of the substrate 300, and the opening 314 may penetrate through the multi-layer stack 302B to expose a portion of the substrate 300. The patterning process may remove a portion of the multi-layer stack 302A and a portion of the multi-layer stack 302B. The patterning process may be performed through a combination of lithography and etching processes. The etching process may be a dry etch (e.g., RIE, NBE, the like).

Figure 5E:
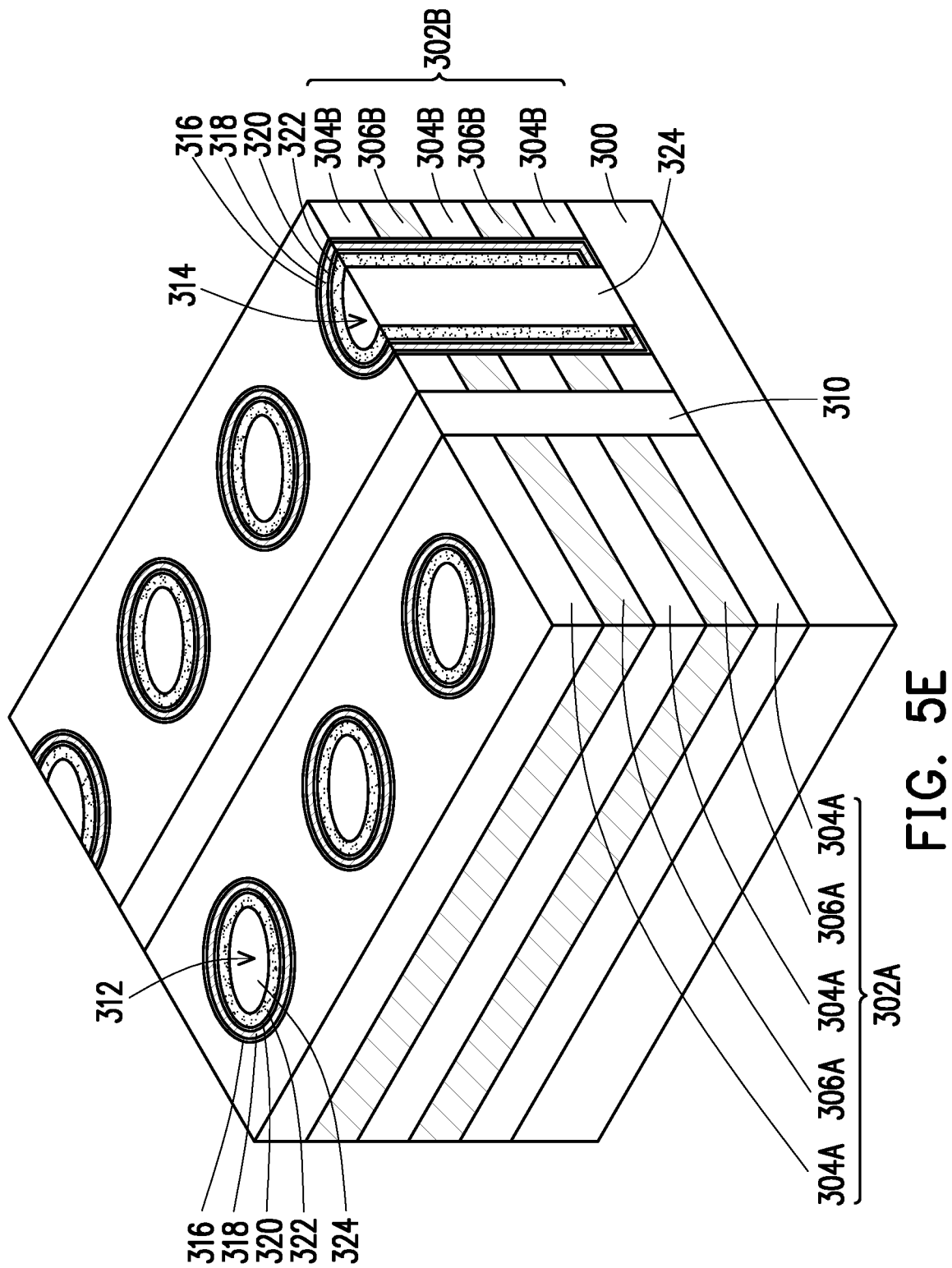

FIG. 5E is a perspective view illustrating one stage of the method of manufacturing the memory device 30 in accordance with alternative embodiments of the disclosure. Referring to FIG. 5E, a material of a dielectric layers 316, a material of a charge storage layers 318, a material of a dielectric layers 320, and a material of a channel layers 322 may be sequentially formed in the opening 312 and the opening 314. The material of the dielectric layers 316 may include HTO, SiO, AlO, a combination thereof, or the like. The material of the charge storage layers 318 may include a charge trapping material, such as SiN, SiON, AlN, HfO, ZnO, or a combination thereof. The material of the dielectric layers 320 may include AlO, SiO, a combination thereof, or the like. The material of the channel layers 322 may include a semiconductor material, such as polysilicon, germanium (Ge), metal oxide (e.g., zinc oxide (ZnO), indium gallium zinc oxide (IGZO), etc.). The material of the dielectric layers 316, the material of the charge storage layers 318, the material of the dielectric layers 320, and the material of the channel layers 322 may each be formed by an acceptable deposition process such as CVD, PVD, ALD, PECVD, or the like. The material of the channel layers 322 may be a doped semiconductor material or an undoped semiconductor material.

Thereafter, an acceptable etch-back process may be performed on the material of the channel layers 322, the material of the dielectric layers 320, the material of the charge storage layers 318, and the material of the dielectric layers 316, thereby forming the channel layers 322, the dielectric layers 320, the charge storage layers 318, and the dielectric layers 316 and exposing a portion of the substrate 300.

In some embodiments, the dielectric layer 316, the charge storage layer 318, the dielectric layer 320, the channel layer 322, and the dielectric pillar 324 in the opening 312 may penetrate through the dielectric layers 304A and the sacrificial layers 306A. In some embodiments, the dielectric layer 316, the charge storage layer 318, the dielectric layer 320, the channel layer 322, and the dielectric pillar 324 in the opening 314 may penetrate through the dielectric layers 304B and the sacrificial layers 306B.

In the multi-layer stack 302A, the charge storage layer 318 is disposed between the multi-layer stack 302A and the channel layer 322, the dielectric layer 316 is disposed between the multi-layer stack 302A and the charge storage layer 318, and the dielectric layer 320 is disposed between the charge storage layer 318 and the channel layer 322. In the multi-layer stack 302B, the charge storage layer 318 is disposed between the multi-layer stack 302B and the channel layer 322, the dielectric layer 316 is disposed between the multi-layer stack 302B and the charge storage layer 318, and the dielectric layer 320 is disposed between the charge storage layer 318 and the channel layer 322. In some embodiments, the dielectric layer 316, the charge storage layer 318, the dielectric layer 320, and the channel layer 322 may each have an annular pillar structure. The dielectric layer 316 may be used as a blocking layer. The dielectric layer 320 may be used as a tunneling layer.

After forming the dielectric layer 316, the charge storage layer 318, the dielectric layer 320, and the channel layer 322, a material of a dielectric pillars 324 is formed in the opening 312 and the opening 314. The material of the dielectric pillars 324 may include a dielectric material such as oxide (e.g. silicon oxide). The material of the dielectric pillars 324 may be formed by an acceptable deposition process such as CVD, PVD, ALD, PECVD, or the like. Thereafter, a removal process is performed to remove the material of the dielectric pillars 324 outside the opening 312 and the opening 314, thereby forming the dielectric pillars 324 in the opening 312 and the opening 314. The dielectric pillar 324 may be enclosed by the channel layer 322. In some embodiments, the removal process may be a planarization process, such as a chemical mechanical polish (CMP), an etch-back process, a combination thereof, or the like. In the resulting structure, top surfaces of the multi-layer stack 302A, the multi-layer stack 302B, the dielectric layer 316, the charge storage layer 318, the dielectric layer 320, the channel layer 322, and the dielectric pillar 324 may be substantially level (e.g., within process variations).

Figure 5F:
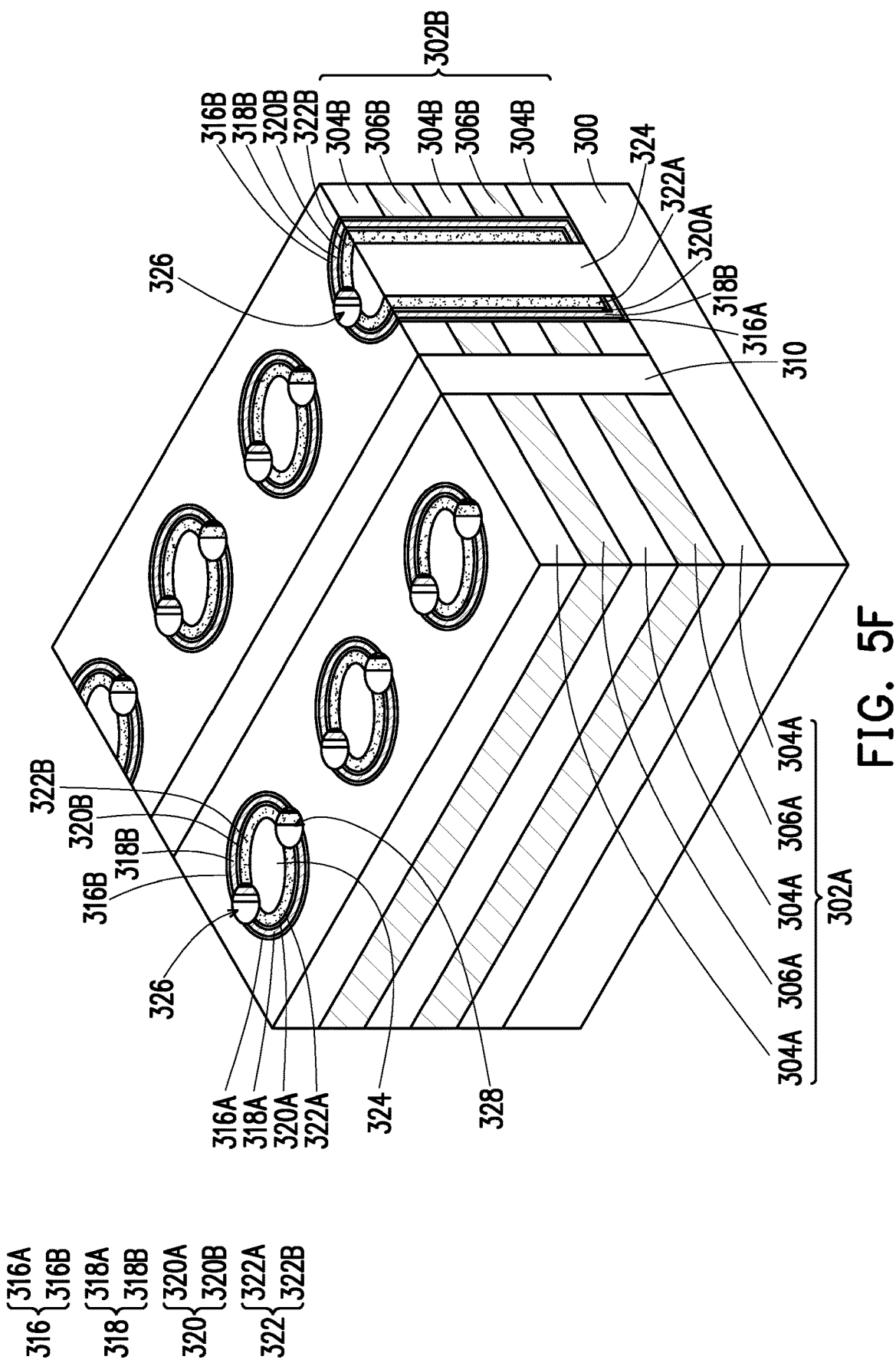

FIG. 5F is a perspective view illustrating one stage of the method of manufacturing the memory device 30 in accordance with alternative embodiments of the disclosure. Referring to FIG. 5F, a patterning process is performed on the channel layer 322 to form openings 326 and openings 328. In some embodiments, the opening 326 and the opening 328 may penetrate through the channel layer 322 to expose a portion of the substrate 300. The patterning process may remove a portion of the channel layer 322. The patterning process may be performed through a combination of lithography and etching processes. The etching process may be a dry etch (e.g., RIE, NBE, the like). In some embodiments, the patterning process may further remove a portion of the dielectric pillar 324 to expose a portion of the substrate 300.

In some embodiments, the opening 326 and the opening 328 divide the channel layer 322 into a channel portion 322A and a channel portion 322B that are separated from each other. That is, the channel layer 322 includes the channel portion 322A and the channel portion 322B separated from each other. Thereby, 2 bits/cell storage and higher cell density can be achieved.

In some embodiments, the patterning process may be further performed on the dielectric layer 320, and the opening 326 and the opening 328 may further divide the dielectric layer 320 into a dielectric portion 320A and a dielectric portion 320B. In some embodiments, the opening 326 and the opening 328 may penetrate through the dielectric layer 320 to expose a portion of the substrate 300. The dielectric layer 320 may include the dielectric portion 320A and the dielectric portion 320B separated from each other. In alternative embodiments, the patterning process may not be performed on the dielectric layer 320, and the opening 326 and the opening 328 may not divide the dielectric layer 320 into two portions.

In some embodiments, the patterning process may be further performed on the charge storage layer 318, and the opening 326 and the opening 328 may further divide the charge storage layer 318 into a charge storage portion 318A and a charge storage portion 318B. In some embodiments, the opening 326 and the opening 328 may penetrate through the charge storage layer 318 to expose a portion of the substrate 300. The charge storage layer 318 may include charge storage portion 318A and the charge storage 318B separated from each other. In alternative embodiments, the patterning process may not be performed on the charge storage layer 318, and the opening 326 and the opening 328 may not divide the charge storage layer 318 into two portions.

In some embodiments, the patterning process may be further performed on the dielectric layer 316, and the opening 326 and the opening 328 may further divide the dielectric layer 316 into a dielectric portion 316A and a dielectric portion 316B. In some embodiments, the opening 326 and the opening 328 may penetrate through the dielectric layer 316 to expose a portion of the substrate 300. The dielectric layer 316 may include the dielectric portion 316A and the dielectric portion 316B separated from each other. In alternative embodiments, the patterning process may not be performed on the dielectric layer 316, and the opening 326 and the opening 328 may not divide the dielectric layer 316 into two portions. In some embodiments, the patterning process may further remove a portion of the multi-layer stack 302A and a portion of the multi-layer stack 302B to expose a portion of the substrate 300.

Figure 5G:
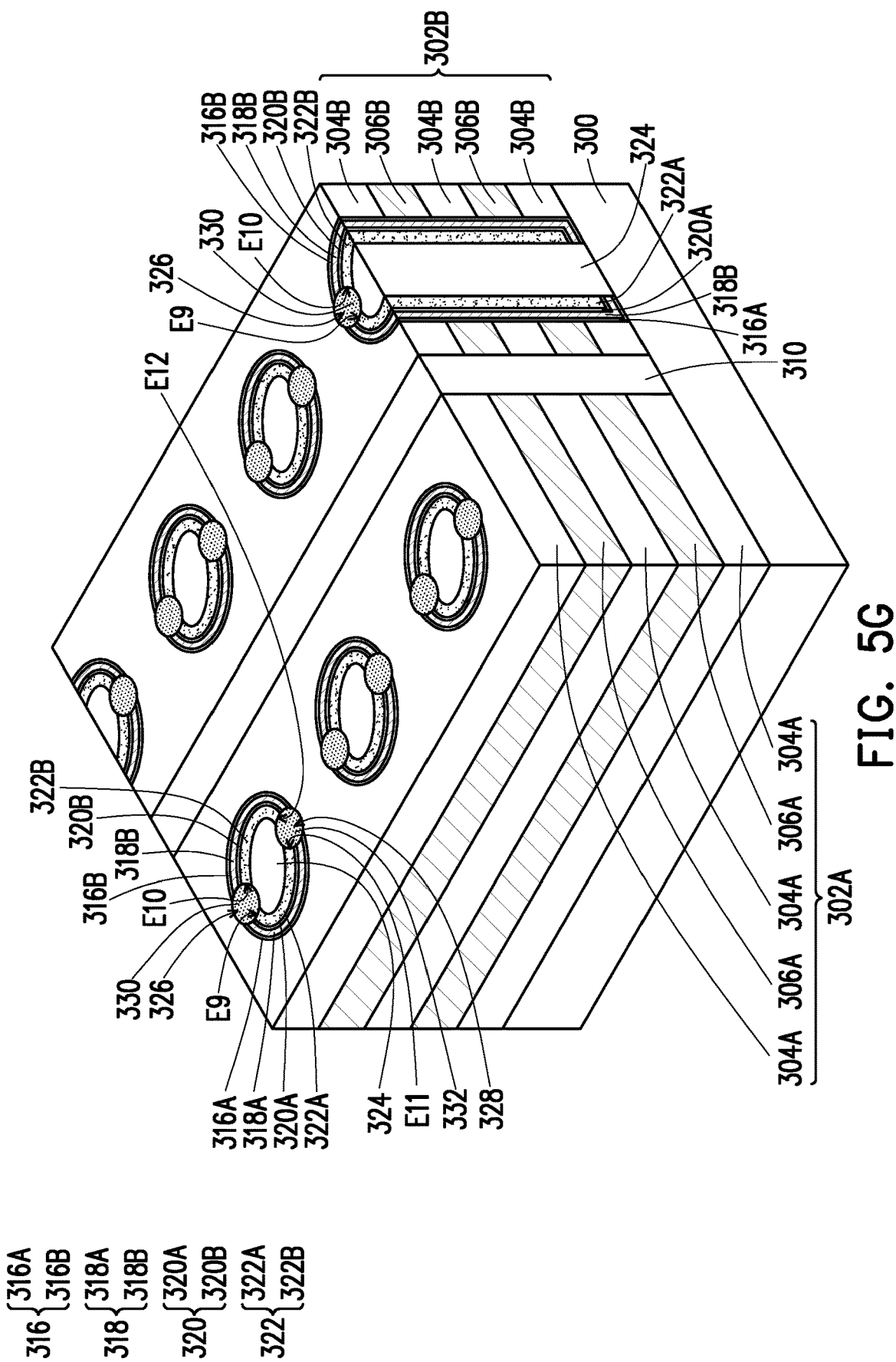
Figure 6A:
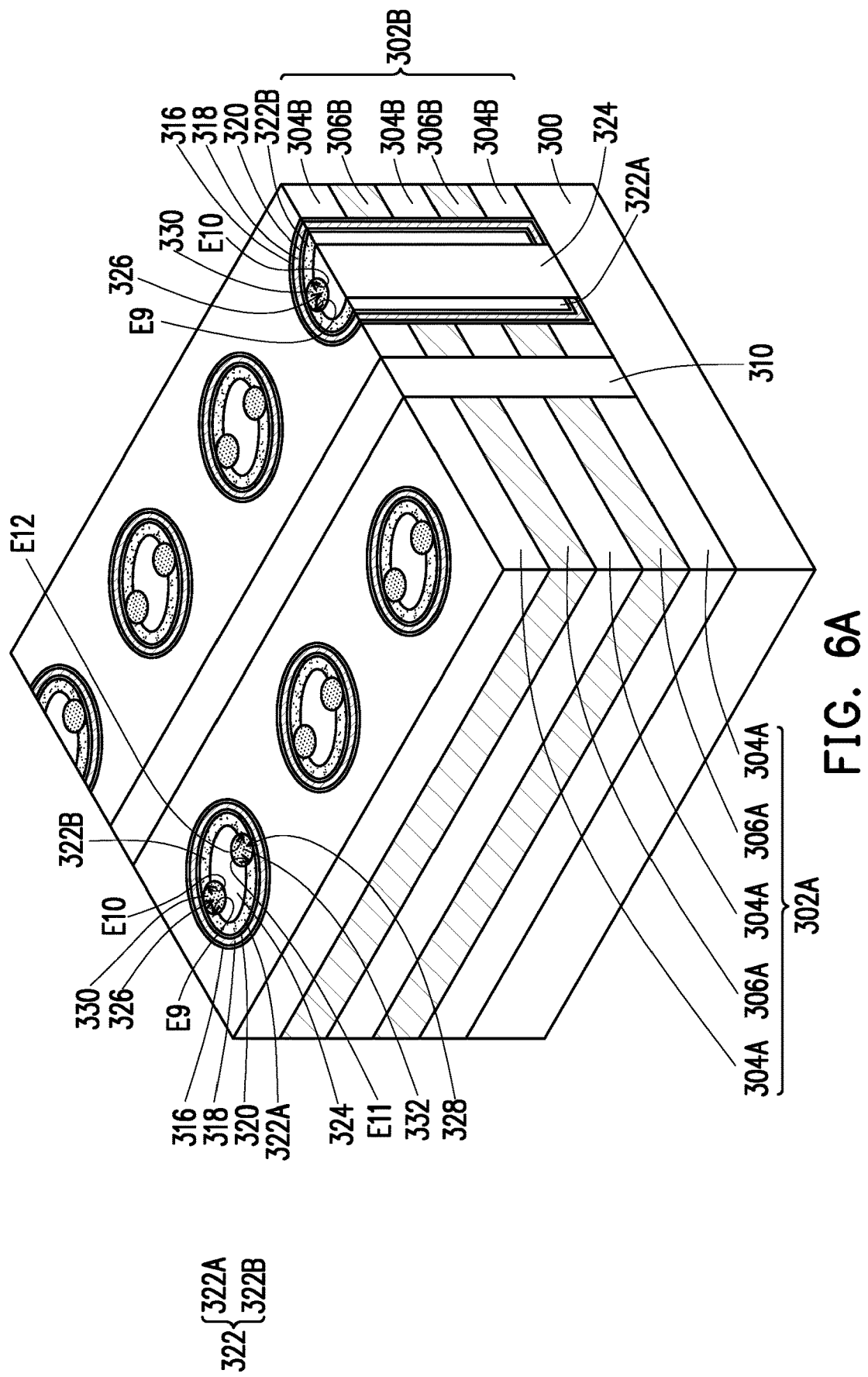
FIG. 6A to FIG. 6C are perspective views illustrating one stage of the method of manufacturing the memory device in accordance with yet alternative embodiments of the disclosure.
Figure 6B:
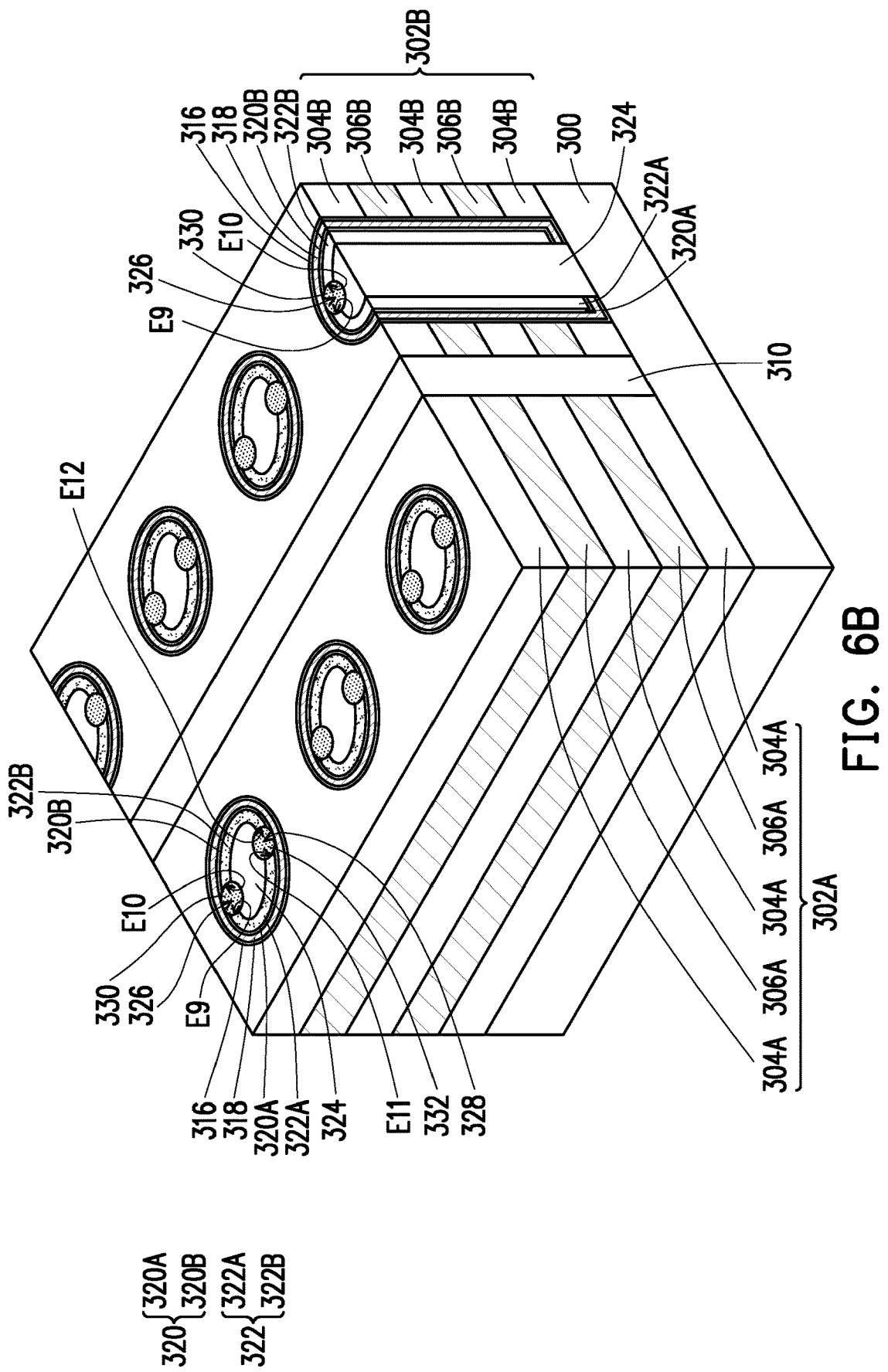
Figure 6C:
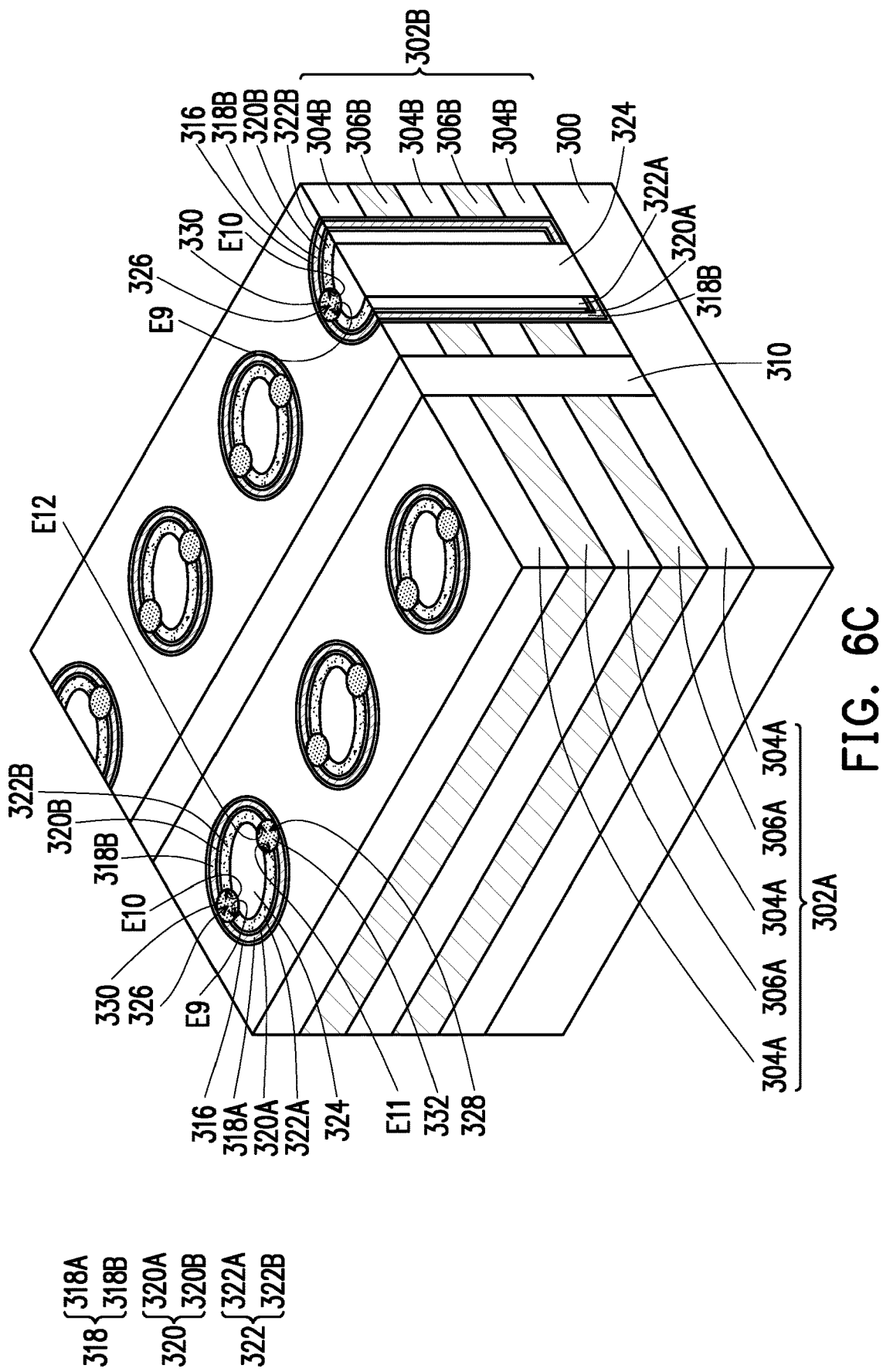

FIG. 5G is a perspective view illustrating one stage of the method of manufacturing the memory device 30 in accordance with alternative embodiments of the disclosure. FIG. 6A to FIG. 6C are perspective views illustrating one stage of the method of manufacturing the memory device 30 in accordance with yet alternative embodiments of the disclosure. Referring to FIG. 5G, the openings 326 and the openings 328 are filled with a conductive material to form conductive pillars 330 and conductive pillars 332 (e.g., source/drain pillars). The conductive material may include metal (e.g., tungsten, ruthenium, molybdenum, cobalt, aluminum, nickel, copper, silver, gold, alloys thereof, or the like) or doped polysilicon, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillar 330 and the conductive pillar 332 in the opening 326 and the opening 328, respectively. In the resulting structure, top surfaces of the multi-layer stack 302A, the multi-layer stack 302B, the dielectric layer 310, the dielectric layer 316, the charge storage layer 318, the dielectric layer 320, the channel layer 322, the dielectric pillar 324, the conductive pillar 330, and the conductive pillar 332 may be substantially level (e.g., within process variations).

In some embodiments, the conductive pillar 330 and the conductive pillar 332 are adjacent to the channel layer 322. The conductive pillar 330 is disposed between one end E9 of the channel portion 322A and one end E10 of the channel portion 322B, and the conductive pillar 332 is disposed between the other end E11 of the channel portion 322A and the other end E12 of the channel portion 322B. Thereby, the channel layer 322 can be divided into two portions (e.g., the channel portion 322A and the channel portion 322B) by the conductive pillar 330 and the conductive pillar 332.

In some embodiments, as shown in FIG. 5G, FIG. 6B, and FIG. 6C, the dielectric layer 320 may be divided into two portions (e.g., the dielectric portion 320A and the dielectric portion 320B) by the conductive pillar 330 and the conductive pillar 332. In alternative embodiments, as shown in FIG. 6A, the dielectric layer 320 may not be divided into two portions by the conductive pillar 330 and the conductive pillar 332. In some embodiments, as shown in FIG. 5G and FIG. 6C, the charge storage layer 318 may be divided into two portions (e.g., the charge storage portion 318A and the charge storage portion 318B) by the conductive pillar 330 and the conductive pillar 332. In alternative embodiments, as shown in FIG. 6A and FIG. 6B, the charge storage layer 318 may not be divided into two portions by the conductive pillar 330 and the conductive pillar 332. In some embodiments, as shown in FIG. 5G, the dielectric layer 316 may be divided into two portions (e.g., the dielectric portion 316A and the dielectric portion 316B) by the conductive pillar 330 and the conductive pillar 332. In alternative embodiments, as shown in FIG. 6A to FIG. 6C, the dielectric layer 316 may not be divided into two portions by the conductive pillar 330 and the conductive pillar 332.

Figure 5H:
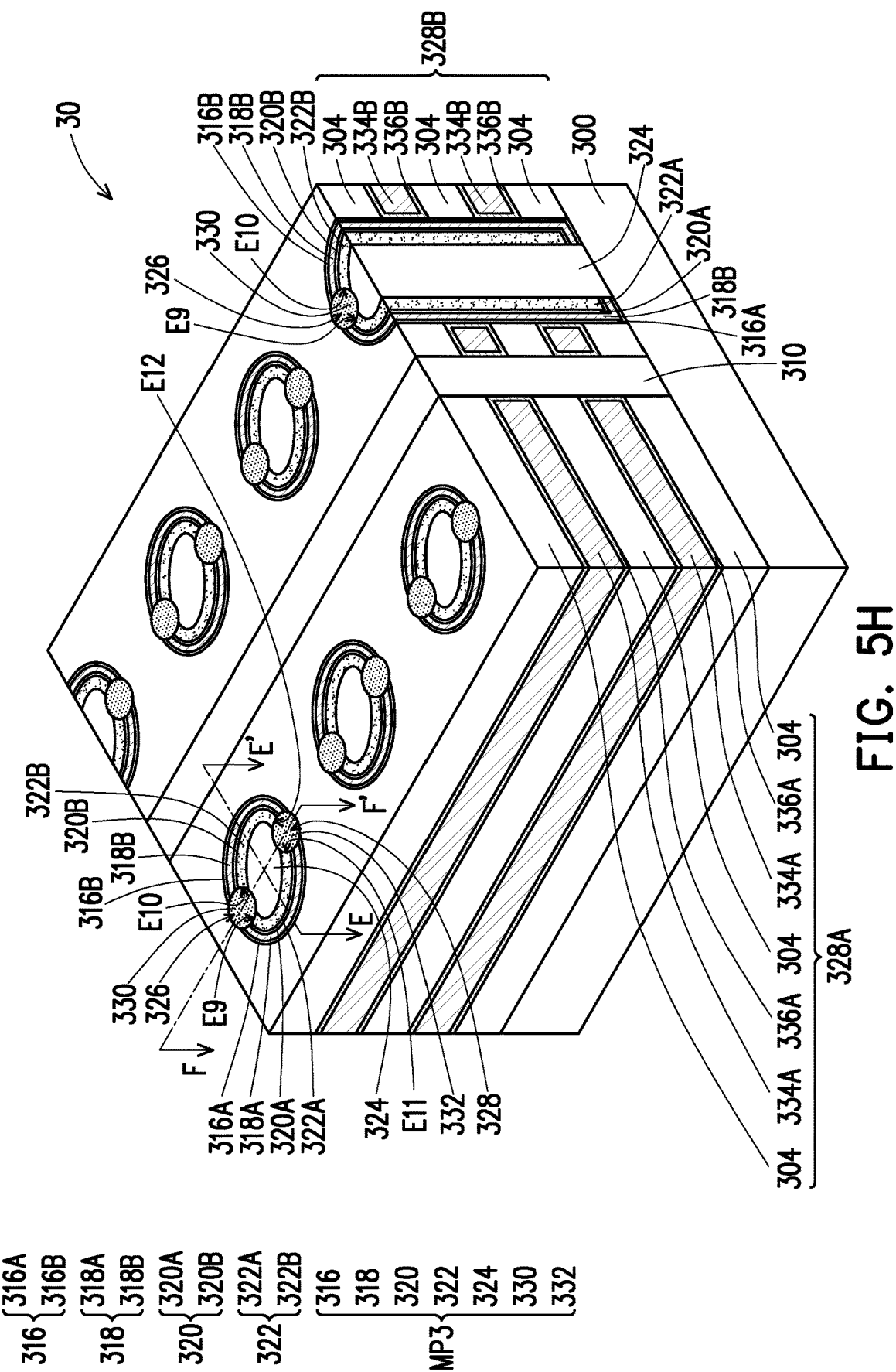

FIG. 5H is a perspective view illustrating one stage of the method of manufacturing the memory device 30 in accordance with alternative embodiments of the disclosure. FIG. 6D is a cross-sectional view illustrating the memory device 30 taken along section line E-E' in FIG. 5H. FIG. 6E is a cross-sectional view illustrating the memory device 30 taken along section line F-F' in FIG. 5H. Referring to FIG. 5H, FIG. 6D, and FIG. 6E, the sacrificial layers 306A and the sacrificial layers 306B are respectively replaced with conductive layers 334A and conductive layers 334B. In some embodiments, each sacrificial layer 306A may be replaced with the conductive layer 334A and the insulating layer 336A, and each sacrificial layer 306B may be replaced with the conductive layer 334B and the insulating layer 336B. For example, the sacrificial layers 306A and the sacrificial layers 306B are removed by an acceptable process, such as a wet etching process, a dry etching process or both. In some embodiments, the multi-layer stack 302A and the multi-layer stack 302B may be further patterned before or after removing the sacrificial layers 306A and the sacrificial layers 306B. Thereafter, an insulating material and a conductive material are sequentially formed in the spaces between the adjacent dielectric layers 304A and in the spaces between the adjacent dielectric layers 304B to form the insulating layers 336A, the insulating layers 336B, the conductive layers 334A, and the conductive layers 334B. The insulating material may include a high-k material such as hafnium oxide (HfO), aluminum oxide (AlO), zirconium oxide (ZrO), a combination thereof, or the like. The conductive material may include metal (e.g., tungsten, ruthenium, molybdenum, cobalt, aluminum, nickel, copper, silver, gold, alloys thereof, or the like) or doped polysilicon. The insulating material and the conductive material may each be formed by an acceptable deposition process such as CVD, PVD, ALD, PECVD, or the like. Thereafter, an acceptable etch-back process may be performed to remove the excess insulating material and the excess conductive material outside the spaces between the adjacent dielectric layers 304A and outside the spaces between the adjacent dielectric layers 304B, thereby forming the insulating layers 336A, the insulating layers 336B, the conductive layers 334A and the conductive layers 334B. The acceptable etch-back process includes a dry etch (e.g., RIE, NBE, the like), a wet etch, the like, or a combination thereof. In some embodiments, the etch-back process may be an anisotropic etch process.

Thereby, a multi-layer stack 328A and a multi-layer stack 328B may be formed on the substrate 300. In some embodiments, the multi-layer stack 328A is disposed on the substrate 300 and includes the conductive layers 334A and the dielectric layers 304A stacked alternately. The conductive layers 334A may be located aside the channel portion 322A and the channel portion 322B. In some embodiments, the multi-layer stack 328A may further include the insulating layers 336A disposed between the conductive layers 334A and the dielectric layer 316 and between the conductive layers 334A and the dielectric layers 304A. The insulating layers 336A may be located aside the channel portion 322A and the channel portion 322B. In some embodiments, the dielectric layer 316, the charge storage layer 318, the dielectric layer 320, the channel layer 322, and the dielectric pillar 324 may penetrate through the conductive layers 334A and the dielectric layers 304A. In some embodiments, the charge storage layer 318 is disposed between the conductive layers 334A and the channel layer 322.

In some embodiments, the multi-layer stack 328B is disposed on the substrate 300 and includes the conductive layers 334B and the dielectric layers 304B stacked alternately. The conductive layers 334B may be located aside the channel portion 322A and the channel portion 322B. In some embodiments, the multi-layer stack 328B may further include the insulating layers 336B disposed between the conductive layers 334B and the dielectric layer 316 and between the conductive layers 334B and the dielectric layers 304B. The insulating layers 336B may be located aside the channel portion 322A and the channel portion 322B. In some embodiments, the dielectric layer 316, the charge storage layer 318, the dielectric layer 320, the channel layer 322, and the dielectric pillar 324 may penetrate through the conductive layers 334B and the dielectric layers 304B. In some embodiments, the charge storage layer 318 is disposed between the conductive layers 334B and the channel layer 322.

In some embodiments, the conductive pillar 330 and the conductive pillar 332 are electrically isolated from the conductive layers 334A. For example, the insulating layers 336A are disposed between the conductive pillar 330 and the conductive layers 334A and between the conductive pillar 332 and the conductive layers 334A, thereby electrically isolating the conductive pillar 330 and the conductive pillar 332 from the conductive layers 334A. In some embodiments, the conductive pillar 330 and the conductive pillar 332 are electrically isolated from the conductive layers 334B. For example, the insulating layers 336B are disposed between the conductive pillar 330 and the conductive layers 334B and between the conductive pillar 332 and the conductive layers 334B, thereby electrically isolating the conductive pillar 330 and the conductive pillar 332 from the conductive layers 334B. In some embodiments, the conductive pillar 330 is electrically isolated from the conductive pillar 332 by the dielectric pillar 324.

In some embodiments, the memory device 30 may include memory pillars MP3. Each memory pillar MP3 may include the dielectric layer 316, the charge storage layer 318, the dielectric layer 320, the channel layer 322, the dielectric pillar 324, the conductive pillar 330, and the conductive pillar 332. The top view shape of the memory pillar MP3 may be a circle, a circle with protrusions (FIG. 5H), an ellipse, an ellipse with protrusions, a polygon (a square or a rectangle, etc.), a polygon with protrusions, combinations thereof, or the like.

In the memory device 30, the conductive pillar 330 is disposed between one end E9 of the channel portion 322A and one end E10 of the channel portion 322B, and the conductive pillar 332 is disposed between the other end E11 of the channel portion 322A and the other end E12 of the channel portion 322B, so that the channel layer 322 includes the channel portion 322A and the channel portion 322B separated from each other. Therefore, the memory device 20 can achieved 2 bits/cell storage and higher cell density.

Figure 7A:
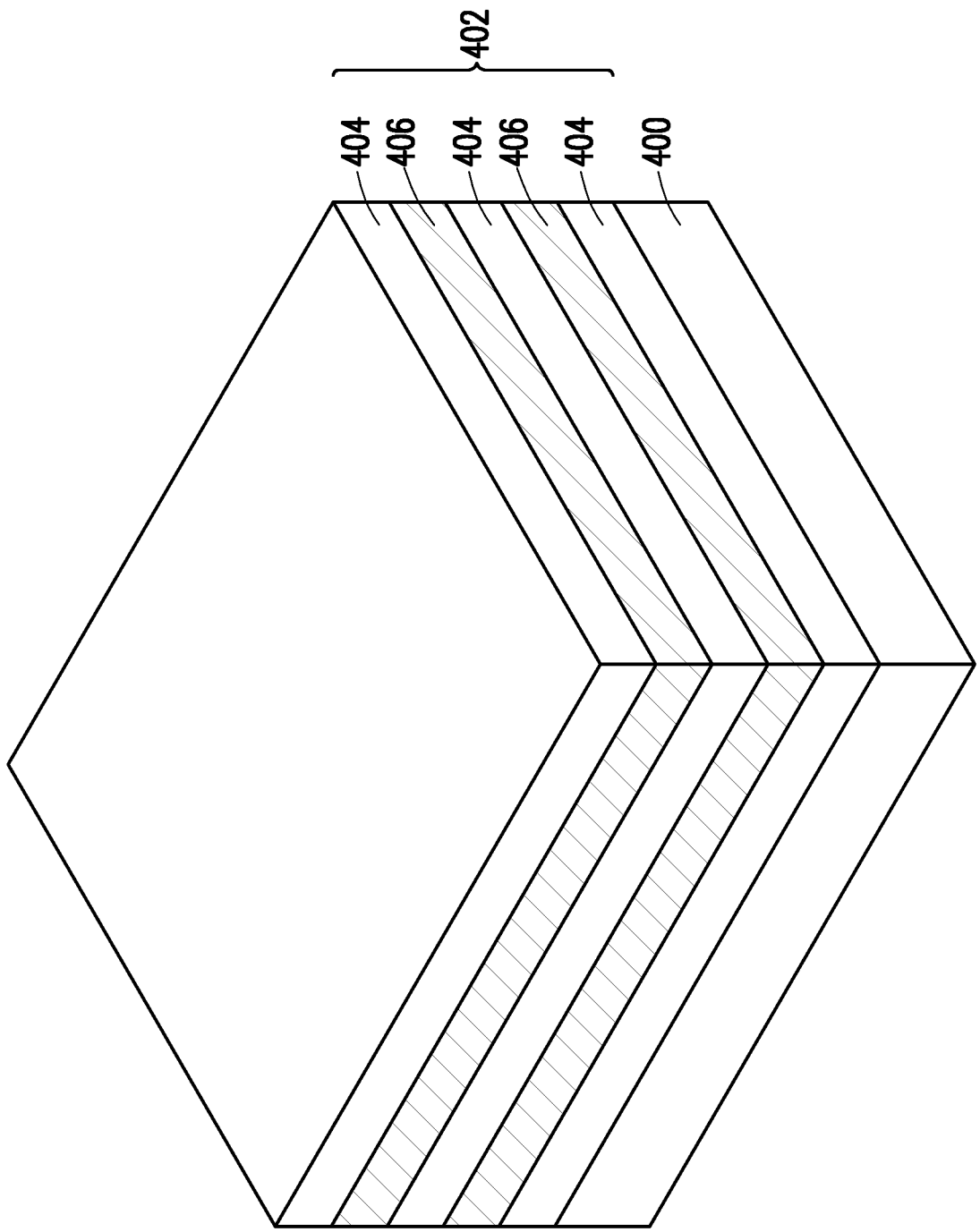
FIG. 7A to FIG. 7F are perspective views illustrating various stages of a method of manufacturing a memory device in accordance with alternative embodiments of the disclosure.

FIG. 7A is a perspective view illustrating one stage of a method of manufacturing the memory device 40 in accordance with alternative embodiments of the disclosure.

Referring to FIG. 7A, a substrate 400 is provided. The detailed description of the substrate 400 may refer to the description of the substrate 100 of FIG. 1A, and the description thereof is omitted herein.

A multi-layer stack 402 is formed over the substrate 400. Although the multi-layer stack 402 is illustrated as contacting the substrate 400, any number of intermediate layers may be disposed between the substrate 400 and the multi-layer stack 402. For example, one or more interconnect layers including conductive features in insulting layers (e.g., low-k dielectric layers) may be disposed between the substrate 400 and the multi-layer stack 402. In some embodiments, the conductive features may be patterned to provide power, ground, and/or signal lines for the active devices on the substrate 400 and/or the memory device 40 (see FIG. 7F).

The multi-layer stack 402 includes alternating layers of dielectric layers 404 and sacrificial layers 406. The sacrificial layers 406 may be patterned and replaced in subsequent steps to define conductive layers 428 (e.g., the word lines). The dielectric layers 404 may include insulating materials, such as silicon oxide, silicon nitride, silicon oxynitride, combinations thereof, or the like. The sacrificial layers 406 may include dielectric materials, such as silicon oxide, silicon nitride, silicon oxynitride, combinations thereof, or the like. The dielectric layers 404 and the sacrificial layers 406 include different materials with different etching selectivities. In some embodiments, the dielectric layers 404 include silicon oxide, and the sacrificial layers 406 include silicon nitride. Each of the dielectric layers 404 and the sacrificial layers 406 may be formed using, for example, CVD, ALD, PVD, PECVD, or the like.

Although FIG. 7A illustrates a particular number of the dielectric layers 404 and the sacrificial layers 406, other embodiments may include different numbers of the dielectric layers 404 and the sacrificial layers 406. Besides, although the multi-layer stack 402 is illustrated as having dielectric layers as topmost and bottommost layers, the disclosure is not limited thereto. In some embodiments, at least one of the topmost and bottommost layers of the multi-layer stack 402 is a sacrificial layer.

Figure 7B:
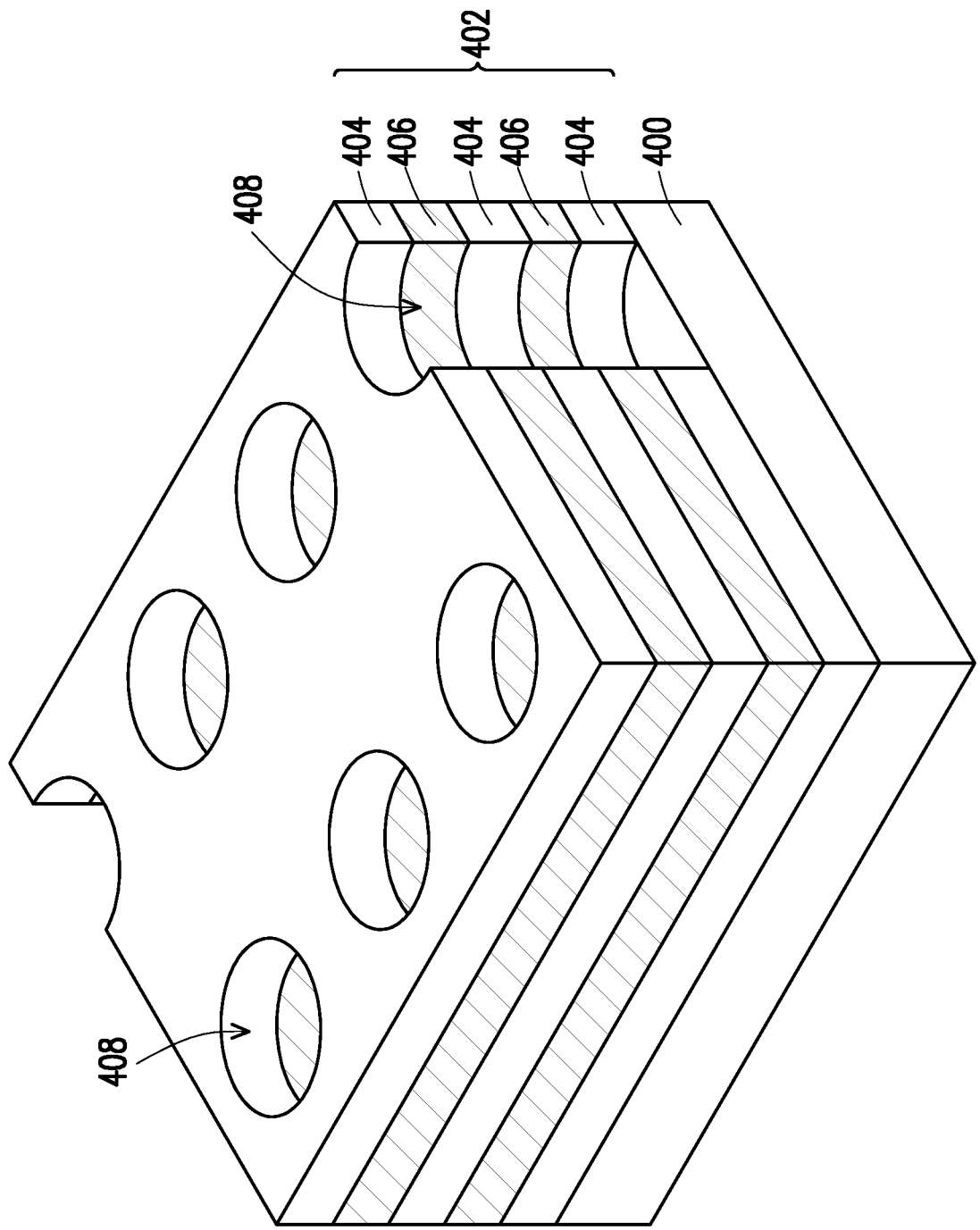

FIG. 7B is a perspective view illustrating one stage of the method of manufacturing the memory device 40 in accordance with alternative embodiments of the disclosure. Referring to FIG. 7B, a patterning process may be performed on the multi-layer stack 402 to formed an opening 408. In some embodiments, the opening 408 may penetrate through the multi-layer stack 402 to expose a portion of the substrate 400. The patterning process may remove a portion of the multi-layer stack 402. The patterning process may be performed through a combination of lithography and etching processes. The etching process may be a dry etch (e.g., RIE, NBE, the like).

Figure 7C:
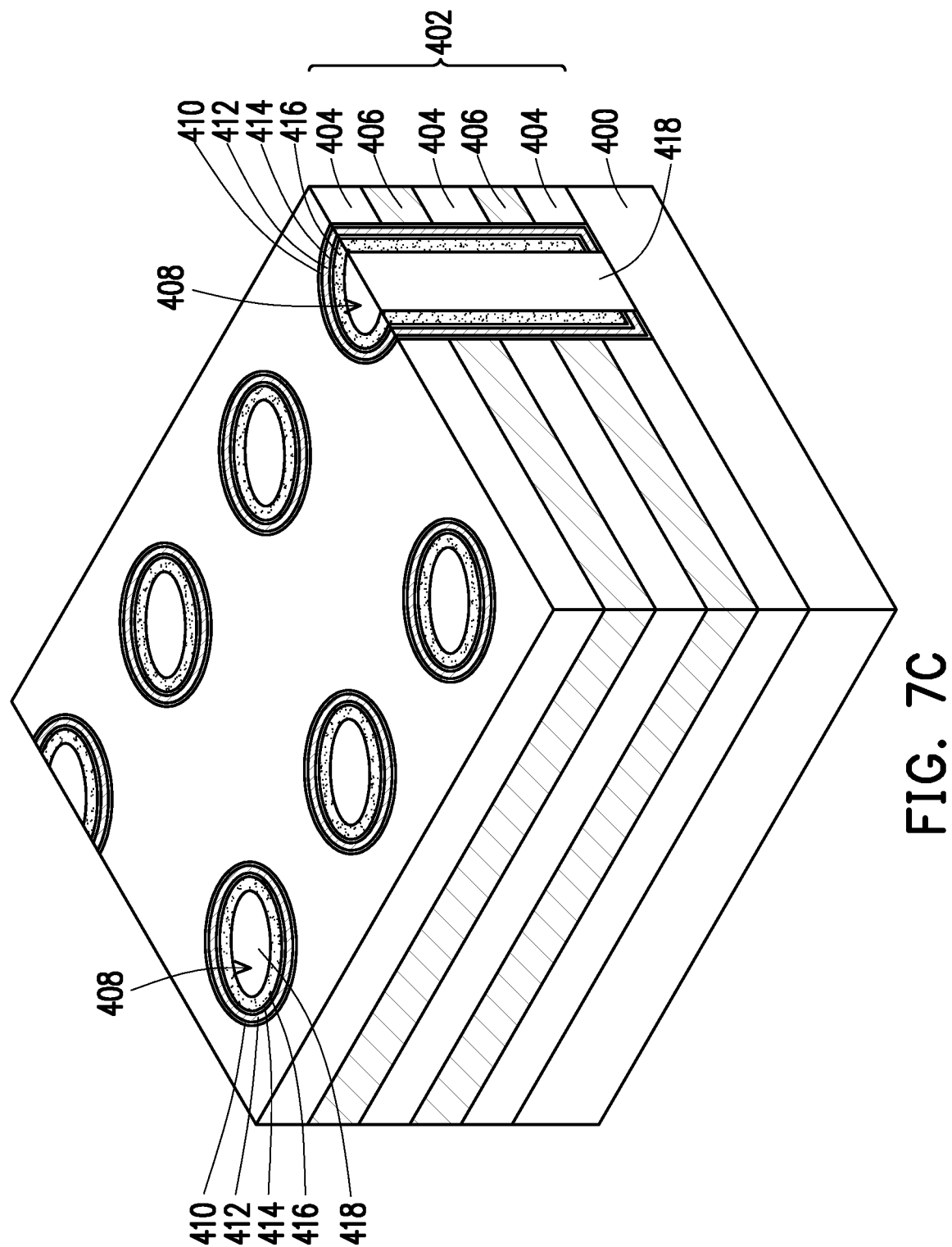

FIG. 7C is a perspective view illustrating one stage of the method of manufacturing the memory device 40 in accordance with alternative embodiments of the disclosure. Referring to FIG. 7C, a material of a dielectric layer 410, a material of a charge storage layer 412, a material of a dielectric layer 414, and a material of a channel layer 416 may be sequentially formed in the opening 408. The material of the dielectric layer 410 may include HTO, SiO, AlO, a combination thereof, or the like. The material of the charge storage layer 412 may include a charge trapping material, such as SiN, SiON, AlN, HfO, ZnO, or a combination thereof. The material of the dielectric layer 414 may include AlO, SiO, a combination thereof, or the like. The material of the channel layer 416 may include a semiconductor material, such as polysilicon, germanium (Ge), metal oxide (e.g., zinc oxide (ZnO), indium gallium zinc oxide (IGZO), etc.). The material of the dielectric layer 410, the material of the charge storage layer 412, the material of the dielectric layer 414, and the material of the channel layer 416 may each be formed by an acceptable deposition process such as CVD, PVD, ALD, PECVD, or the like. The material of the channel layer 416 may be a doped semiconductor material or an undoped semiconductor material.

Thereafter, an acceptable etch-back process may be performed on the material of the channel layer 416, the material of the dielectric layer 414, the material of the charge storage layer 412, and the material of the dielectric layer 410, thereby forming the channel layer 416, dielectric layer 414, the charge storage layer 412, and the dielectric layer 410 and exposing a portion of the substrate 400. The dielectric layer 410, the charge storage layer 412, the dielectric layer 414, the channel layer 416, and the dielectric pillar 418 may penetrate through the dielectric layers 404 and the sacrificial layers 406. The charge storage layer 412 is disposed between the multi-layer stack 402 and the channel layer 416. The dielectric layer 410 is disposed between the multi-layer stack 402 and the charge storage layer 412. The dielectric layer 410 may be used as a blocking layer. The dielectric layer 414 is disposed between the charge storage layer 412 and the channel layer 416. The dielectric layer 414 may be used as a tunneling layer. In some embodiments, the dielectric layer 410, the charge storage layer 412, the dielectric layer 414, and the channel layer 416 may each have an annular pillar structure.

After forming the dielectric layer 410, the charge storage layer 412, the dielectric layer 414, and the channel layer 416, a material of a dielectric pillar 418 is formed in the opening 408. The material of a dielectric pillar 418 may include a dielectric material such as oxide (e.g. silicon oxide). The material of the dielectric pillar 418 may be formed by an acceptable deposition process such as CVD, PVD, ALD, PECVD, or the like. Thereafter, a removal process is performed to remove the material of the dielectric pillar 418 outside the opening 408, thereby forming the dielectric pillar 418. The dielectric pillar 418 may be enclosed by the channel layer 416. In some embodiments, the removal process may be a planarization process, such as a chemical mechanical polish (CMP), an etch-back process, a combination thereof, or the like. In the resulting structure, top surfaces of the multi-layer stack 402, the dielectric layer 410, the charge storage layer 412, the dielectric layer 414, the channel layer 416, and the dielectric pillar 418 may be substantially level (e.g., within process variations).

Figure 7D:
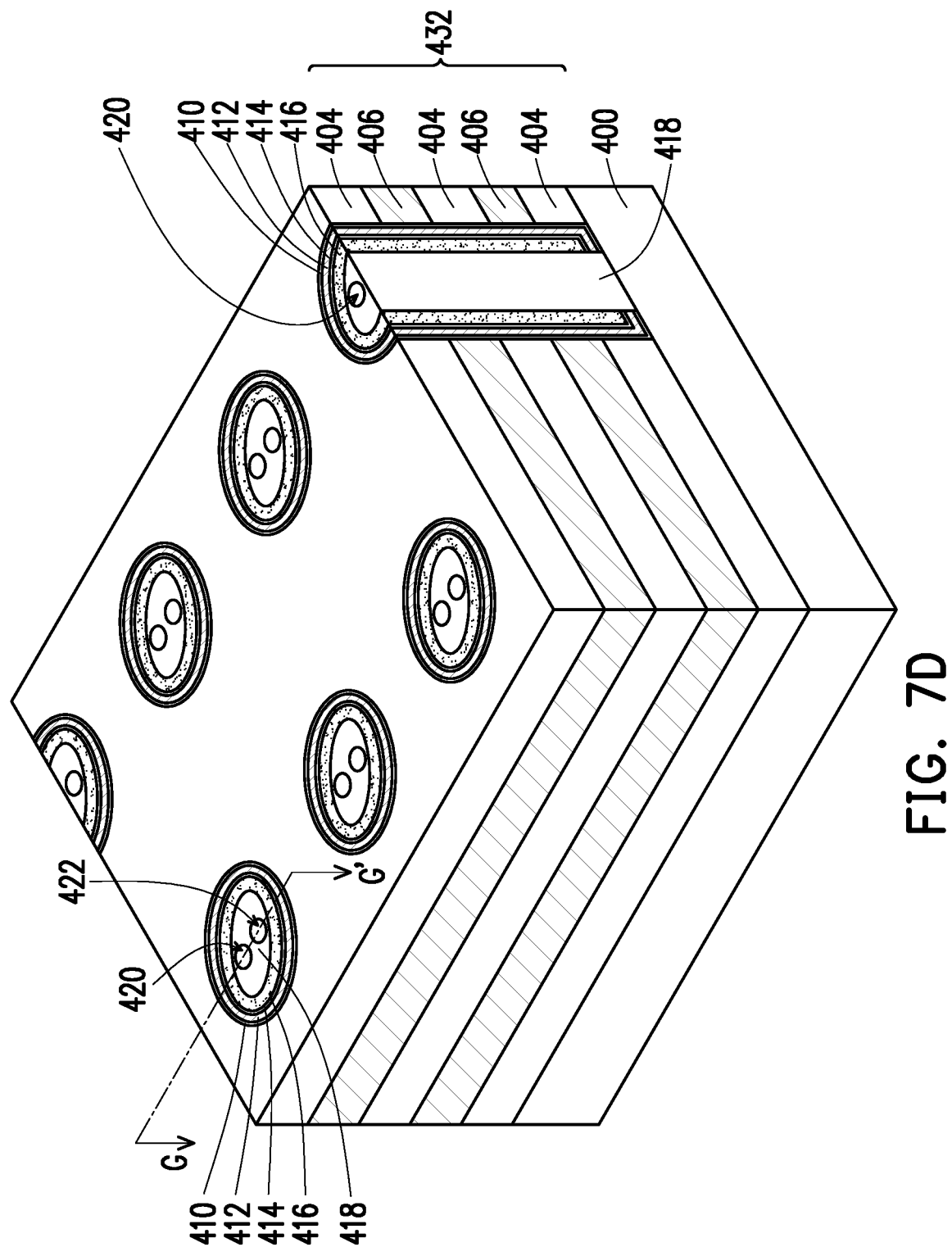

FIG. 7D is a perspective view illustrating one stage of the method of manufacturing the memory device 40 in accordance with alternative embodiments of the disclosure. Referring to FIG. 7D, a patterning process is performed on the dielectric pillar 418 to form an opening 420 and an opening 422. In some embodiments, the opening 420 and the opening 422 may penetrate through the dielectric pillar 418 to expose a portion of the substrate 400. In some embodiments, the opening 420 and the opening 422 are not in contact with the channel layer 416. In alternative embodiments, the opening 420 and the opening 422 may be in contact with the channel layer 416. The patterning process may remove a portion of the dielectric pillar 418. The patterning process may be performed through a combination of lithography and etching processes. The etching process may be a dry etch (e.g., RIE, NBE, the like).

Figure 7E:
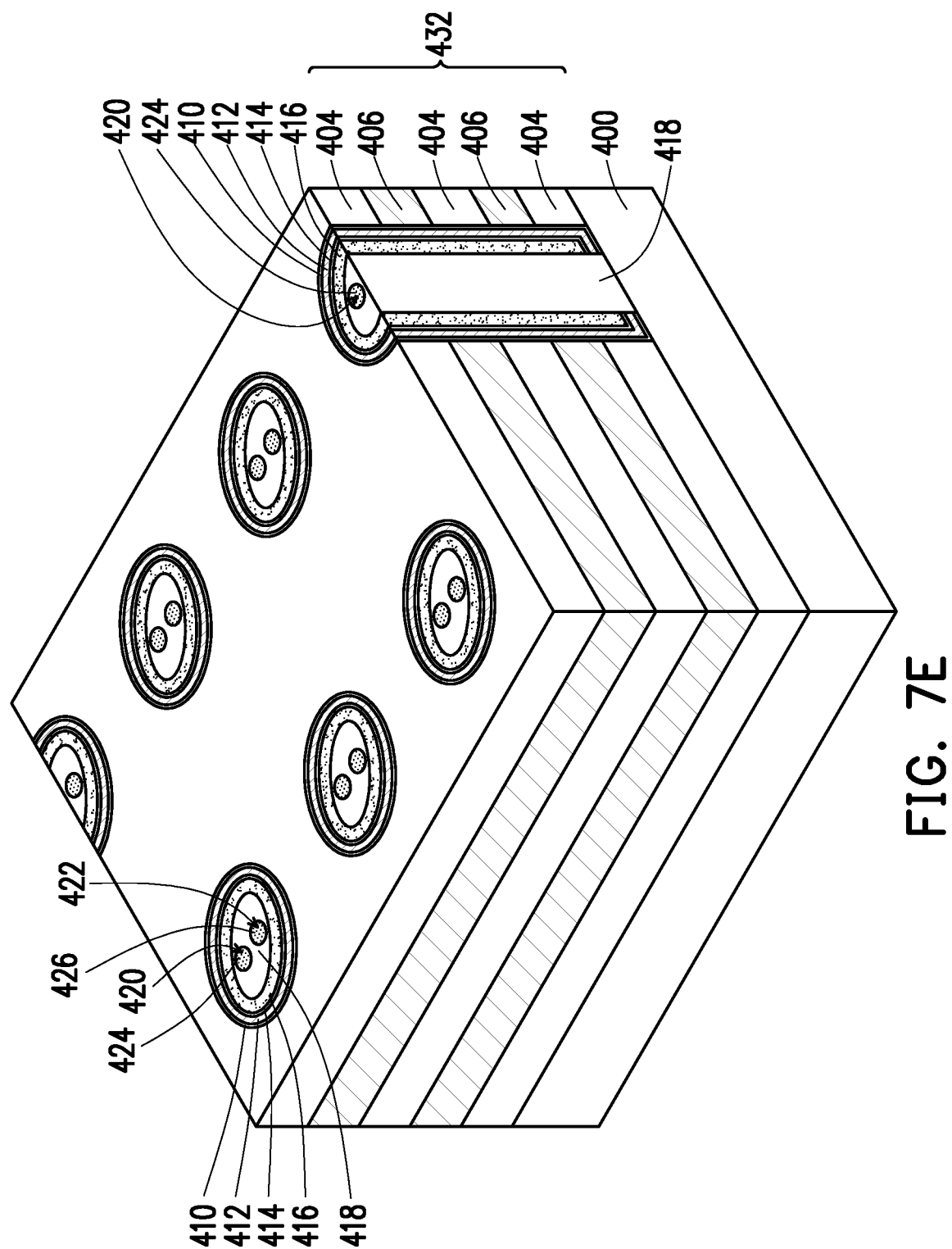
Figure 8A:
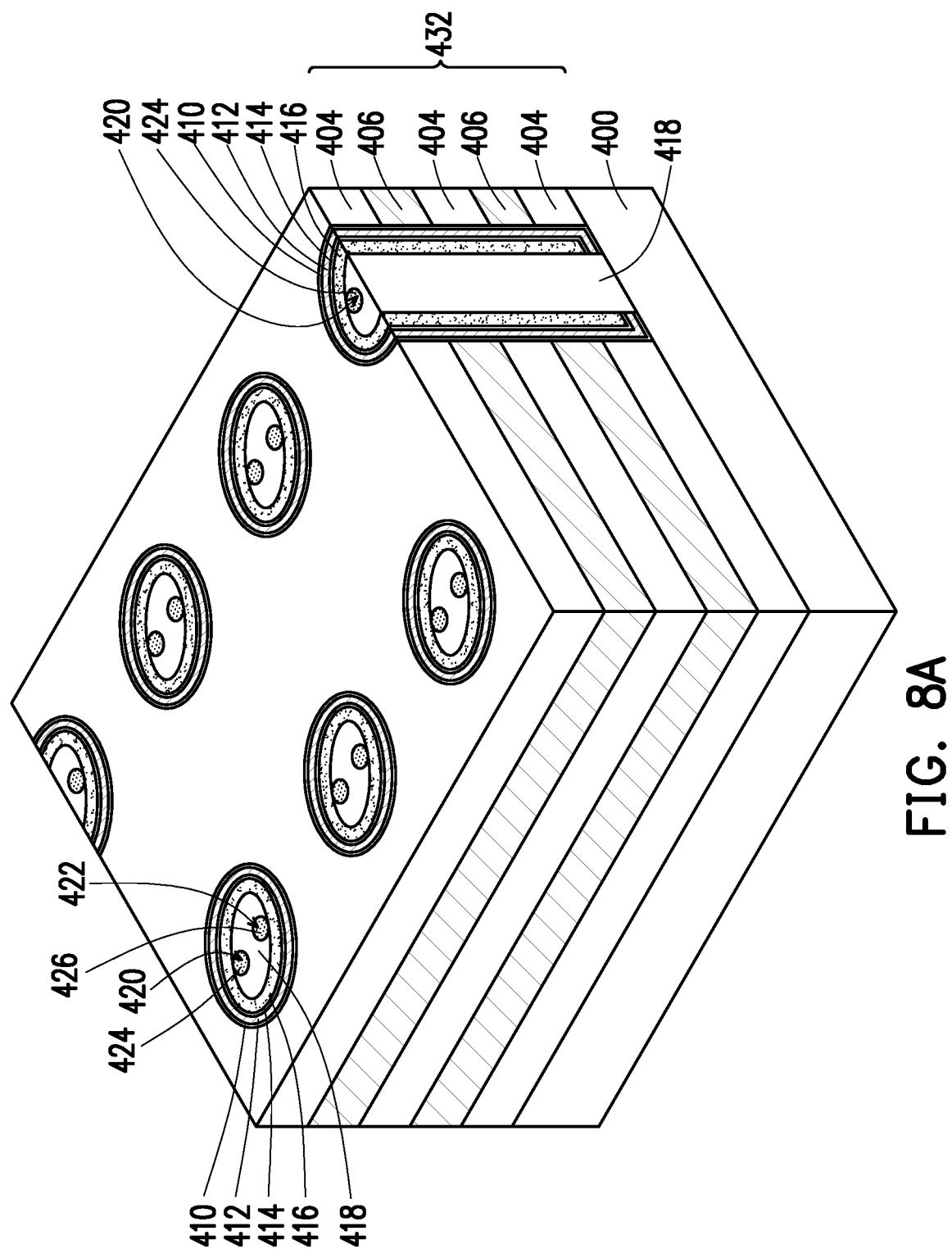
FIG. 8A is a perspective view illustrating one stage of the method of manufacturing the memory device in accordance with yet alternative embodiments of the disclosure.

FIG. 7E is a perspective view illustrating one stage of the method of manufacturing the memory device 40 in accordance with alternative embodiments of the disclosure. FIG. 8A is a perspective view illustrating one stage of the method of manufacturing the memory device 40 in accordance with yet alternative embodiments of the disclosure. Referring to FIG. 7E, the opening 420 and the opening 422 are filled with a conductive material to form a conductive pillar 424 and a conductive pillar 426 (e.g., source/drain pillars). The conductive material may include metal (e.g., tungsten, ruthenium, molybdenum, cobalt, aluminum, nickel, copper, silver, gold, alloys thereof, or the like) or doped polysilicon, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillar 424 and the conductive pillar 426 in the opening 420 and the opening 422, respectively. In the resulting structure, top surfaces of the multi-layer stack 402, the dielectric layer 410, the charge storage layer 412, the dielectric layer 414, the channel layer 416, the dielectric pillar 418, the conductive pillar 424, and the conductive pillar 426 may be substantially level (e.g., within process variations).

In some embodiments, the conductive pillar 424 and the conductive pillar 426 are adjacent to the channel layer 416. For example, the conductive pillar 424 and the conductive pillar 426 are enclosed by the channel layer 416, so that the memory device 40 can have a tighter layout, thereby increasing the cell density. The conductive pillar 424 and the conductive pillar 426 may be separated from the channel layer 416 by the dielectric pillar 418. In alternative embodiments, the conductive pillar 424 and the conductive pillar 426 may be in contact with the channel layer 416 (see FIG. 8A).

Figure 7F:
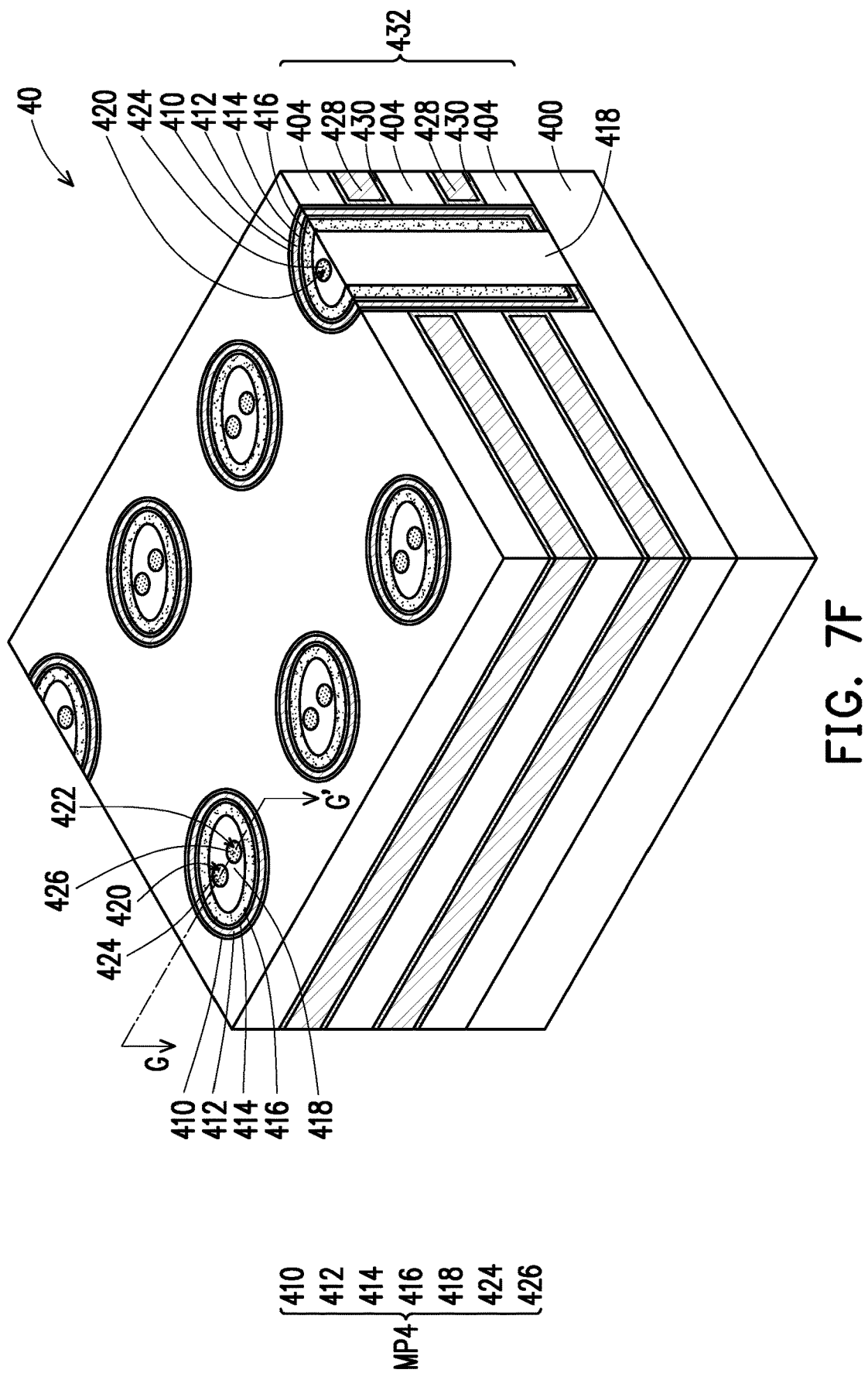
Figure 8B:
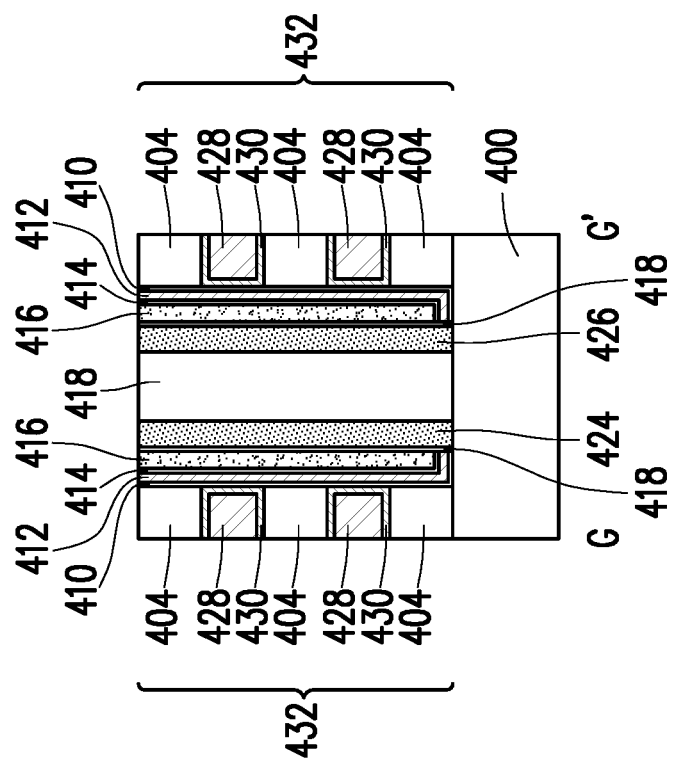
FIG. 8B is a cross-sectional view illustrating the memory device taken along section line G-G' in FIG. 7F.

FIG. 7F is a perspective view illustrating one stage of the method of manufacturing the memory device 40 in accordance with alternative embodiments of the disclosure. FIG. 8B is a cross-sectional view illustrating the memory device 40 taken along section line G-G' in FIG. 7F. Referring to FIG. 7F and FIG. 8B, the sacrificial layers 406 are replaced with conductive layers 428. In some embodiments, each sacrificial layer 406 may be replaced with the conductive layer 428 and the insulating layer 430. For example, the sacrificial layers 406 are removed by an acceptable process, such as a wet etching process, a dry etching process or both. In some embodiments, the multi-layer stack 402 may be further patterned before or after removing the sacrificial layers 406. Thereafter, an insulating material and a conductive material are sequentially formed in the spaces between the adjacent dielectric layers 404 to form the insulating layers 430 and the conductive layers 428. The insulating material may include a high-k material such as hafnium oxide (HfO), aluminum oxide (AlO), zirconium oxide (ZrO), a combination thereof, or the like. The conductive material may include metal (e.g., tungsten, ruthenium, molybdenum, cobalt, aluminum, nickel, copper, silver, gold, alloys thereof, or the like) or doped polysilicon. The insulating material and the conductive material may each be formed by an acceptable deposition process such as CVD, PVD, ALD, PECVD, or the like. Thereafter, an acceptable etch-back process may be performed to remove the excess insulating material and the excess conductive material outside the spaces between the adjacent dielectric layers 404, thereby forming the insulating layer 430 and the conductive layer 428. The acceptable etch-back process includes a dry etch (e.g., RIE, NBE, the like), a wet etch, the like, or a combination thereof. In some embodiments, the etch-back process may be an anisotropic etch process.

Thereby, a multi-layer stack 432 may be formed on the substrate 400. In some embodiments, the multi-layer stack 432 is disposed on the substrate 400 and includes the conductive layers 428 and the dielectric layers 404 stacked alternately. The conductive layers 428 may be located aside the channel layer 416. In some embodiments, the multi-layer stack 432 may further include the insulating layers 430 disposed between the conductive layers 428 and the dielectric layer 410 and between the conductive layers 428 and the dielectric layers 404. The insulating layers 430 may be located aside the channel layer 416. In some embodiments, the dielectric layer 410, the charge storage layer 412, the dielectric layer 414, the channel layer 416, and the dielectric pillar 418 may penetrate through the conductive layers 428 and the dielectric layers 404. In some embodiments, the charge storage layer 412 is disposed between the conductive layers 428 and the channel layer 416.

In some embodiments, the conductive pillar 424 and the conductive pillar 426 are electrically isolated from the conductive layers 428. For example, the insulating layers 430 and the dielectric pillar 418 are disposed between the conductive pillar 424 and the conductive layers 428 and between the conductive pillar 426 and the conductive layers 428, thereby electrically isolating the conductive pillar 424 and the conductive pillar 426 from the conductive layers 428.

In some embodiments, the memory device 40 may include memory pillars MP4. Each memory pillar MP4 may include the dielectric layer 410, the charge storage layer 412, the dielectric layer 414, the channel layer 416, the dielectric pillar 418, the conductive pillar 424, and the conductive pillar 426. The top view shape of the memory pillar MP4 may be a circle (FIG. 7F), a circle with protrusions, an ellipse, an ellipse with protrusions, a polygon (a square or a rectangle, etc.), a polygon with protrusions, combinations thereof, or the like.

In the memory device 40, the conductive pillar 424 and the conductive pillar 426 are enclosed by the channel layer 416, so that the memory pillars MP4 can be arranged more closely. Therefore, the memory device 40 can have a tighter layout and higher cell density.

Figure 9A:
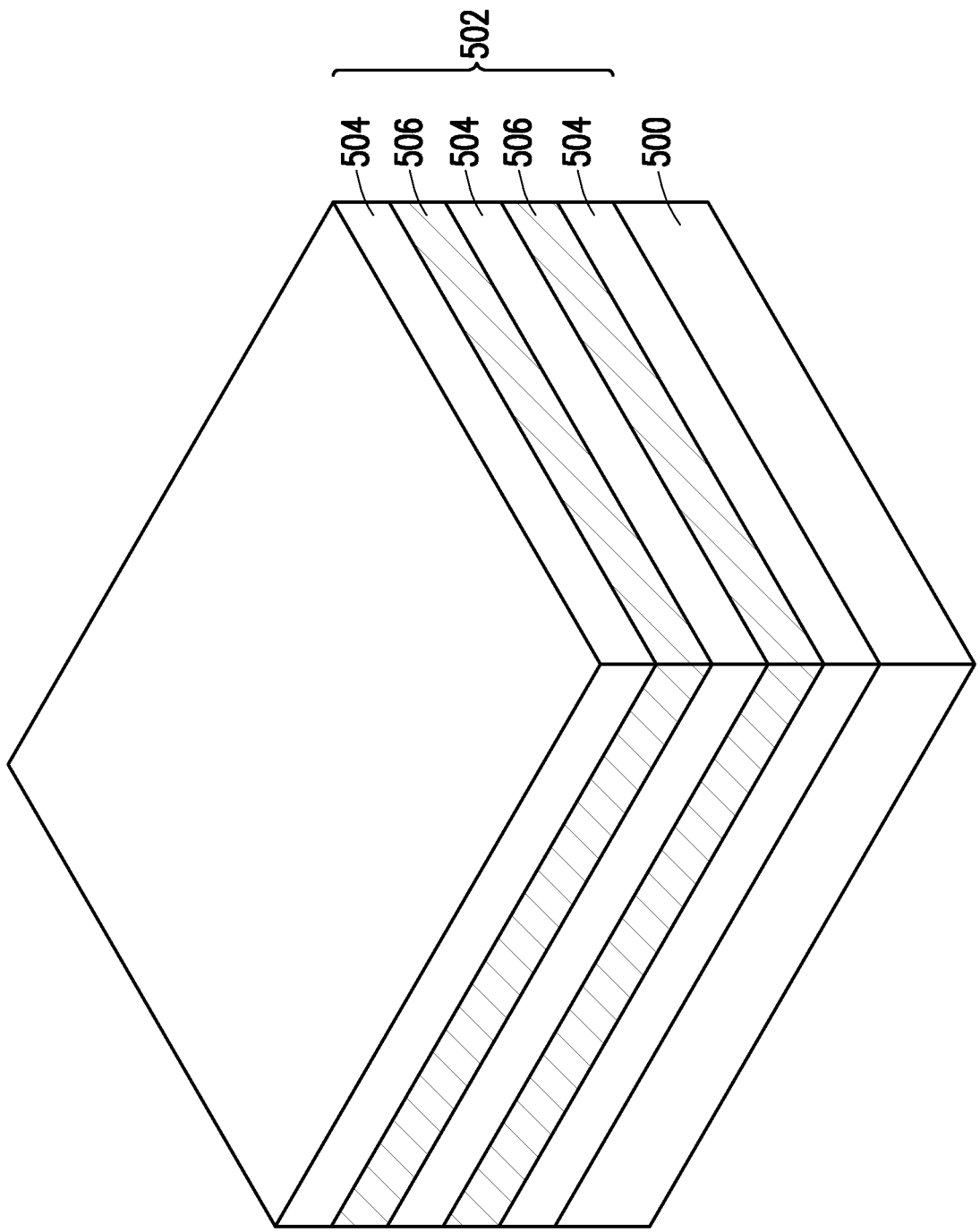
FIG. 9A to FIG. 9F are perspective views illustrating various stages of a method of manufacturing a memory device in accordance with alternative embodiments of the disclosure.

FIG. 9A is a perspective view illustrating one stage of a method of manufacturing the memory device 50 in accordance with alternative embodiments of the disclosure. Referring to FIG. 9A, a substrate 500 is provided. The detailed description of the substrate 500 may refer to the description of the substrate 500 of FIG. 1A, and the description thereof is omitted herein.

A multi-layer stack 502 is formed over the substrate 500. Although the multi-layer stack 502 is illustrated as contacting the substrate 500, any number of intermediate layers may be disposed between the substrate 500 and the multi-layer stack 502. For example, one or more interconnect layers including conductive features in insulting layers (e.g., low-k dielectric layers) may be disposed between the substrate 500 and the multi-layer stack 502. In some embodiments, the conductive features may be patterned to provide power, ground, and/or signal lines for the active devices on the substrate 500 and/or the memory device 50 (see FIG. 9F).

The multi-layer stack 502 includes alternating layers of dielectric layers 504 and sacrificial layers 506. The sacrificial layers 506 may be patterned and replaced in subsequent steps to define conductive layers 530 (e.g., the word lines). The dielectric layers 504 may include insulating materials, such as silicon oxide, silicon nitride, silicon oxynitride, combinations thereof, or the like. The sacrificial layers 506 may include dielectric materials, such as silicon oxide, silicon nitride, silicon oxynitride, combinations thereof, or the like. The dielectric layers 504 and the sacrificial layers 506 include different materials with different etching selectivities. In some embodiments, the dielectric layers 504 include silicon oxide, and the sacrificial layers 506 include silicon nitride. Each of the dielectric layers 504 and the sacrificial layers 506 may be formed using, for example, CVD, ALD, PVD, PECVD, or the like.

Although FIG. 9A illustrates a particular number of the dielectric layers 504 and the sacrificial layers 506, other embodiments may include different numbers of the dielectric layers 504 and the sacrificial layers 506. Besides, although the multi-layer stack 502 is illustrated as having dielectric layers as topmost and bottommost layers, the disclosure is not limited thereto. In some embodiments, at least one of the topmost and bottommost layers of the multi-layer stack 502 is a sacrificial layer.

Figure 9B:
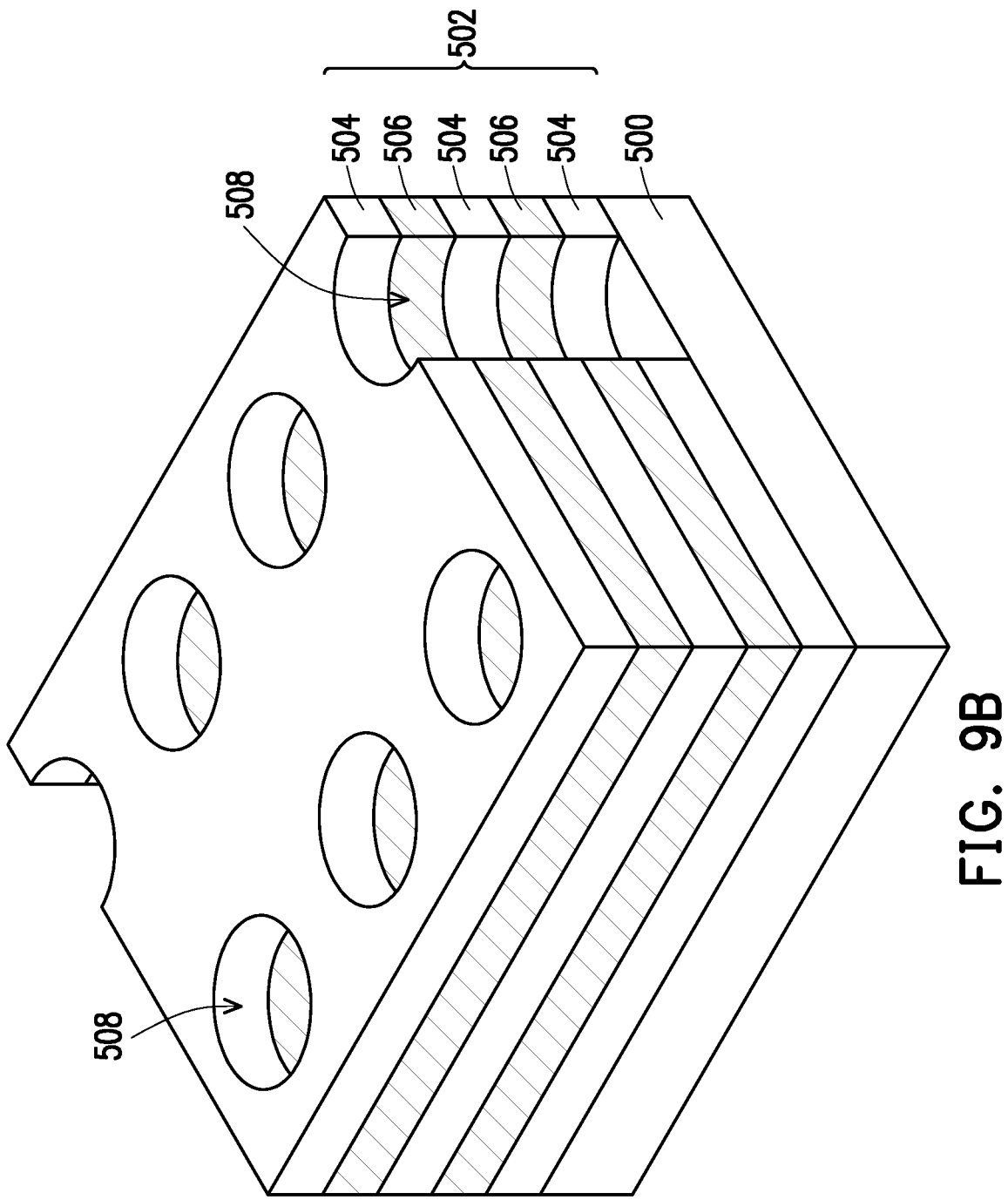

FIG. 9B is a perspective view illustrating one stage of the method of manufacturing the memory device 50 in accordance with alternative embodiments of the disclosure. Referring to FIG. 9B, a patterning process may be performed on the multi-layer stack 502 to formed an opening 508. In some embodiments, the opening 508 may penetrate through the multi-layer stack 502 to expose a portion of the substrate 500. The patterning process may remove a portion of the multi-layer stack 502. The patterning process may be performed through a combination of lithography and etching processes. The etching process may be a dry etch (e.g., RIE, NBE, the like).

Figure 9C:
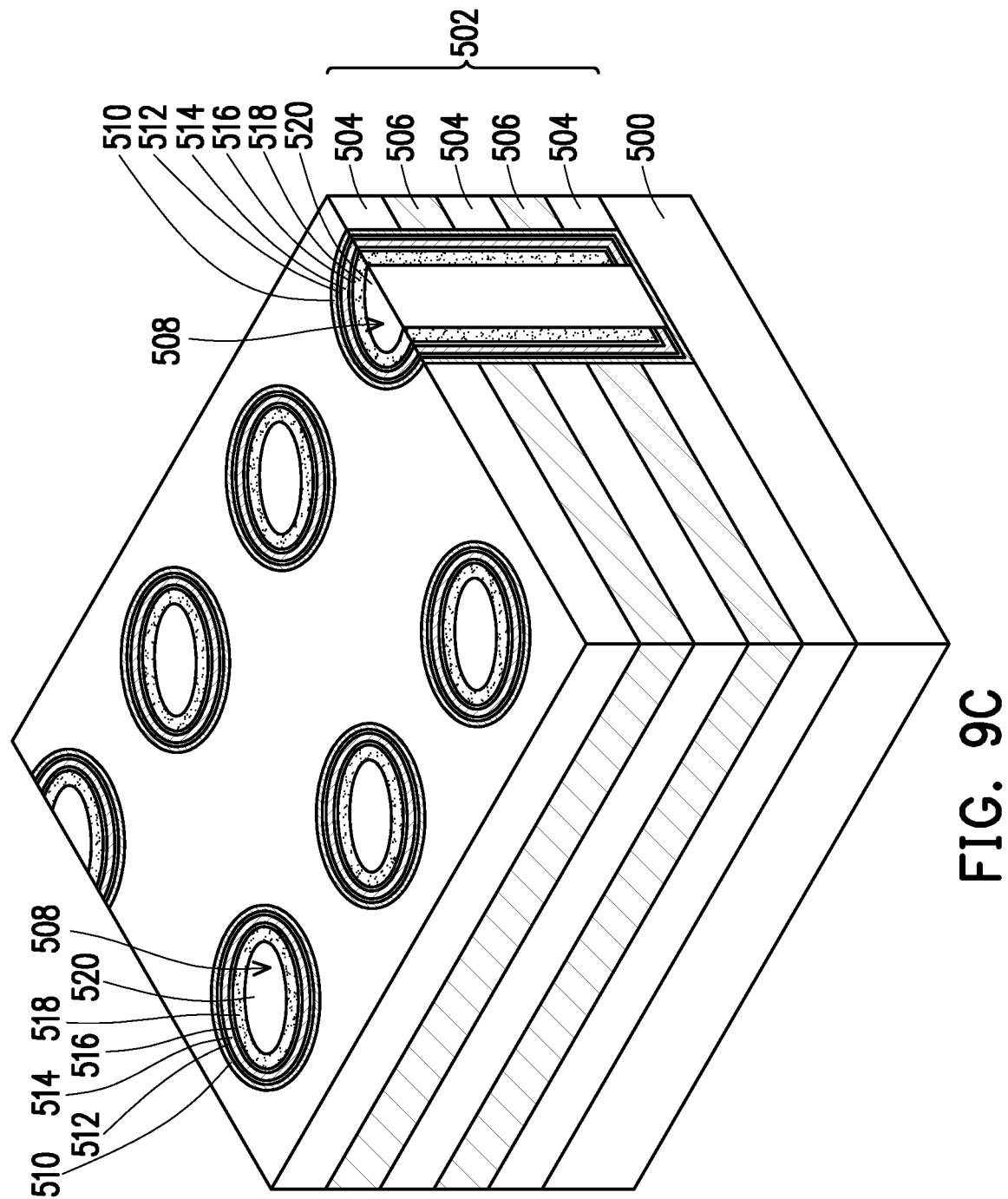

FIG. 9C is a perspective view illustrating one stage of the method of manufacturing the memory device 50 in accordance with alternative embodiments of the disclosure. Referring to FIG. 9C, a material of an insulating layer 510, a material of a dielectric layer 512, a material of a charge storage layer 514, a material of a dielectric layer 516, and a material of the channel layer 518 may be sequentially formed in the opening 508. The material of the insulating layer 510 may include a high-k material such as hafnium oxide (HfO), aluminum oxide (AlO), zirconium oxide (ZrO), a combination thereof, or the like. The material of the dielectric layer 512 may include HTO, SiO, AlO, a combination thereof, or the like. The material of the charge storage layer 514 may include a charge trapping material, such as SiN, SiON, AlN, HfO, ZnO, or a combination thereof. The material of the dielectric layer 516 may include AlO, SiO, a combination thereof, or the like. The material of the channel layer 518 may include a semiconductor material, such as polysilicon, germanium (Ge), metal oxide (e.g., zinc oxide (ZnO), indium gallium zinc oxide (IGZO), etc.). The material of the insulating layer 510, the material of the dielectric layer 512, the material of the charge storage layer 514, the material of the dielectric layer 516, and the material of the channel layer 518 may each be formed by an acceptable deposition process such as CVD, PVD, ALD, PECVD, or the like. The material of the channel layer 518 may be a doped semiconductor material or an undoped semiconductor material.

Thereafter, an acceptable etch-back process may be performed on the material of the channel layer 518, the material of the dielectric layer 516, the material of the charge storage layer 514, and the material of the dielectric layer 512 by using the material of an insulating layer 510 as an etch stop layer, thereby forming the channel layer 518, the dielectric layer 516, the charge storage layer 514, and the dielectric layer 512 and exposing a portion of the material of an insulating layer 510. The dielectric layer 512, the charge storage layer 514, the dielectric layer 516, the channel layer 518, and the dielectric pillar 520 may penetrate through the dielectric layers 504 and the sacrificial layers 506. The charge storage layer 514 is disposed between the multi-layer stack 502 and the channel layer 518. The dielectric layer 512 is disposed between the multi-layer stack 502 and the charge storage layer 514. For example, the dielectric layer 512 is disposed between the insulating layer 510 and the charge storage layer 514. The dielectric layer 512 may be used as a blocking layer. The dielectric layer 516 is disposed between the charge storage layer 514 and the channel layer 518. The dielectric layer 516 may be used as a tunneling layer. In some embodiments, the dielectric layer 512, the charge storage layer 514, the dielectric layer 516, and the channel layer 518 may each have an annular pillar structure.

After forming the dielectric layer 512, the charge storage layer 514, the dielectric layer 516, and the channel layer 518, a material of a dielectric pillar 520 is formed on the material of the insulating layer 510, and the opening 508 is filled with the material of the dielectric pillar 520. The material of a dielectric pillar 520 may include a dielectric material such as oxide (e.g. silicon oxide). The material of the dielectric pillar 520 may be formed by an acceptable deposition process such as CVD, PVD, ALD, PECVD, or the like. Thereafter, a removal process is performed to remove the material of the dielectric pillar 520 and the material of the insulating layer 510 outside the opening 508, thereby forming the dielectric pillar 520 and the insulating layer 510. In some embodiments, the removal process may be a planarization process, such as a chemical mechanical polish (CMP), an etch-back process, a combination thereof, or the like. In the resulting structure, top surfaces of the multi-layer stack 502, the insulating layer 510, the dielectric layer 512, the charge storage layer 514, the dielectric layer 516, the channel layer 518, and the dielectric pillar 520 may be substantially level (e.g., within process variations).

In some embodiments, the insulating layer 510 may be disposed between the dielectric layer 512 and the substrate 500, between the charge storage layer 514 and the substrate 500, between the dielectric layer 516 and the substrate 500, between the channel layer 518 and the substrate 500, and between the dielectric pillar 520 and the substrate 500. The dielectric pillar 520 may be enclosed by the channel layer 518 and on the insulating layer 510. The insulating layer 510 may penetrate through the dielectric layers 504 and the sacrificial layers 506.

Figure 9D:
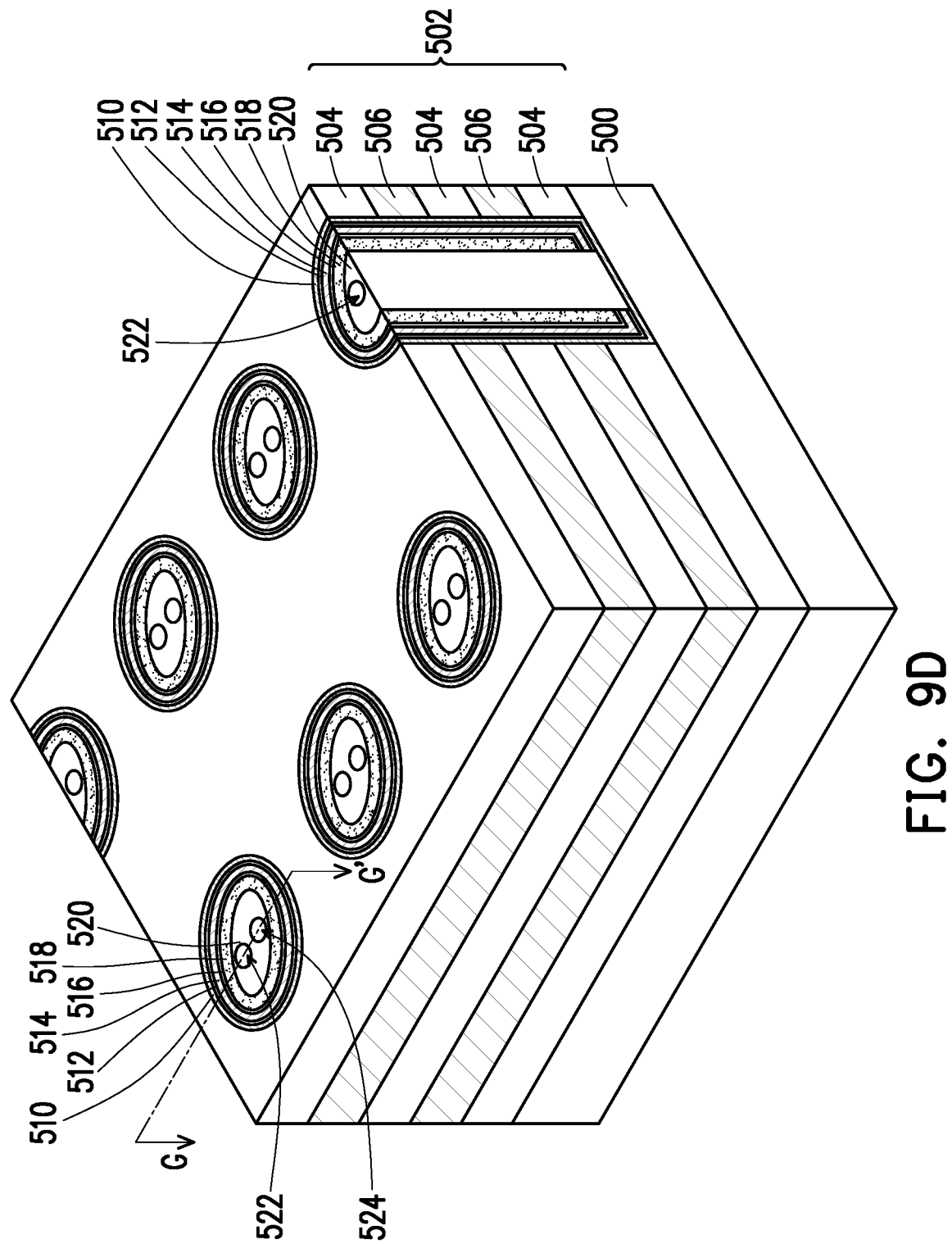

FIG. 9D is a perspective view illustrating one stage of the method of manufacturing the memory device 50 in accordance with alternative embodiments of the disclosure. Referring to FIG. 9D, a patterning process is performed on the dielectric pillar 520 and the insulating layer 510 to form an opening 522 and an opening 524. In some embodiments, the opening 522 and the opening 524 may penetrate through the dielectric pillar 520 and the insulating layer 510 to expose a portion of the substrate 500. In some embodiments, the opening 522 and the opening 524 are not in contact with the channel layer 518. In alternative embodiments, the opening 522 and the opening 524 may be in contact with the channel layer 518. The patterning process may remove a portion of the dielectric pillar 520 by using the insulating layer 510 as to a etch stop layer, and then the patterning process may further remove a portion of the insulating layer 510, thereby forming the opening 522 and the opening 524. The patterning process may be performed through a combination of lithography and etching processes. The etching process may be a dry etch (e.g., RIE, NBE, the like).

Figure 9E:
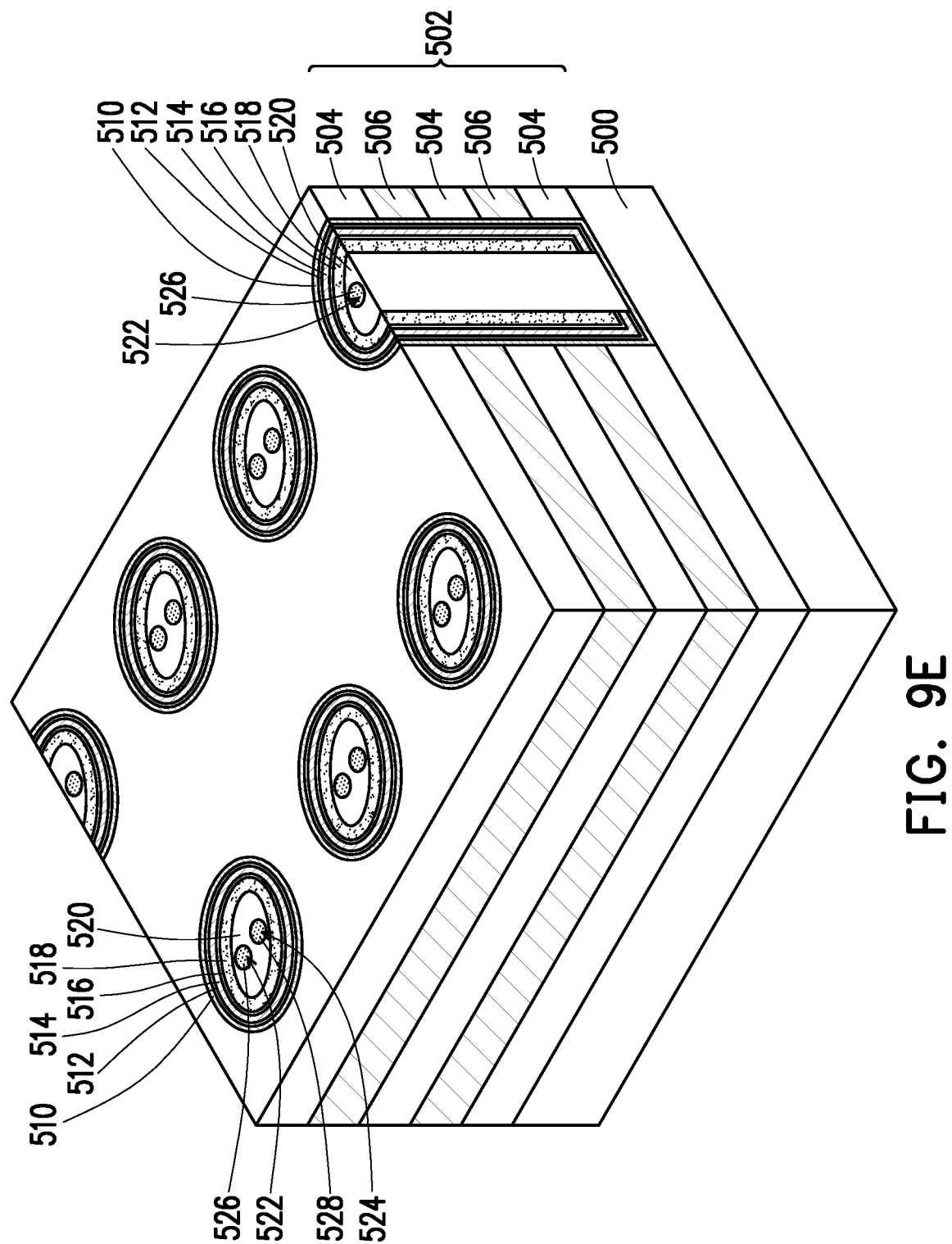
Figure 10A:
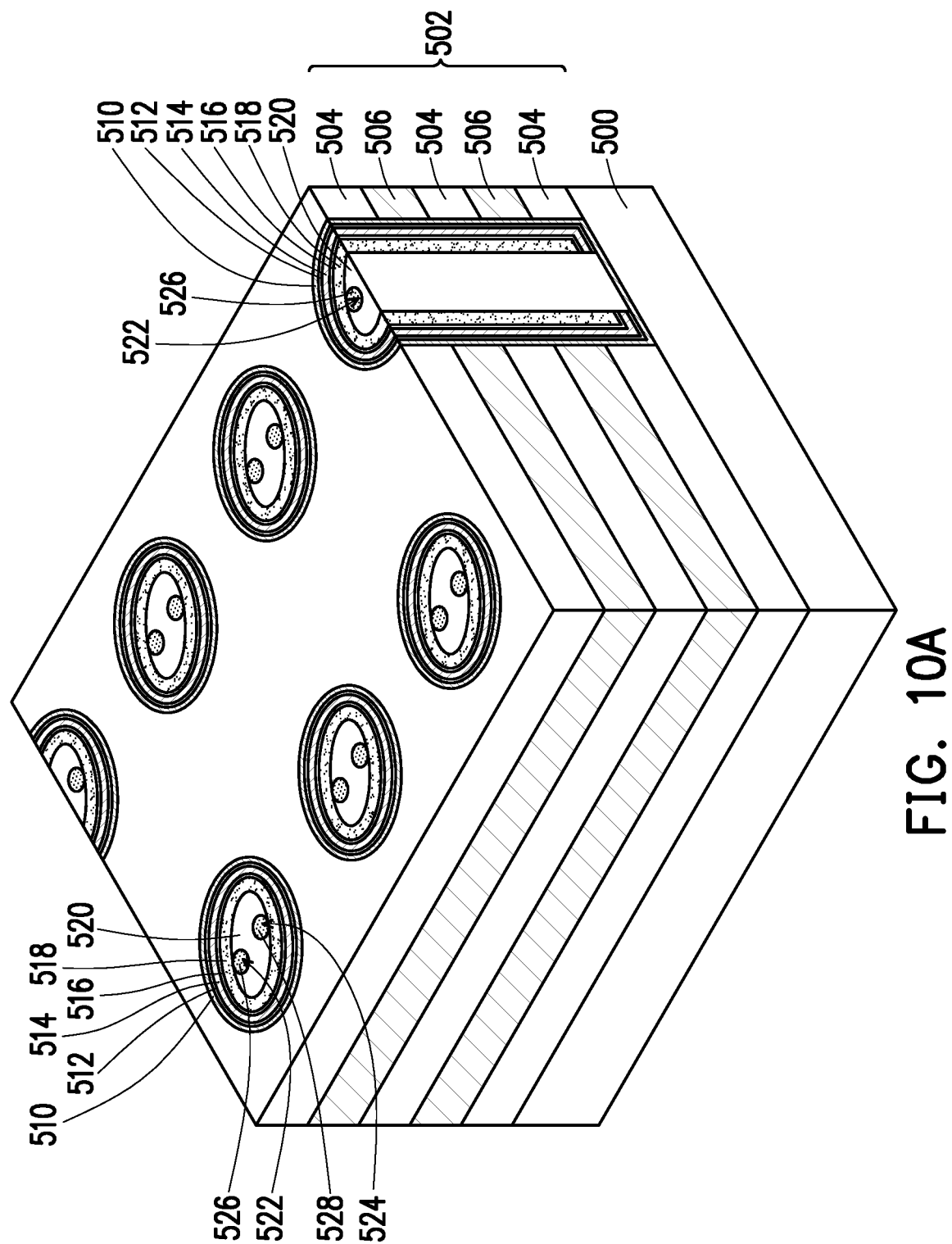
FIG. 10A is a perspective view illustrating one stage of the method of manufacturing the memory device in accordance with yet alternative embodiments of the disclosure.

FIG. 9E is a perspective view illustrating one stage of the method of manufacturing the memory device 50 in accordance with alternative embodiments of the disclosure. FIG. 10A is a perspective view illustrating one stage of the method of manufacturing the memory device 50 in accordance with yet alternative embodiments of the disclosure. Referring to FIG. 9E, the opening 522 and the opening 524 are filled with a conductive material to form a conductive pillar 526 and a conductive pillar 528 (e.g., source/drain pillars). The conductive material may include metal (e.g., tungsten, ruthenium, molybdenum, cobalt, aluminum, nickel, copper, silver, gold, alloys thereof, or the like) or doped polysilicon, which may be formed using, for example, CVD, ALD, PVD, PECVD, or the like. After the conductive material is deposited, a planarization (e.g., a CMP, etch back, or the like) may be performed to remove excess portions of the conductive material, thereby forming the conductive pillar 526 and the conductive pillar 528 in the opening 522 and the opening 524, respectively. The conductive pillar 526 and the conductive pillar 528 may penetrate through the dielectric pillar 520 and the insulating layer 510. In the resulting structure, top surfaces of the multi-layer stack 502, the insulating layer 510, the dielectric layer 512, the charge storage layer 514, the dielectric layer 516, the channel layer 518, the dielectric pillar 520, the conductive pillar 526, and the conductive pillar 528 may be substantially level (e.g., within process variations).

In some embodiments, the conductive pillar 526 and the conductive pillar 528 are adjacent to the channel layer 518. For example, the conductive pillar 526 and the conductive pillar 528 are enclosed by the channel layer 518, so that the memory device 50 can have a tighter layout, thereby increasing the cell density. The conductive pillar 526 and the conductive pillar 528 may be separated from the channel layer 518 by the dielectric pillar 520. In alternative embodiments, the conductive pillar 526 and the conductive pillar 528 may be in contact with the channel layer 518 (see FIG. 10A).

Figure 9F:
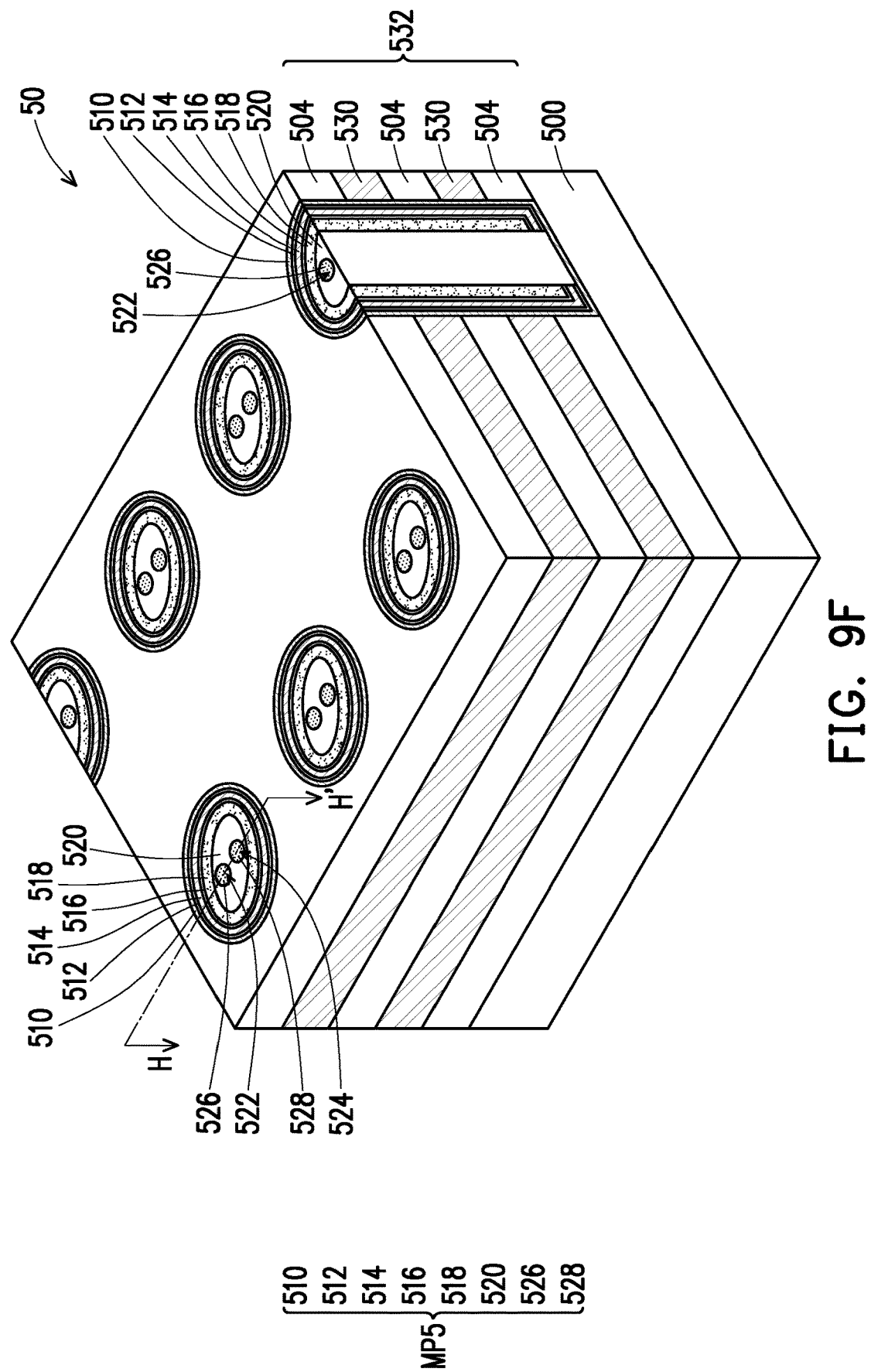
Figure 10B:
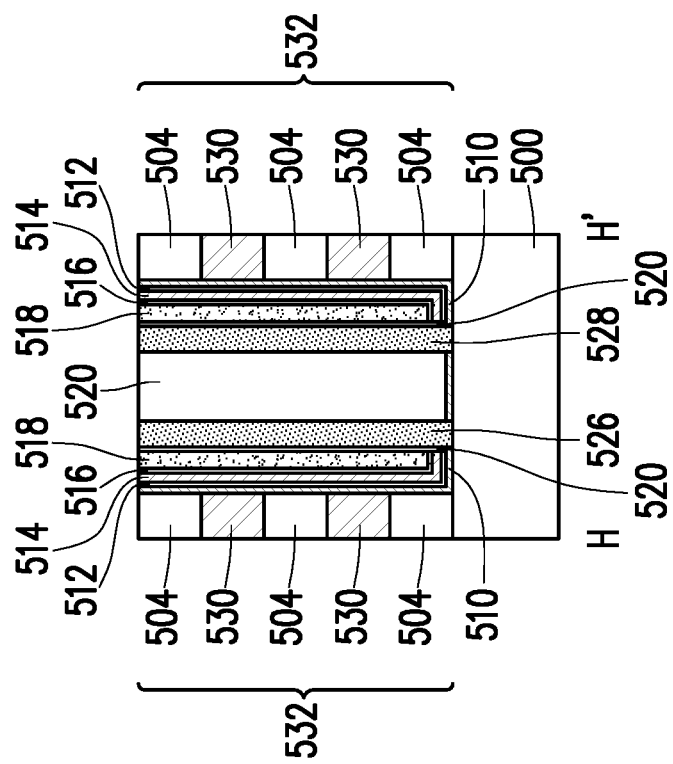
FIG. 10B is a cross-sectional view illustrating the memory device 50 taken along section line H-H' in FIG. 9F.

FIG. 9F is a perspective view illustrating one stage of the method of manufacturing the memory device 50 in accordance with alternative embodiments of the disclosure. FIG. 10B is a cross-sectional view illustrating the memory device 50 taken along section line H-H' in FIG. 9F. Referring to FIG. 9F and FIG. 10B, the sacrificial layers 506 are replaced with conductive layers 530. For example, the sacrificial layers 506 are removed by an acceptable process, such as a wet etching process, a dry etching process or both. In some embodiments, the multi-layer stack 502 may be further patterned before or after removing the sacrificial layers 506. Thereafter, a conductive material is formed in the spaces between the adjacent dielectric layers 504 to form the conductive layers 530. The conductive material may include metal (e.g., tungsten, ruthenium, molybdenum, cobalt, aluminum, nickel, copper, silver, gold, alloys thereof, or the like) or doped polysilicon. The conductive material may be formed by an acceptable deposition process such as CVD, PVD, ALD, PECVD, or the like. Thereafter, an acceptable etch-back process may be performed to remove the excess conductive material outside the spaces between the adjacent dielectric layers 504, thereby forming the conductive layer 530. The acceptable etch-back process includes a dry etch (e.g., RIE, NBE, the like), a wet etch, the like, or a combination thereof. In some embodiments, the etch-back process may be an anisotropic etch process.

Thereby, a multi-layer stack 532 may be formed on the substrate 500. In some embodiments, the multi-layer stack 532 is disposed on the substrate 500 and includes the conductive layers 530 and the dielectric layers 504 stacked alternately. The conductive layers 530 may be located aside the channel layer 518. In some embodiments, the insulating layer 510, the dielectric layer 512, the charge storage layer 514, the dielectric layer 516, the channel layer 518, and the dielectric pillar 520 may penetrate through the conductive layers 530 and the dielectric layers 504. In some embodiments, the charge storage layer 514 is disposed between the conductive layers 530 and the channel layer 518. In some embodiments, the insulating layer 510 is disposed between the charge storage layer 514 and the multi-layer stack 532. For, example, the insulating layer 510 is disposed between the dielectric layer 512 and the multi-layer stack 532.

In some embodiments, the conductive pillar 526 and the conductive pillar 528 are electrically isolated from the conductive layers 530. For example, the insulating layers 510 and the dielectric pillar 520 are disposed between the conductive pillar 526 and the conductive layers 530 and between the conductive pillar 528 and the conductive layers 530, thereby electrically isolating the conductive pillar 526 and the conductive pillar 528 from the conductive layers 530.

In some embodiments, the memory device 50 may include memory pillars MP4. Each memory pillar MP5 may include the insulating layer 510, the dielectric layer 512, the charge storage layer 514, the dielectric layer 516, the channel layer 518, the dielectric pillar 520, the conductive pillar 526, and the conductive pillar 528. The top view shape of the memory pillar MP5 may be a circle (FIG. 9F), a circle with protrusions, an ellipse, an ellipse with protrusions, a polygon (a square or a rectangle, etc.), a polygon with protrusions, combinations thereof, or the like.

In the memory device 50, the conductive pillar 526 and the conductive pillar 528 are enclosed by the channel layer 518, so that the memory pillars MP5 can be arranged more closely. Therefore, the memory device 50 can have a tighter layout and higher cell density. In some embodiments, since the insulating layer 510 can be used as the etch stop layer in the etch process for forming the conductive pillar 526 and the conductive pillar 528, the etch selectivity can be increased, and the etching process can be better controlled.

Hereinafter, the configuration of the interconnect structures in the memory device 20 of FIG. 3F is described with reference to FIG. 11 and FIG. 12.

Figure 11:
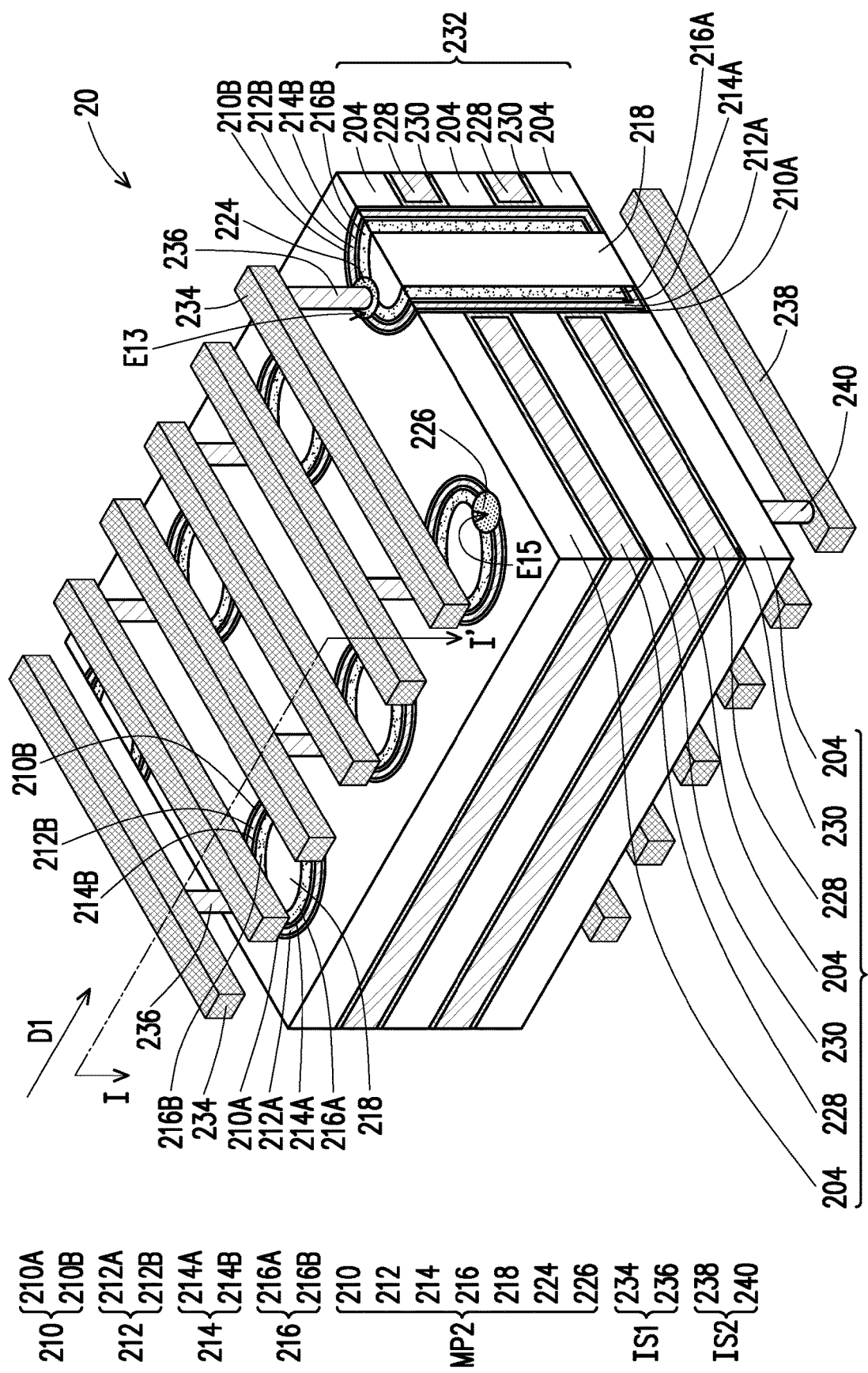
FIG. 11 is a perspective view illustrating the configuration of the interconnect structures in the memory device of FIG. 3F in accordance with some embodiments of the disclosure.

FIG. 11 is a perspective view illustrating the configuration of the interconnect structures in the memory device 20 of FIG. 3F in accordance with some embodiments of the disclosure. FIG. 12 is a cross-sectional view illustrating the memory device 20 taken along section line I-I in FIG. 11. FIG. 13 is a perspective view illustrating the configuration of the interconnect structures in the memory device 20 of FIG. 3F in accordance with alternative embodiments of the disclosure. In FIG. 11 to FIG. 13, the substrate 200 of FIG. 3F is omitted for the purposes of simplicity and clarity. Referring to FIG. 11 to FIG. 13, the conductive pillar 224 and the conductive pillar 226 are adjacent to the channel layer 216. The conductive pillar 224 includes an end E13 and an end E14. The conductive pillar 226 includes an end E15 and an end E16. The end E13 is adjacent to the end E15 and away from the end E16. The end 14 is adjacent to the end E16 and away from the end E15. Furthermore, the arrangement of the conductive pillar 224 and the conductive pillar 226 may be adjusted according to product design (see FIG. 11 and FIG. 13). In FIG. 11, the conductive pillars 224 and the conductive pillars 226 may be arranged along the direction D1, and the channel layers 216 may be arranged along the direction D1. That is, the conductive pillars 224, the conductive pillars 226, and the channel layers 216 may be arranged along the same direction D1. In FIG. 13, the conductive pillars 224 and the conductive pillars 226 may be arranged along the direction D2, and the channel layers 216 may be arranged along the direction D3. The direction D2 may intersect the direction D3. Moreover, the arrangement of the conductive pillars may also be applied to applied to the memory device 10 of FIG. 1H, the memory device 30 of FIG. 5H, the memory device 40 of FIG. 7F, and the memory device 50 of FIG. 9F.

The memory device 20 may further include an interconnect structures IS1 and an interconnect structure IS2. The interconnect structure IS1 and the interconnect structure IS2 may be respectively disposed in the dielectric layer (omitted) such as an inter-layer dielectric (ILD). The interconnect structure IS1 is connected to the end E13 of the conductive pillar 224. The interconnect structure IS2 is connected to the end E16 of the conductive pillar 226. The end E13 of the conductive pillar 224 connected to the interconnect structure IS1 and the end E16 of the conductive pillar 226 connected to the interconnect structure IS2 are located on opposite sides of the multi-layer stack 232.

Thereby, the interconnect structure IS1 and the interconnect structure IS2 can be located at different sides of the conductive pillar 224 and the conductive pillar 226, so that the memory pillars MP2 can be arranged more closely. Therefore, the memory device 20 can have a tighter layout and higher cell density.

In some embodiments, the interconnect structure IS1 may include a conductive line 234 (e.g., source line/bit line). The conductive line 234 may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The interconnect structure IS1 may further include a contact 236 to provide connection between the conductive line 234 and the conductive pillar 224. The contact 236 may include aluminum, copper, aluminum alloy, copper alloy, aluminum/silicon/ copper alloy, titanium, titanium nitride, tantalum, tantalum nitride, tungsten, polysilicon, metal silicide, or combinations thereof. The conductive line 234 and the contact 236 may be formed by a damascene process, a combination of deposition, lithography, and etch process, or combinations thereof. In some embodiments, the conductive line 234 and the contact 236 may be separately formed. In alternative embodiments, the conductive line 234 and the contact 236 may be integrally formed. In some embodiments, the interconnect structure IS1 may include more conductive features (e.g., the conductive lines, the contacts, the vias, or a combination thereof).

In some embodiments, the interconnect structure IS2 may include a conductive line 238 (e.g., source line/bit line). The conductive line 238 may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The interconnect structure IS2 may further include a contact 240 to provide connection between the conductive line 238 and the conductive pillar 226. The contact 240 may include aluminum, copper, aluminum alloy, copper alloy, aluminum/silicon/ copper alloy, titanium, titanium nitride, tantalum, tantalum nitride, tungsten, polysilicon, metal silicide, or combinations thereof. The conductive line 238 and the contact 240 may be formed by a damascene process, a combination of deposition, lithography, and etch process, or combinations thereof. In some embodiments, the conductive line 238 and the contact 240 may be separately formed. In alternative embodiments, the conductive line 238 and the contact 240 may be integrally formed. In some embodiments, the interconnect structure IS2 may include more conductive features (e.g., the conductive lines, the contacts, the vias, or a combination thereof).

In the memory device 20, the interconnect structure IS1 and the interconnect structure IS2 are located at different sides of the conductive pillar 224 and the conductive pillar 226, so that the memory pillars MP2 can be arranged more closely, and the memory device 20 can have a tighter layout and higher cell density.

Figure 12:
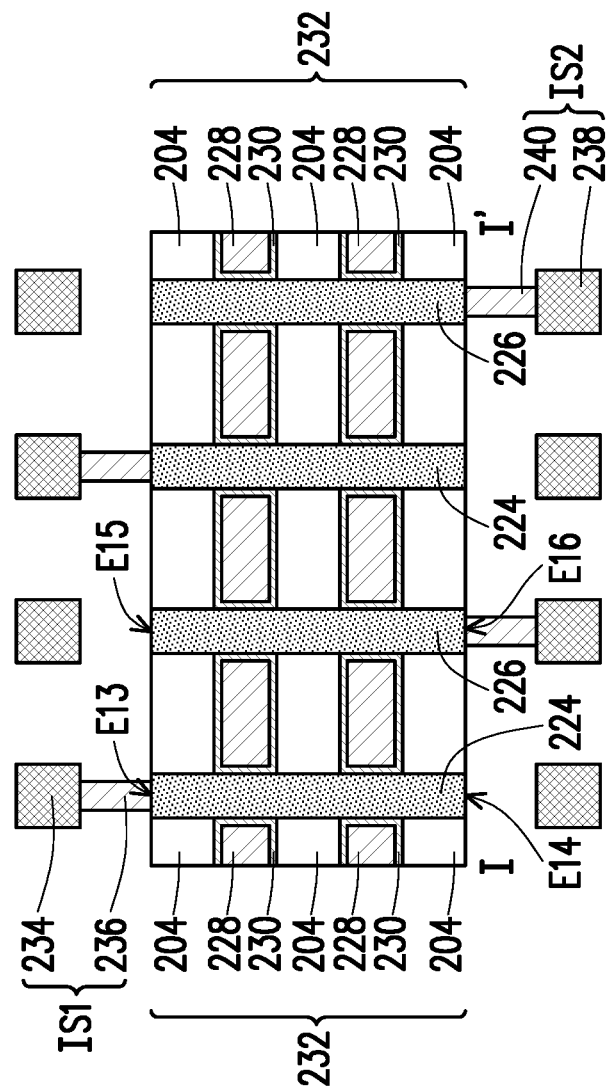
FIG. 12 is a cross-sectional view illustrating the memory device taken along section line I-I in FIG. 11.
Figure 13:
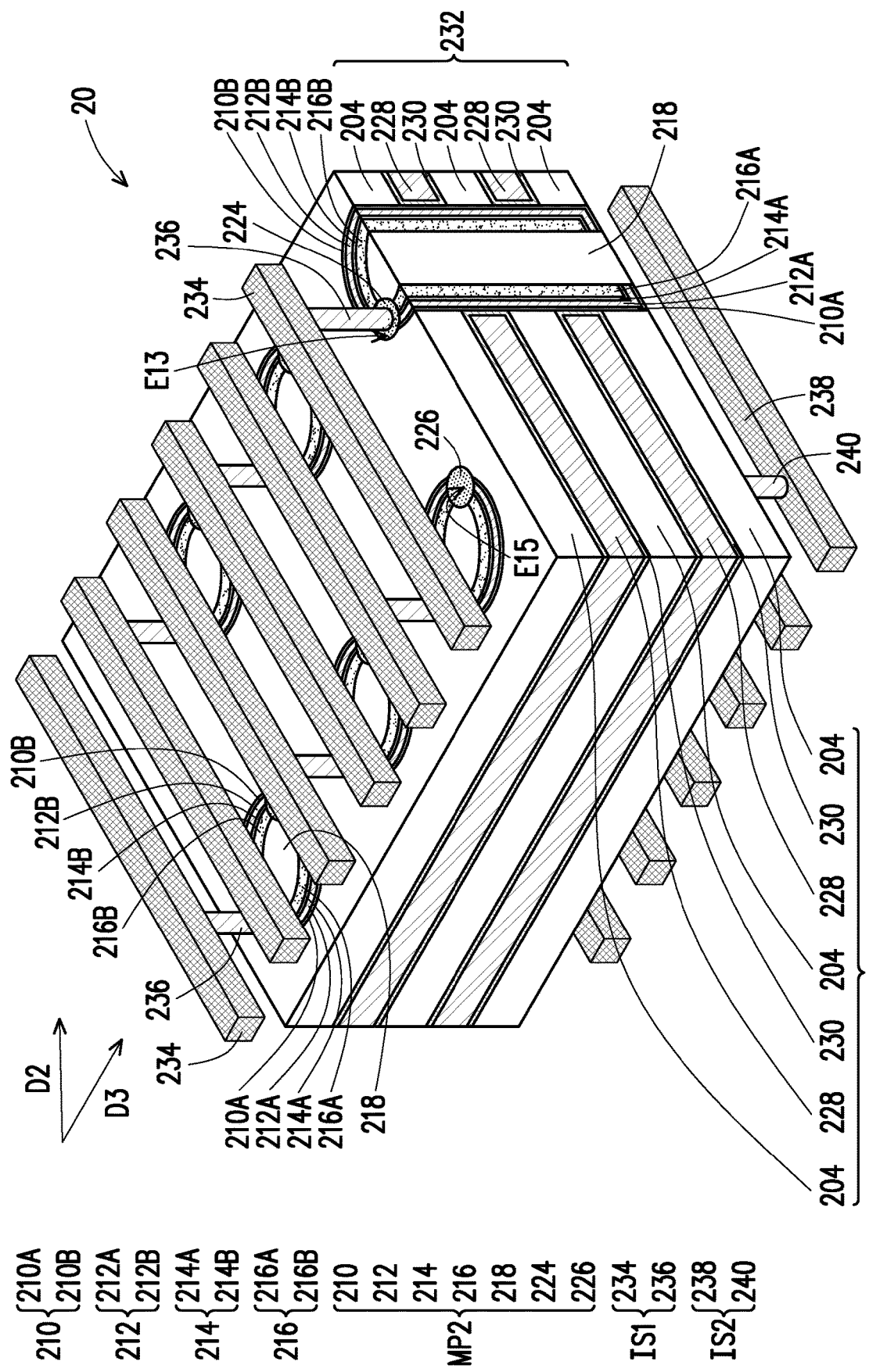
FIG. 13 is a perspective view illustrating the configuration of the interconnect structures in the memory device of FIG. 3F in accordance with alternative embodiments of the disclosure.

The configuration of the interconnect structures of FIG. 11 to FIG. 13 can be applied to any memory device including the source/drain pillars (e.g., the conductive pillar 224 and the conductive pillar 226). For example, the configuration of the interconnect structures of FIG. 11 to FIG. 13 can be applied to the memory device 10 of FIG. 1H, the memory device 30 of FIG. 5H, the memory device 40 of FIG. 7F, and the memory device 50 of FIG. 9F.

Many variations of the above examples are contemplated by the present disclosure. It is understood that different embodiments may have different advantages, and that no particular advantage is necessarily required of all embodiments.

In accordance with some embodiments of the present disclosure, a memory device includes a first multi-layer stack, a channel layer, a charge storage layer, a first conductive pillar, and a second conductive pillar. The first multi-layer stack is disposed on a substrate and includes first conductive layers and first dielectric layers stacked alternately. The channel layer penetrates through the first conductive layers and the first dielectric layers, wherein the channel layer includes a first channel portion and a second channel portion separated from each other. The charge storage layer is disposed between the first conductive layers and the channel layer. The first conductive pillar is disposed between one end of the first channel portion and one end of the second channel portion. The second conductive pillar is disposed between the other end of the first channel portion and the other end of the second channel portion.

In accordance with alternative embodiments of the present disclosure, a memory device includes a multi-layer stack, a channel layer, a charge storage layer, a first conductive pillar, and a second conductive pillar. The multi-layer stack is disposed on a substrate and includes conductive layers and dielectric layers stacked alternately. The channel layer penetrates through the conductive layers and the dielectric layers. The charge storage layer is disposed between the conductive layers and the channel layer. The first conductive pillar and the second conductive pillar are enclosed by the channel layer.

In accordance with yet alternative embodiments of the present disclosure, a memory device includes a multi-layer stack, a channel layer, a charge storage layer, a first conductive pillar, a second conductive pillar, a first interconnect structure, and a second interconnect structure. The multi-layer stack is disposed on a substrate and includes conductive layers and dielectric layers stacked alternately. The channel layer penetrates through the conductive layers and the dielectric layers. The charge storage layer is disposed between the conductive layers and the channel layer. The first conductive pillar and the second conductive pillar are adjacent to the channel layer. The first interconnect structure is connected to an end of the first conductive pillar. The second interconnect structure is connected to an end of the second conductive pillar. The end of the first conductive pillar connected to the first interconnect structure and the end of the second conductive pillar connected to the second interconnect structure are located on opposite sides of the multi-layer stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a first multi-layer stack disposed on a substrate and comprising first conductive layers and first dielectric layers stacked alternately;
   a channel layer penetrating through the first conductive layers and the first dielectric layers, wherein the channel layer comprises a first channel portion and a second channel portion separated from each other, the first channel portion comprises a first end and a second end opposite to each other, and the second channel portion comprises a third end and a fourth end opposite to each other;
   a charge storage layer disposed between the first conductive layers and the channel layer;
   a first conductive pillar physically connected to the first end of the first channel portion and the third end of the second channel portion; and
   a second conductive pillar physically connected to the second end of the first channel portion and the fourth end of the second channel portion.

2. The memory device of claim 1, wherein the first conductive layers are located aside the first channel portion and the second channel portion.

3. The memory device of claim 1, wherein the first conductive pillar and the second conductive pillar are electrically isolated from the first conductive layers.

4. The memory device of claim 1, further comprising:
   a second multi-layer stack disposed on the substrate and comprising second conductive layers and second dielectric layers stacked alternately, wherein
   the channel layer penetrates through the second conductive layers and the second dielectric layers.

5. The memory device of claim 4, wherein the first conductive layers are located aside the first channel portion, and the second conductive layers are located aside the second channel portion.

6. The memory device of claim 4, further comprising:
   a third dielectric layer disposed between the first multi-layer stack and the second multi-layer stack.

7. The memory device of claim 4, wherein the first conductive pillar and the second conductive pillar are electrically isolated from the first conductive layers and the second conductive layers.

8. The memory device of claim 1, wherein the charge storage layer is divided into two portions by the first conductive pillar and the second conductive pillar.

9. The memory device of claim 1, wherein the charge storage layer is not divided into two portions by the first conductive pillar and the second conductive pillar.

10. The memory device of claim 1, further comprising:
    a dielectric pillar enclosed by the channel layer.

11. A memory device, comprising:
    a multi-layer stack disposed on a substrate and comprising conductive layers and dielectric layers stacked alternately, the conductive layers being elongated in a first direction;
    a channel layer penetrating through the multi-layer stack, the channel layer being elongated in a second direction substantially perpendicular to the first direction;
    a charge storage layer disposed between the conductive layers and the channel layer, the charge storage layer being elongated in the second direction;
    a first conductive pillar connecting the channel layer and being elongated in the second direction; and
    a second conductive pillar connecting the channel layer and separated from the first conductive pillar, the second conductive pillar being elongated in the second direction, wherein the first conductive pillar and the second conductive pillar are electrically isolated from the conductive layers.

12. The memory device of claim 11, wherein the channel layer is divided into two portions by the first conductive pillar and the second conductive pillar in a top view.

13. The memory device of claim 11, wherein the first conductive pillar and the second conductive pillar are connected to the charge storage layer.

14. The memory device of claim 13, wherein the charge storage layer is divided into two portions by the first conductive pillar and the second conductive pillar in a top view.

15. The memory device of claim 11, wherein the first conductive pillar is in contact with the channel layer and the charge storage layer in a top view.

16. The memory device of claim 11, further comprising:
    a dielectric pillar enclosed by the channel layer.

17. The memory device of claim 16, wherein the first conductive pillar and the second conductive pillar are in physical contact with the dielectric pillar.

18. A memory device, comprising:
    a multi-layer stack disposed on a substrate and comprising conductive layers and dielectric layers stacked alternately;
    a channel layer, a lengthwise direction of the channel layer being substantially perpendicular to a lengthwise direction of the multi-layer stack;
    a charge storage layer disposed between the multi-layer stack and the channel layer;
    a first conductive pillar and a second conductive pillar connecting the channel layer, wherein in a top view, the first conductive pillar is in physical contact with the channel layer and the charge storage layer; and
    a dielectric pillar enclosed by the channel layer and separating the first conductive pillar from the second conductive pillar, lengthwise directions of the first conductive pillar, the second conductive pillar, and the dielectric pillar being substantially perpendicular to the lengthwise direction of the multi-layer stack.

19. The memory device of claim 18, wherein the first conductive pillar and the second conductive pillar are electrically isolated from the conductive layers.

20. The memory device of claim 18, wherein the first conductive pillar and the second conductive pillar are in physical contact with the charge storage layer.

\* \* \* \* \*